(12) United States Patent
Yamazaki et al.

(10) Patent No.: US 7,776,712 B2
(45) Date of Patent: Aug. 17, 2010

(54) METHOD OF FORMING A SEMICONDUCTOR DEVICE

(75) Inventors: Shunpei Yamazaki, Tokyo (JP); Hisashi Ohtani, Kanagawa (JP); Hideomi Suzawa, Kanagawa (JP); Toru Takayama, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 238 days.

(21) Appl. No.: 11/799,713

(22) Filed: May 2, 2007

(65) Prior Publication Data
US 2007/0281401 A1 Dec. 6, 2007

Related U.S. Application Data

(62) Division of application No. 09/454,146, filed on Dec. 3, 1999, now Pat. No. 7,235,810.

(51) Int. Cl.
H01L 21/425 (2006.01)
(52) U.S. Cl. .................. 438/433; 257/E21.179
(58) Field of Classification Search ............ 438/197, 438/588, 533; 257/E21.179
See application file for complete search history.

(56) References Cited

U.S. PATENT DOCUMENTS

| | | | |
|---|---|---|---|
| 4,394,182 A * | 7/1983 | Maddox, III | 438/163 |
| 4,835,740 A | 5/1989 | Sato | |
| 4,907,048 A | 3/1990 | Huang | |
| 4,963,504 A | 10/1990 | Huang | |
| 5,055,899 A | 10/1991 | Wakai et al. | |
| 5,100,820 A | 3/1992 | Tsubone | |
| 5,108,935 A | 4/1992 | Rodder | |
| 5,182,619 A | 1/1993 | Pfiester | |
| 5,241,203 A | 8/1993 | Hsu et al. | |
| 5,247,190 A | 9/1993 | Friend et al. | |
| 5,323,042 A | 6/1994 | Matsumoto | |

(Continued)

FOREIGN PATENT DOCUMENTS

EP          0 451 968 A1    10/1991

(Continued)

OTHER PUBLICATIONS

Hwang, J-M et al, "Novel Polysilicon/TiN Stacked-Gate Structure for Fully Depleted SOI/CMOS," IEEE, 1992, pp. 345-348.

(Continued)

*Primary Examiner*—W. David Coleman
(74) *Attorney, Agent, or Firm*—Husch Blackwell Sanders LLP

(57) ABSTRACT

There is provided a crystalline TFT in which reliability comparable to or superior to a MOS transistor can be obtained and excellent characteristics can be obtained in both an on state and an off state. A gate electrode of the crystalline TFT is formed of a laminate structure of a first gate electrode made of a semiconductor material and a second gate electrode made of a metal material. An n-channel TFT includes an LDD region, and a region overlapping with the gate electrode and a region not overlapping with the gate electrode are provided, so that a high electric field in the vicinity of a drain is relieved, and at the same time, an increase of an off current is prevented.

24 Claims, 34 Drawing Sheets

U.S. PATENT DOCUMENTS

| | | |
|---|---|---|
| 5,341,012 A | 8/1994 | Misawa et al. |
| 5,393,682 A | 2/1995 | Liu |
| 5,399,502 A | 3/1995 | Friend et al. |
| 5,412,240 A | 5/1995 | Inoue et al. |
| 5,482,871 A | 1/1996 | Pollack |
| 5,532,175 A | 7/1996 | Racanelli et al. |
| 5,534,716 A | 7/1996 | Takemura |
| 5,543,340 A | 8/1996 | Lee |
| 5,543,947 A | 8/1996 | Mase et al. |
| 5,567,966 A | 10/1996 | Hwang |
| 5,581,092 A | 12/1996 | Takemura |
| 5,583,067 A | 12/1996 | Sanchez |
| 5,585,295 A | 12/1996 | Wu |
| 5,594,569 A | 1/1997 | Konuma et al. |
| 5,608,251 A | 3/1997 | Konuma et al. |
| 5,627,084 A | 5/1997 | Yamazaki et al. |
| 5,637,519 A | 6/1997 | Tsai et al. |
| 5,643,826 A | 7/1997 | Ohtani et al. |
| 5,686,328 A | 11/1997 | Zhang et al. |
| 5,717,224 A | 2/1998 | Zhang |
| 5,739,549 A | 4/1998 | Takemura et al. |
| 5,742,363 A | 4/1998 | Bae |
| 5,744,822 A | 4/1998 | Takayama et al. |
| 5,757,444 A | 5/1998 | Takemura |
| 5,767,930 A | 6/1998 | Kobayashi et al. |
| 5,773,330 A | 6/1998 | Park |
| 5,821,622 A | 10/1998 | Tsuji et al. |
| 5,841,170 A | 11/1998 | Adan et al. |
| 5,851,861 A | 12/1998 | Suzawa et al. |
| 5,852,488 A | 12/1998 | Takemura |
| 5,858,867 A | 1/1999 | Hsia et al. |
| 5,903,249 A | 5/1999 | Koyama et al. |
| 5,923,961 A | 7/1999 | Shibuya et al. |
| 5,923,962 A | 7/1999 | Ohtani et al. |
| 5,982,348 A | 11/1999 | Nakajima et al. |
| 5,985,701 A | 11/1999 | Takei et al. |
| 5,990,542 A | 11/1999 | Yamazaki |
| 5,994,721 A | 11/1999 | Zhong et al. |
| 6,011,274 A | 1/2000 | Gu et al. |
| 6,031,290 A | 2/2000 | Miyazaki et al. |
| 6,093,934 A | 7/2000 | Yamazaki et al. |
| 6,115,094 A | 9/2000 | Fukunaga |
| 6,147,451 A | 11/2000 | Shibata et al. |
| 6,153,445 A | 11/2000 | Yamazaki et al. |
| 6,153,893 A | 11/2000 | Inoue et al. |
| 6,160,269 A | 12/2000 | Takemura et al. |
| 6,166,397 A | 12/2000 | Yamazaki et al. |
| 6,166,414 A | 12/2000 | Miyazaki et al. |
| 6,198,133 B1 | 3/2001 | Yamazaki et al. |
| 6,211,536 B1 | 4/2001 | Zhang |
| 6,238,754 B1 | 5/2001 | Shohara et al. |
| 6,259,138 B1 | 7/2001 | Ohtani et al. |
| 6,274,400 B1 | 8/2001 | Jen |
| 6,274,887 B1 | 8/2001 | Yamazaki et al. |
| 6,277,679 B1 | 8/2001 | Ohtani |
| 6,281,552 B1 | 8/2001 | Kawasaki et al. |
| 6,284,577 B1 | 9/2001 | Suzawa et al. |
| 6,288,413 B1 | 9/2001 | Kamiura et al. |
| 6,303,963 B1 | 10/2001 | Ohtani et al. |
| 6,306,694 B1 | 10/2001 | Yamazaki et al. |
| 6,337,731 B1 | 1/2002 | Takemura |
| 6,346,718 B1 | 2/2002 | Yamanaka et al. |
| 6,346,730 B1 | 2/2002 | Kitakado et al. |
| 6,358,766 B1 | 3/2002 | Kasahara |
| 6,362,507 B1 | 3/2002 | Ogawa et al. |
| 6,365,917 B1 | 4/2002 | Yamazaki |
| 6,384,808 B2 | 5/2002 | Azami |
| 6,392,628 B1 | 5/2002 | Yamazaki et al. |
| 6,399,988 B1 | 6/2002 | Yamazaki |
| 6,407,430 B1 | 6/2002 | Ohtani et al. |
| 6,417,057 B1 | 7/2002 | Takemura et al. |
| 6,420,200 B1 | 7/2002 | Yamazaki et al. |
| 6,462,802 B1 | 10/2002 | Nishimura et al. |
| 6,469,317 B1 | 10/2002 | Yamazaki et al. |
| 6,501,098 B2 | 12/2002 | Yamazaki |
| 6,524,895 B2 | 2/2003 | Yamazaki et al. |
| 6,573,195 B1 | 6/2003 | Yamazaki et al. |
| 6,690,063 B2 | 2/2004 | Takemura et al. |
| 6,777,763 B1 | 8/2004 | Zhang et al. |
| 6,812,490 B2 | 11/2004 | Takehashi et al. |
| 6,835,607 B2 | 12/2004 | Takemura et al. |
| 2001/0055841 A1 | 12/2001 | Yamazaki et al. |
| 2002/0021266 A1 | 2/2002 | Koyama et al. |
| 2002/0048829 A1 | 4/2002 | Yamazaki et al. |
| 2003/0122132 A1 | 7/2003 | Yamazaki |
| 2004/0051142 A1 | 3/2004 | Yamazaki et al. |
| 2006/0051906 A1 | 3/2006 | Yamazaki |
| 2006/0081931 A1 | 4/2006 | Yamazaki et al. |

FOREIGN PATENT DOCUMENTS

| | | |
|---|---|---|
| EP | 0 522 991 A1 | 1/1993 |
| EP | 0 803 911 A2 | 10/1997 |
| EP | 0 886 319 A | 12/1998 |
| JP | 3-250632 | 11/1991 |
| JP | 4-165629 | 6/1992 |
| JP | 4-369271 | 12/1992 |
| JP | 5-102483 | 4/1993 |
| JP | 6-37314 | 2/1994 |
| JP | 06-148685 | 5/1994 |
| JP | 6-216156 | 8/1994 |
| JP | 6-260645 | 9/1994 |
| JP | 7-130652 | 5/1995 |
| JP | 7-202210 | 8/1995 |
| JP | 07-235680 | 9/1995 |
| JP | 7-335904 | 12/1995 |
| JP | 8-51207 | 2/1996 |
| JP | 8-78329 | 3/1996 |
| JP | 8-110530 | 4/1996 |
| JP | 08-274336 | 10/1996 |
| JP | 9-298304 | 11/1997 |
| JP | 10-92576 | 4/1998 |
| JP | 10-135468 | 5/1998 |
| JP | 10-135469 | 5/1998 |
| JP | 10-144929 | 5/1998 |
| JP | 10-163498 | 6/1998 |
| JP | 10-189979 | 7/1998 |
| JP | 10-247735 | 9/1998 |
| JP | 2000-223716 | 8/2000 |
| JP | 2000-236097 | 8/2000 |
| JP | 2000-243975 | 9/2000 |
| WO | WO 90/13148 | 11/1990 |

OTHER PUBLICATIONS

Hwang, J-M et al, "High Performance Submicron SOI/CMOS with an Elevated Source/Drain Structure," IEEE, Oct. 5, 1993, pp. 132-133.

Tanaka, T. et al, "Ultrafast Operation of $V_{th}$-Adjusted p$^+$-n$^+$Double-Gate SOI MOSFET'S," IEEE Electron Device Letters, vol. 15, No. 10, Oct. 1994, pp. 386-388.

Inui, S. et al, "Thresholdless Antiferroelectricity in Liquid Crystals and its Application to Displays," J. Mater Chem., vol. 6, No. 4, 1996, pp. 671-673.

Yoshida, T. et al, "A Full-Color Thresholdless Antiferroelectric LCD Exhibiting Wide Viewing Angle with Fast Response Time," SID 97 Digest, 1997, pp. 841-844.

Choi, K-Y et al, "Gate-Overlapped Lightly Doped Drain Poly-Si Thin-Film Transistors for Large Area-AMLCD," IEEE Transactions on Electron Devices, vol. 45, No. 6, Jun. 1998, pp. 1272-1279.

Furue, H. et al, "Characteristics and Driving Scheme of Polymer-Stabilized Monostable FLCD Exhibiting Fast Response Time and High Contrast Ratio with Gray-Scale Capability," SID 98 Digest, 1998, pp. 782-785.

Terada, et al, "Half-V Switching Mode FLCD," Proceedings of the 46th Applied Physics Association Lectures, 28p-V-8, Mar. 1999, p. 1316.

Yoshihara, T. et al, "Time Division Full Color LCD by Ferroelectric Liquid Crystal," EKISHO, vol. 3, No. 3, 1999, pp. 190-194.

Hatano, M. et al, "A Novel Self-Aligned Gate-Overlapped LDD Poly-Si TFT with High Reliability and Performance," IEDM 97, 1997, pp. 523-526.

Schenk, H. et al, "Polymers for Light Emitting Diodes," EuroDisplay '99, Proceedings of the 19th International Display Research Conference, Berlin, Germany, Sep. 6-9, 1999, pp. 33-37.

European Search Report re application No. EP 99124230.6, dated May 16, 2000.

European Search Report re application No. EP 99 12 4230.6, dated Aug. 8, 2000.

1) Hwang, J-M et al, "Novel Polysilicon/TiN Stacked-Gate Structure for Fully Depleted SOI/CMOS," IDEM 92: Technical Digest of International Electron Devices Meeting,1992, pp. 345-348.

Hwang, J-M et al, "High Performance Submicron SOI/CMOS with an Elevated Source/Drain Structure," Proceedings of the Annual SOS/SOI Technology Conference, IEEE, Oct. 5, 1993, pp. 132-133.

* cited by examiner

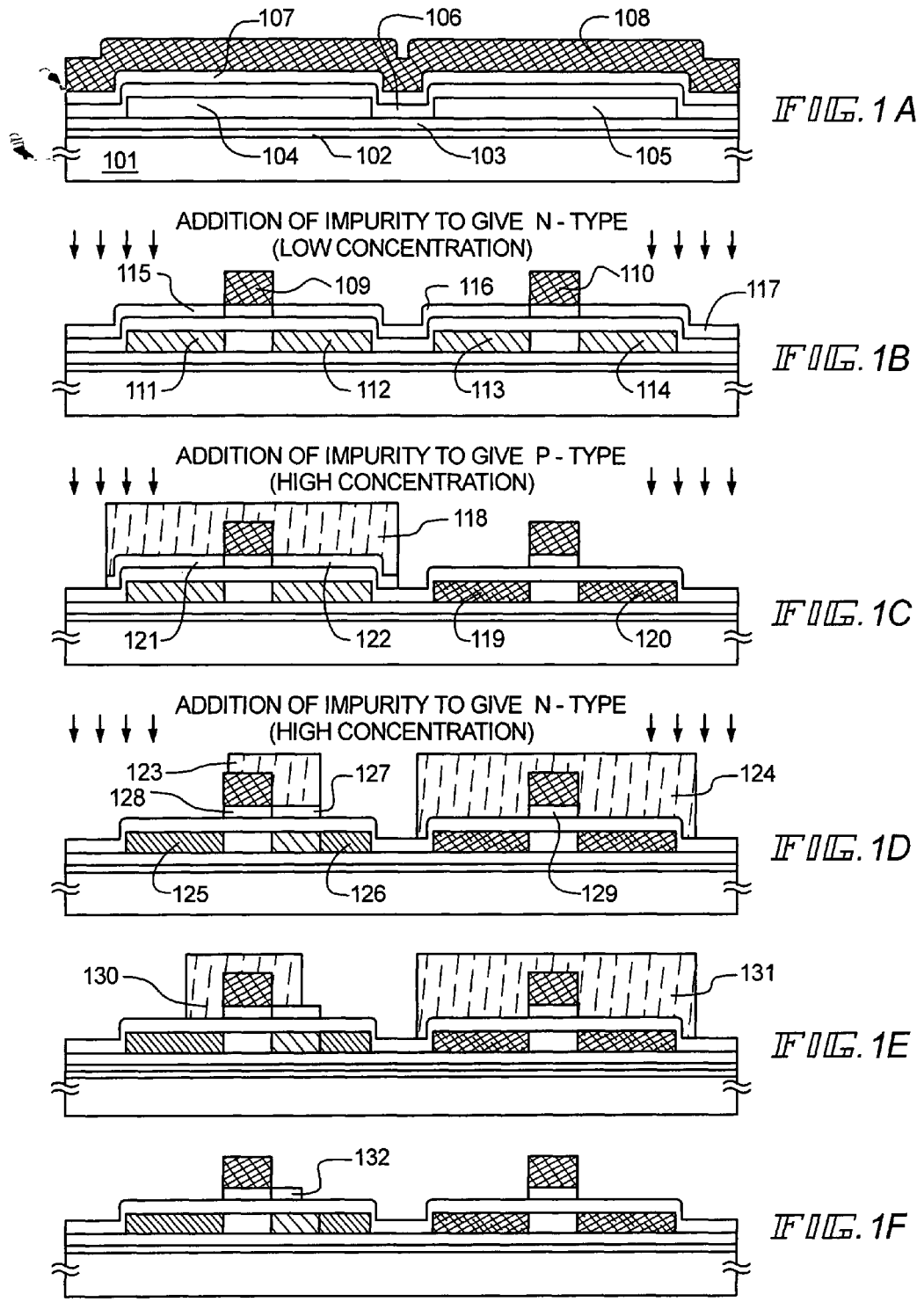

SECTIONAL STRUCTURAL VIEW OF INVERTER CIRCUIT (A-A' CROSS - SECTION)

TOP VIEW OF INVERTER CIRCUIT

INVERTER CIRCUIT DIAGRAM

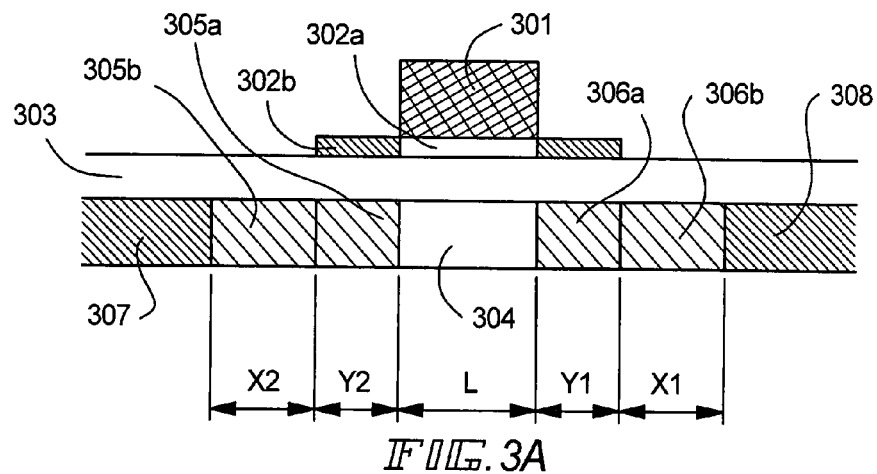
*FIG. 3A*
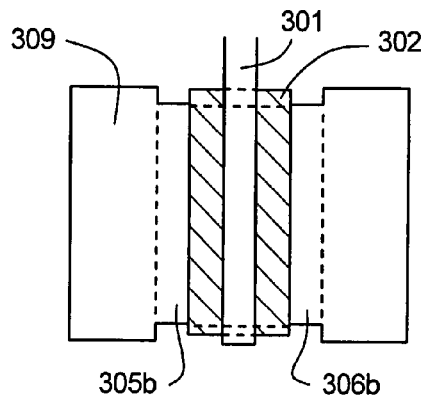
*FIG. 3B*
| | TFT POWER SOURCE VOLTAGE | CHANNEL LENGTH μm | Y μm | X μm |
|---|---|---|---|---|
| DRIVER BUFFER CIRCUIT PORTION TFT | (16±2)V | 5.0±1.5 | 2.5±0.3 | 2.5±0.5 |
| | (20±3)V | 5.0±2.0 | 3.0±0.5 | 3.0±0.5 |
| DRIVER LOGIC CIRCUIT PORTION TFT | (5±1)V | 3.0±1.0 | 0.5±0.3 | 0.5±0.3 |
| | (10±1)V | 3.5±1.0 | 2.0±0.3 | 1.0±0.5 |
| ANALOG SWITCH PORTION TFT | (16±2)V | 3.0±1.0 | 1.5±0.5 | 1.5±0.5 |
| PIXEL PORTION TFT | (16±2)V | 3.0±1.0 | 1.5±0.5 | 1.5±0.5 |
*FIG. 3C*

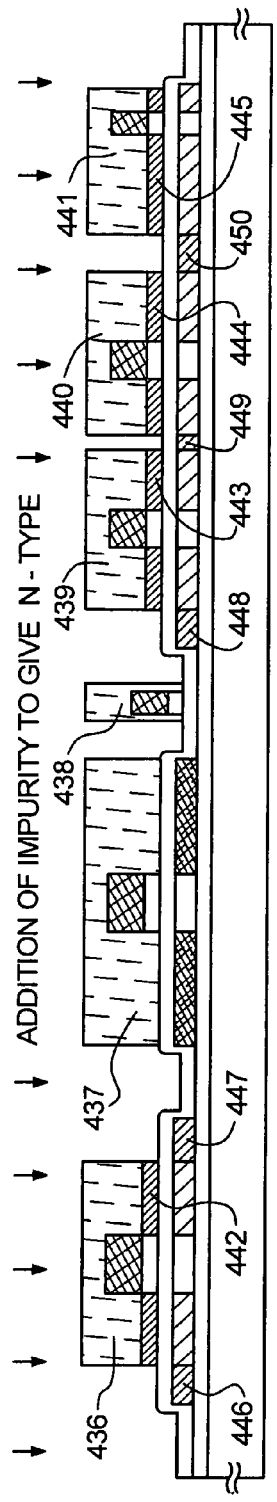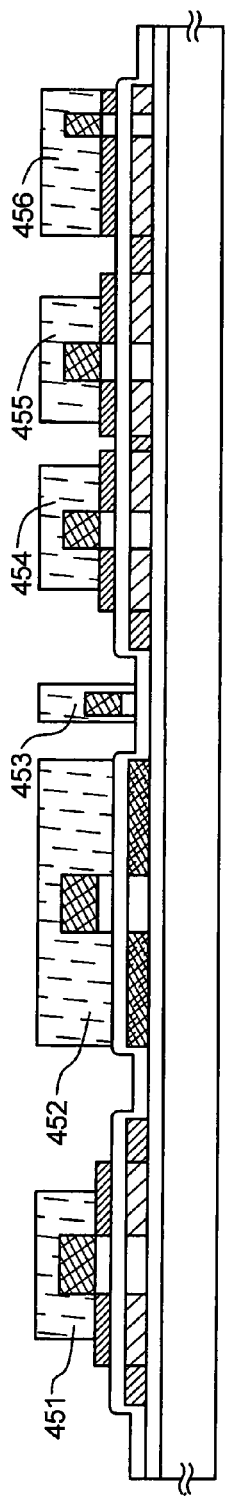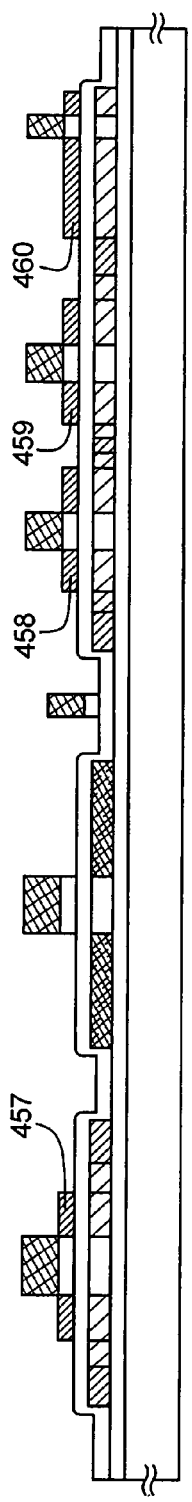

TOP VIEW OF PIXEL MATRIX CIRCUIT

N - CHANNEL TFT   P - CHANNEL TFT
TOP VIEW OF CMOS CIRCUIT

CRYSTALLIZATION STEP

CRYSTALLIZING PROCESS

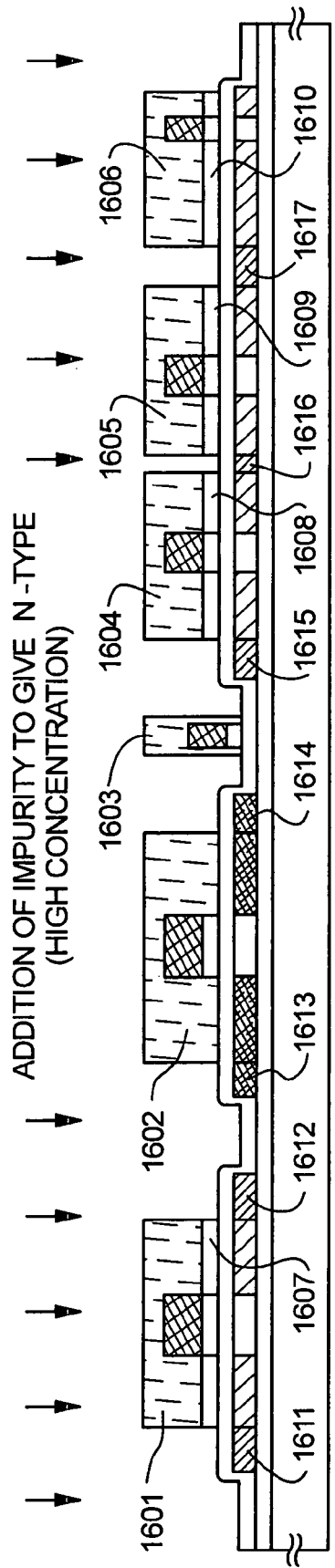
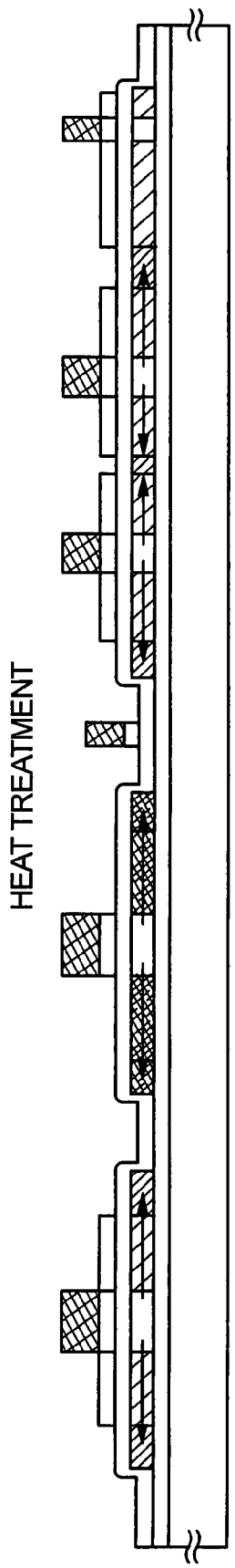
FIG. 16A
ADDITION OF IMPURITY TO GIVE N-TYPE (HIGH CONCENTRATION)
1601, 1602, 1603, 1604, 1605, 1060: RESIST MASK
1611, 1612, 1613, 1614, 1615, 1616, 1617: REGION ADDED WITH PHOSPHORUS
FIG. 16B
HEAT TREATMENT

STRUCTURAL EXAMPLE OF TFT OF SHIFT REGISTER CIRCUIT

STRUCTURAL EXAMPLE OF TFT OF LEVEL SHIFTER CIRCUIT OR BUFFER CIRCUIT

STRUCTURAL EXAMPLE OF TFT OF SAMPLING CIRCUIT

STRUCTURAL EXAMPLE OF TFT OF PIXEL MATRIX CIRCUIT 1812, 1813, 1814, 1815, 1816, 1817, 1818: LDD REGION

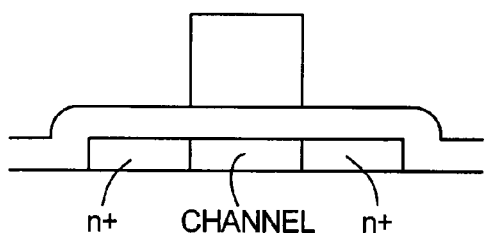
FIG. 20 (1A)
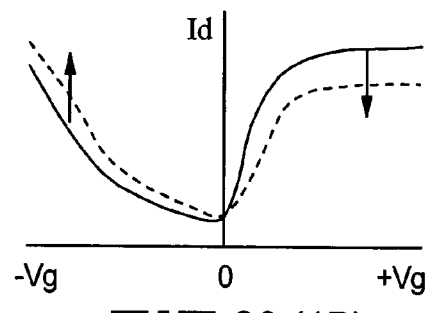
FIG. 20 (1B)
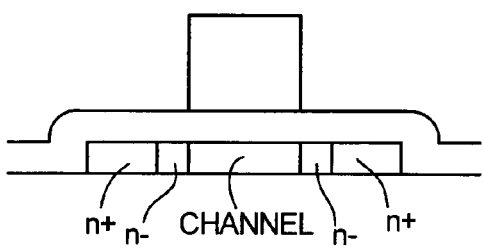
FIG. 20 (2A)
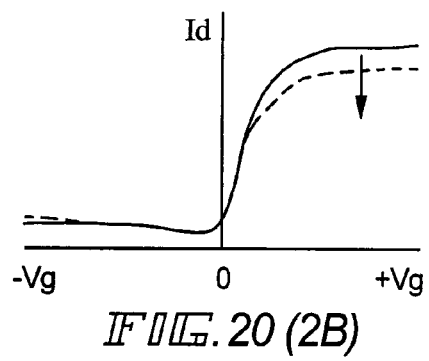
FIG. 20 (2B)
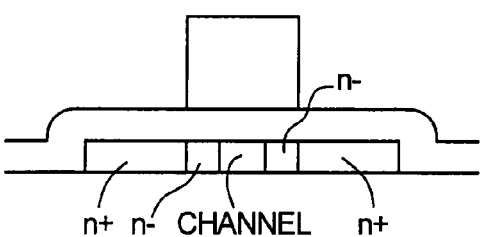
FIG. 20 (3A)
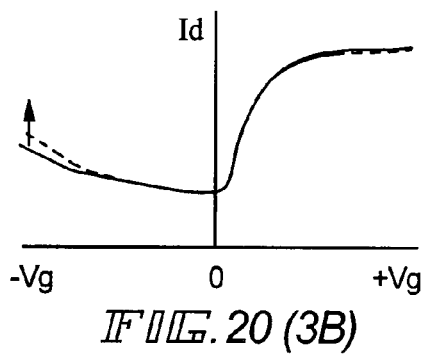
FIG. 20 (3B)
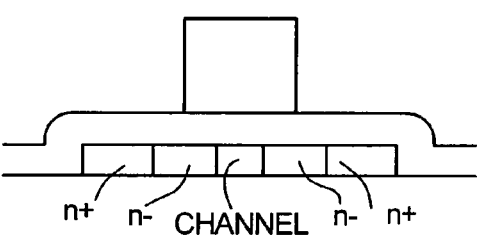
FIG. 20 (4A)
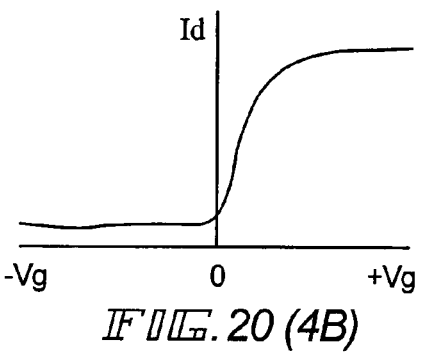
FIG. 20 (4B)

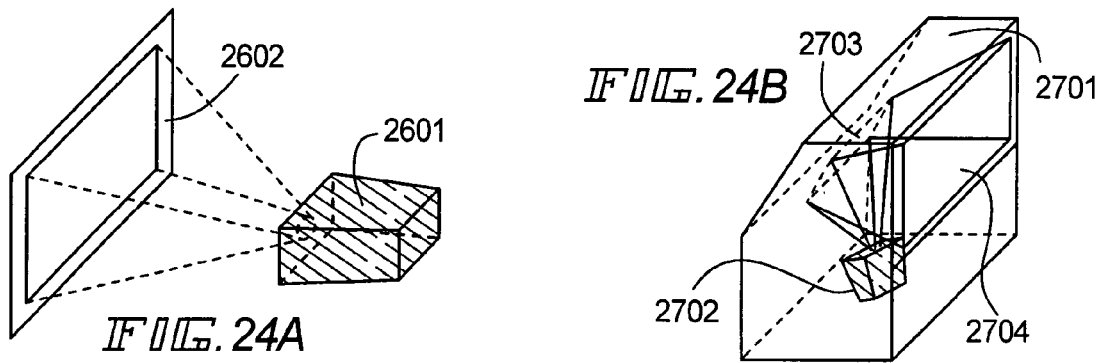
FIG. 24A
FIG. 24B
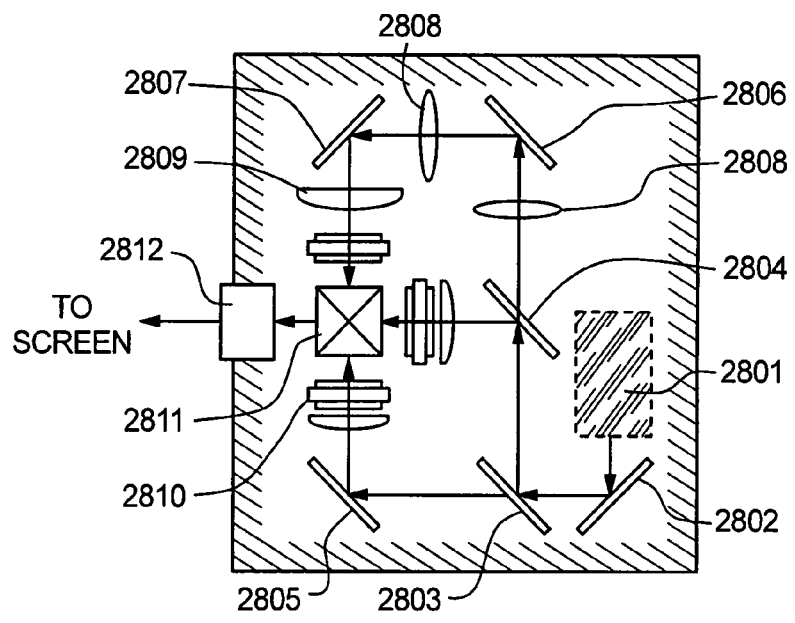
PROTECTION DEVICE (THREE PLATE TYPE)
FIG. 24C
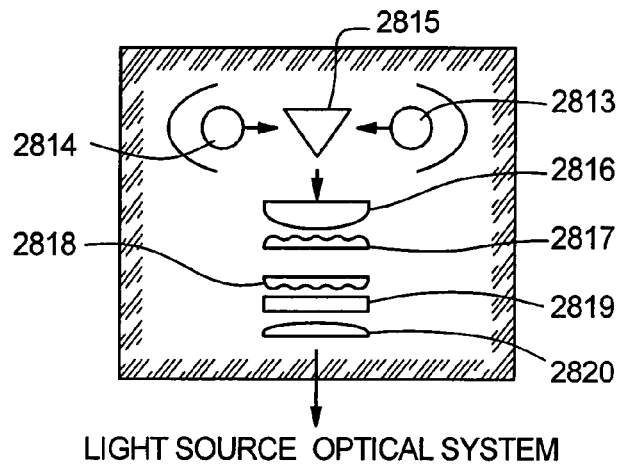
LIGHT SOURCE OPTICAL SYSTEM
FIG. 24D

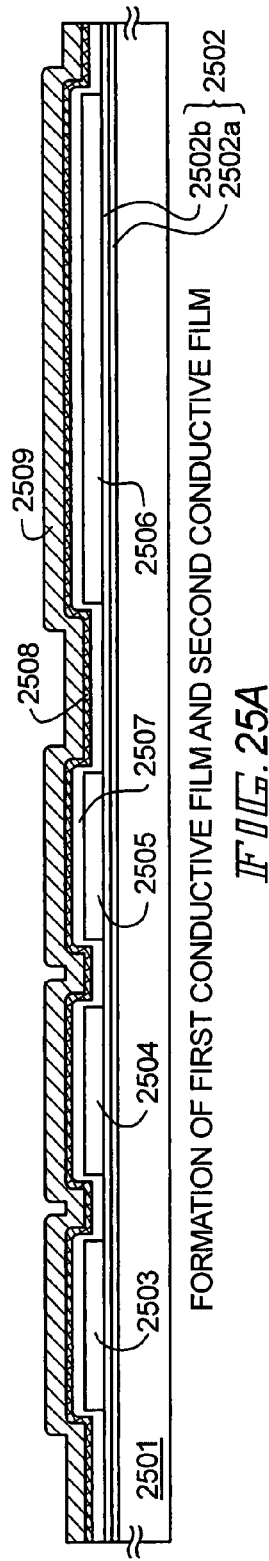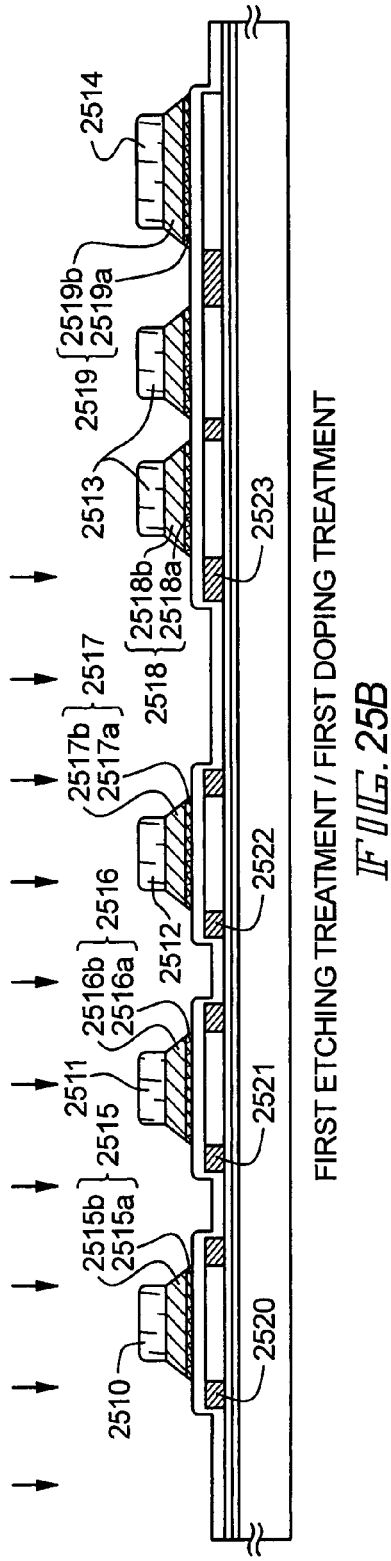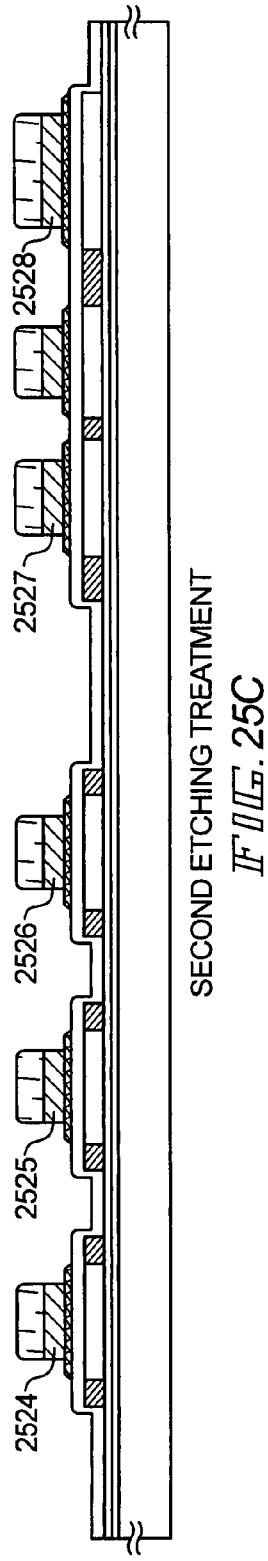

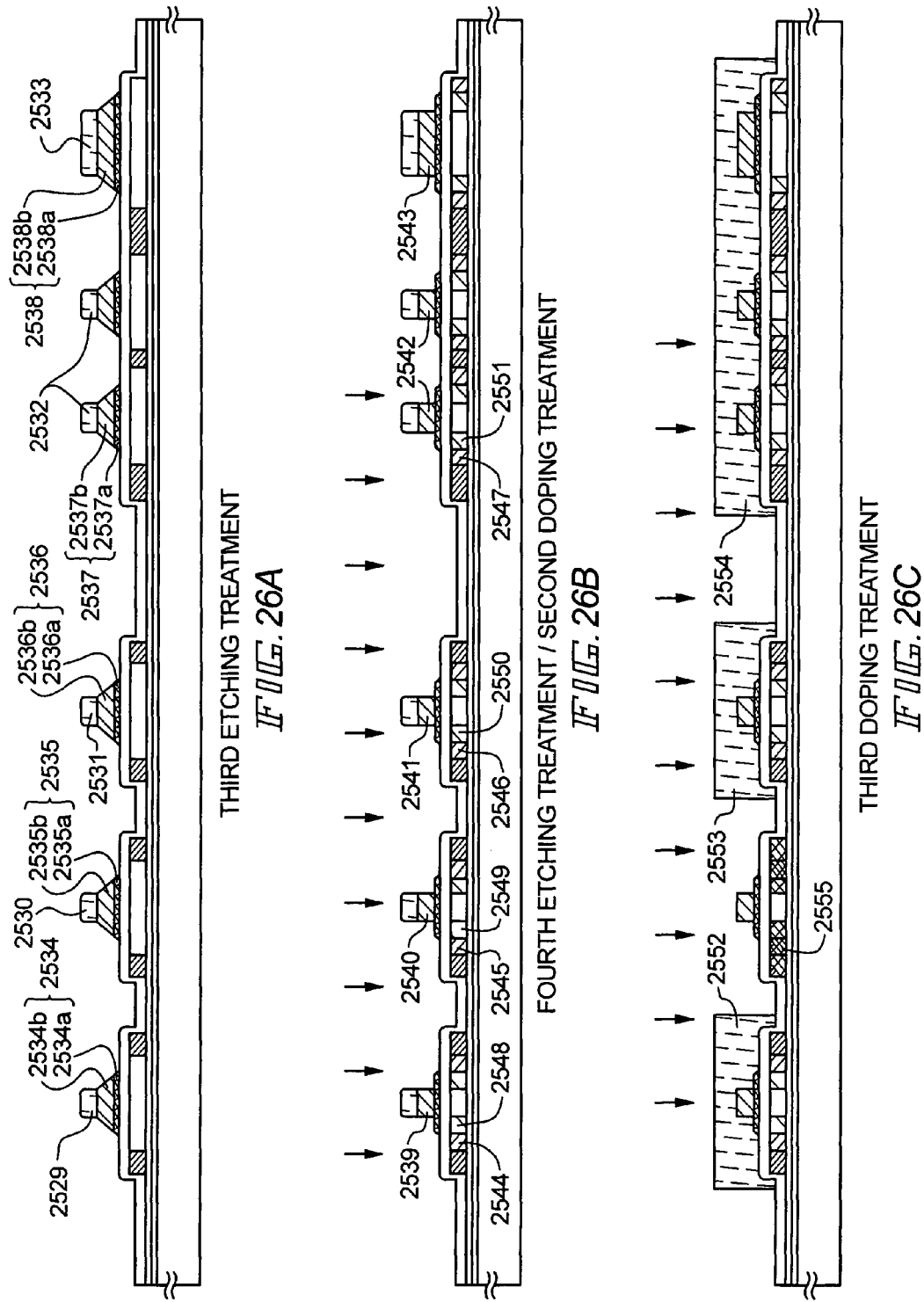

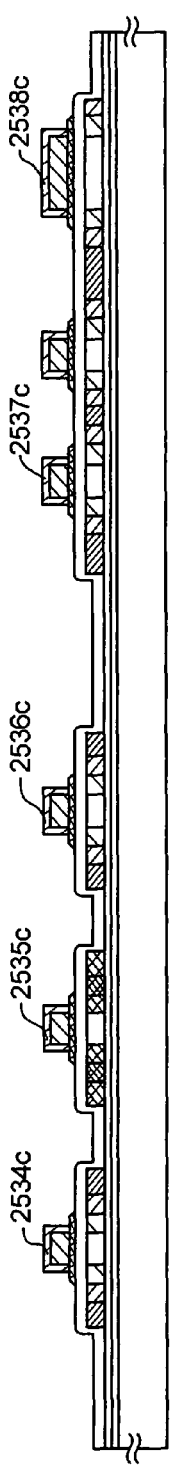
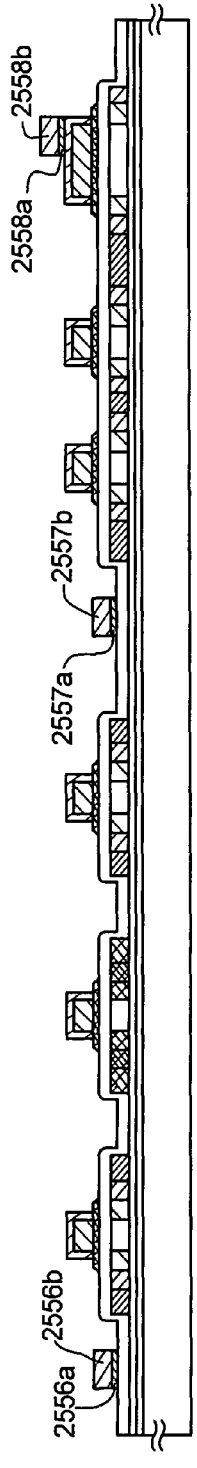
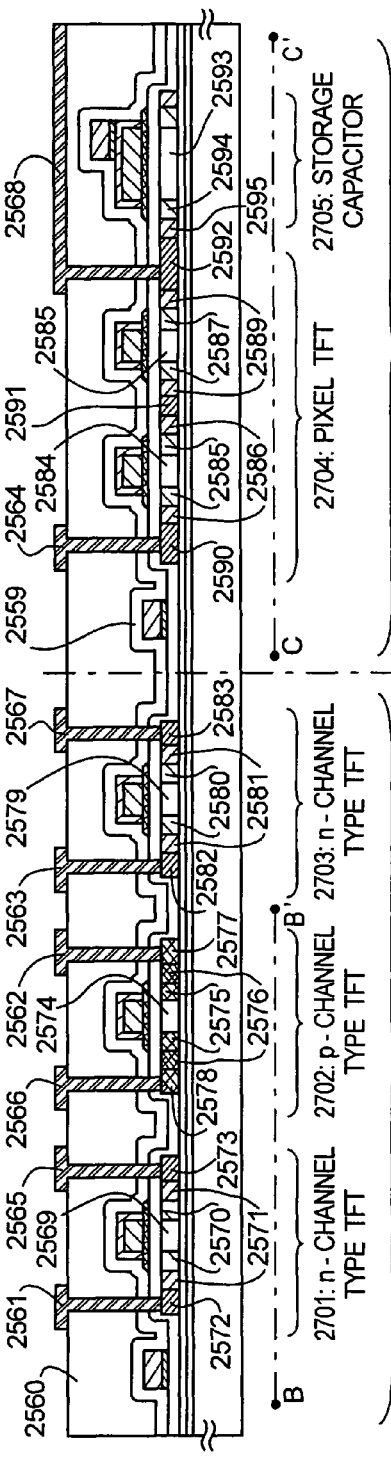

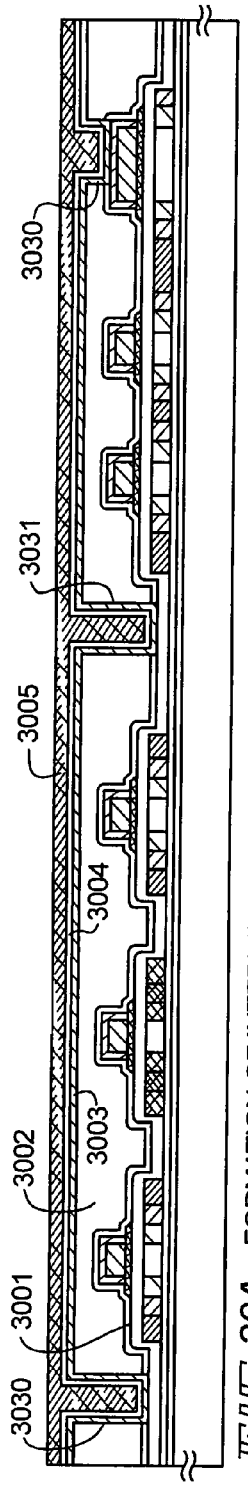
FIG. 30A FORMATION OF INTERLAYER FILM, BLOCKING LAYER, Cu SEED LAYER AND Cu PLATED LAYER
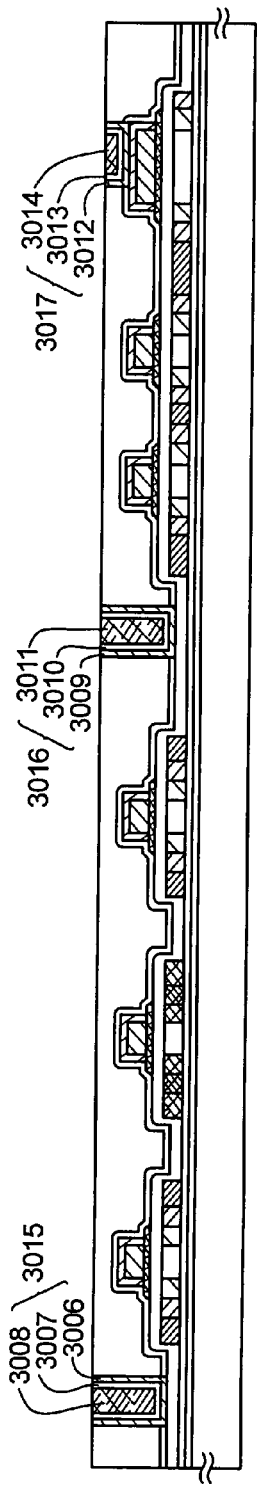
FIG. 30B FLATTENING
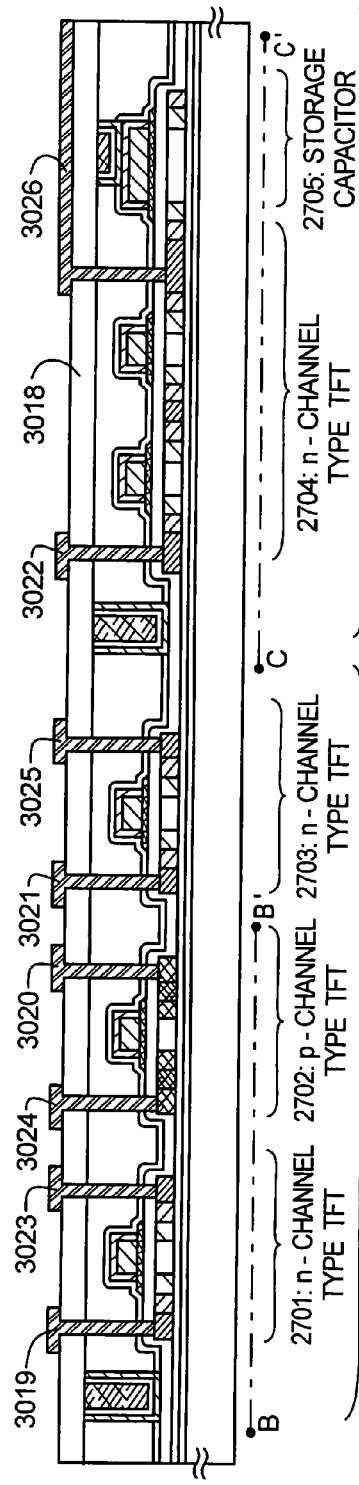
FIG. 30C FORMATION OF INTERLAYER FILM / FORMATION OF SOURCE AND DRAIN LINES

METHOD OF FORMING A SEMICONDUCTOR DEVICE

This application is a divisional of copending U.S. application Ser. No. 09/454,146 filed on Dec. 3, 1999.

BACKGROUND OF THE INVENTION

1. Field of the Invention

The present invention relates to a semiconductor device including a circuit constituted by a thin film transistor on a substrate having an insulating surface and a method of fabricating the same. For example, the invention relates to a structure of an electro-optical device typified by a liquid crystal display device, and an electronic equipment incorporating the electro-optical device. Incidentally, in the present specification, the term "semiconductor device" indicates any devices functioning by using semiconductor characteristics, and includes the foregoing electro-optical device and the electronic equipment incorporating the electro-optical device in its category.

2. Description of the Related Art

Attention has been paid to a technical development for fabricating an active matrix type liquid crystal display device by forming a thin film transistor (hereinafter referred to as a "TFT") on a transparent glass substrate. Particularly, since high mobility can be obtained for a TFT (crystalline TFT) including an active layer of a semiconductor film having crystal structure, it has become possible to realize image display with high fineness by integrating functional circuits on the same substrate.

In the present specification, the semiconductor film having crystal structure includes a single crystal semiconductor, a polycrystal semiconductor, and a microcrystal semiconductor, and further, includes a semiconductor disclosed in Japanese Patent Application Laid-open Nos. Hei. 7-130652, Hei. 8-78329, Hei. 10-135468, or Hei. 10-135469.

In order to construct an active matrix type liquid crystal display device, one million to two million crystalline TFTs are required for only a pixel matrix circuit (hereinafter referred to as a "pixel portion"), and further, when functional circuits provided at the periphery are added, more crystalline TFTs have been required. The specification required for the liquid crystal display device is severe, and in order to stably perform image display, it has been necessary to secure reliability of each crystalline TFT.

The characteristics of a TFT can be considered by dividing them into two states of an on state and an off state. The characteristics such as an on current, mobility, S-value, and threshold value can be known from the characteristics of the on state. In the characteristics of the off state, importance is attached to an off current.

The pixel portion of the active matrix type liquid crystal display device is constructed by arranging n-channel TFTs two-dimensionally, and is driven by application of a voltage having an amplitude of about 15 to 20 V. Here, it is natural that the characteristics of the on state are satisfied, and further, it has been necessary that the off current is sufficiently lowered.

On the other hand, a driver circuit provided at the periphery of the pixel portion is constructed using a CMOS circuit as a base, and is made up of a shift register, a level shifter, a buffer circuit, and a sampling circuit. In these circuits, importance has been attached mainly to the characteristics of the on state.

However, the crystalline TFT has a problem that the off current is apt to become high.

Besides, the crystalline TFT has been regarded as being inferior to a MOS transistor (transistor fabricated on a single crystal semiconductor substrate) used for an LSI or the like in reliability. For example, when the crystalline TFT is continuously driven, a deterioration phenomenon, such as a decrease in mobility or on current (current flowing when a TFT is in an on state), or an increase in off current (current flowing when a TFT is in an off state), has been sometimes observed. It has been considered that this cause is a hot carrier effect, and hot carriers generated by a high electric field in the vicinity of a drain cause the deterioration phenomenon. In the MOS transistor, as a method of decreasing the off current and relieving the high electric field in the vicinity of the drain, a low concentration drain (LDD: Lightly Doped Drain) structure has been known. In this structure, an impurity region having a low concentration is provided outside of a channel region, and this low concentration impurity region is called an LDD region.

Naturally, it has been known that the LDD structure is formed also in the crystalline TFT. For example, Japanese Patent Application Laid-open No. Hei. 7-202210 discloses such a technique that a gate electrode is made a two-layer structure having two layers of different widths, the width of an upper layer is formed to be smaller than the width of a lower layer, and ion implantation is performed using the gate electrode as a mask, so that an LDD region is formed by one step of ion implantation using a difference in intrusion depth of ions which is caused from a difference in thicknesses of the two layers of the gate electrode. The TFT has such a structure that the gate electrode exists just over the LDD region, that is, a gate overlap structure.

The gate overlap structure is known as GOLD (Gate-drain Overlapped LDD) structure, LATID (Large-tilt-angle implanted drain) structure, ITLDD (Inverse TLDD) structure, or the like. By this, the high electric field in the vicinity of the drain is relieved to prevent the hot carrier effect, and reliability can be improved. For example, in "Mutsuko Hatano, Hajime Akimoto and Takeshi Sakai, IDEM 97 TECHNICAL DIGEST, p 523-526, 1977", it is ascertained that extremely excellent reliability can be obtained in the GOLD structure with a side wall formed of silicon as compared with TFTs of other structures.

However, the structure disclosed in the paper has a problem that the off current becomes high as compared with a normal LDD structure, and a countermeasure therefor has been necessary. Particularly, in an n-channel TFT constituting a pixel matrix circuit (hereinafter referred to as a "pixel TFT"), if the off current is increased, consumed electric power is increased and an abnormality appears on image display. Thus, it has not been possible to apply a crystalline TFT of the GOLD structure as it is.

SUMMARY OF THE INVENTION

The present invention is a technique to solve such problems, and has an object to realize a crystalline TFT which has reliability comparable to or superior to a MOS transistor, and has excellent characteristics in both of the on state and off state. Another object of the invention is to realize a highly reliable semiconductor device including a semiconductor circuit formed of such a crystalline TFT.

FIGS. 20(1A) to 20(4B) schematically show, on the basis of findings obtained before now, structures of TFTs and Vg-Id (gate voltage versus drain current) characteristics obtained for the structures. FIG. 20(1A) shows the most basic TFT structure in which a semiconductor layer is constituted by a channel region, a source region, and a drain region. FIG. 20(1B) shows Vg-Id characteristics of an n-channel TFT, and its +Vg side shows characteristics of an on state of the TFT, and its −Vg side shows characteristics of an off state. A solid line shows characteristics in an initial state, and a broken line shows characteristics in a deteriorated state. In this structure, both the on current and the off current become high, and the deterioration is also high. Thus, in general, the TFT in this structure has not been used without any change.

The structure of FIG. 20(2A) is such that an LDD region is added as compared with the structure of FIG. 20(1A), and the LDD region does not overlap with a gate electrode. At this time, as shown in FIG. 20(2B), although it has been possible to suppress an off current to some degree, it has not been possible to prevent deterioration of an on current. The structure of FIG. 20(3A) is such that an LDD region completely overlaps with a gate electrode, and is called the GOLD structure. At this time, as shown in FIG. 20(3B), although it has been possible to suppress deterioration of an on current, there has been a defect that an off current increases as compared with the LDD structure.

Thus, in the structures shown in FIGS. 20(1A), 20(2A), and 20(3A), it has been impossible to concurrently satisfy both of the characteristics of the on region and the characteristics of the off region necessary for a pixel portion together with a problem of reliability. However, as shown in FIG. 20(4A), an LDD region is made to have such a structure that a portion overlapping with a gate electrode and a portion not overlapping with the gate electrode are formed. By adopting this structure, it becomes possible to sufficiently suppress deterioration of an on current and to reduce an off current.

The structure of FIG. 20(4A) has been obtained through the following consideration. When a negative voltage is applied to a gate electrode of an n-channel TFT of the structure shown in FIG. 20(3A), that is, when an off state is produced, in an LDD region formed to overlap with the gate electrode, a hole is induced at its interface against a gate insulating film as the negative voltage increases, so that a current path by a minority carrier connecting a drain region, the LDD region and a channel region is formed. At this time, when a positive voltage is applied to the drain region, since the hole flows toward the source region side, it is considered that this is a cause of increasing the off current.

The present inventor has considered that in order to cut off such a current path on the way, it is sufficient if such an LDD region that the minority carrier is not stored even if the gate voltage is applied is provided. The present invention relates to a thin film transistor having such a structure and a circuit using this thin film transistor.

Thus, in a semiconductor device comprising: a semiconductor layer; a gate insulating film formed to be in contact with the semiconductor layer; and a gate electrode formed to be in contact with the gate insulating film, the structure of the present invention is characterized in that:
    the gate electrode includes:
    a first layer of the gate electrode made of a semiconductor film formed to be in contact with the gate insulating film; and
    a second layer of the gate electrode formed to be in contact with the first layer of the gate electrode;
    the semiconductor layer includes:
    a channel formation region;
    a first impurity region of one conductivity type; and
    a second impurity region of the one conductivity type sandwiched between the channel formation region and the first impurity region of the one conductivity type and being in contact with the channel formation region; and
    a part of the second impurity region of the one conductivity type overlaps with the first layer of the gate electrode through the gate insulating film.

Also, in a semiconductor device comprising: a semiconductor layer; a gate insulating film formed to be in contact with the semiconductor layer; and a gate electrode formed to be in contact with the gate insulating film, another structure of the present invention is characterized in that the gate electrode includes:
    a first layer of the gate electrode made of a semiconductor film formed to be in contact with the gate insulating film; and
    a second layer of the gate electrode formed to be in contact with the first layer of the gate electrode and to be disposed inside the first layer of the gate electrode;
    the semiconductor layer includes:
    a channel formation region;
    a first impurity region of one conductivity type; and
    a second impurity region of the one conductivity type sandwiched between the channel formation region and the first impurity region of the one conductivity type and being in contact with the channel formation region; and
    a part of the second impurity region of the one conductivity type overlaps with the first layer of the gate electrode through the gate insulating film.

Further, in a semiconductor device comprising: a semiconductor layer; a gate insulating film formed to be in contact with the semiconductor layer; and a gate electrode formed to be in contact with the gate insulating film, another structure of the present invention is characterized in that:
    the gate electrode includes:
    a first layer of the gate electrode made of a semiconductor film formed to be in contact with the gate insulating film; and
    a second layer of the gate electrode formed to be in contact with the first layer of the gate electrode and having a length in a channel length direction shorter than the first layer of the gate electrode;
    the semiconductor layer includes:
    a channel formation region;
    a first impurity region of one conductivity type; and
    a second impurity region of the one conductivity type sandwiched between the channel formation region and the first impurity region of the one conductivity type and being in contact with the channel formation region; and
    a part of the second impurity region of the one conductivity type overlaps with the first layer of the gate electrode through the gate insulating film.

Still further, in a semiconductor device comprising: a semiconductor layer; a gate insulating film formed to be in contact with the semiconductor layer; and a gate electrode formed to be in contact with the gate insulating film, another structure of the present invention is characterized in that:
    the gate electrode has a structure of two layers having different lengths in a channel length direction and includes:
    a first layer of the gate electrode made of a semiconductor film formed to be in contact with the gate insulating film; and
    a second layer of the gate electrode formed to be in contact with the first layer of the gate electrode and having a length in the channel length direction shorter than the first layer of the gate electrode;
    the semiconductor layer includes:
    a channel formation region;
    a first impurity region of one conductivity type; and
    a second impurity region of the one conductivity type sandwiched between the channel formation region and the first impurity region of the one conductivity type and being in contact with the channel formation region; and a part of the second impurity region of the one conductivity type overlaps with the first layer of the gate electrode through the gate insulating film.

In the above structures, it is premised that a concentration of the impurity element of the one conductivity type in the second impurity region is lower than a concentration of the impurity element of the one conductivity type in the first impurity region.

Further, the present invention is characterized in that a semiconductor layer of the one conductivity type, an insulating film formed to be in contact with the semiconductor layer, and an electrode made up of a semiconductor film formed to be in contact with the insulating film, form a capacitance, and the semiconductor layer of the one conductivity type is connected with the first impurity region.

Also, in a semiconductor device comprising: a pixel portion including an n-channel thin film transistor, another structure of the present invention is characterized in that: a gate electrode of the n-channel thin film transistor includes:
   a first layer of the gate electrode made of a semiconductor film formed to be in contact with a gate insulating film; and
   a second layer of the gate electrode formed to be in contact with the first layer of the gate electrode;
   a semiconductor layer of the n-channel thin film transistor includes:
      a channel formation region;
      a first impurity region of one conductivity type; and
      a second impurity region of the one conductivity type sandwiched between the channel formation region and the first impurity region of the one conductivity type and being in contact with the channel formation region; and
   a part of the second impurity region of the one conductivity type overlaps with the first layer of the gate electrode through the gate insulating film.

Still further, in a semiconductor device comprising: a CMOS circuit including an n-channel thin film transistor and a p-channel thin film transistor, another structure of the present invention is characterized in that a gate electrode of the n-channel thin film transistor includes:
   a first layer of the gate electrode made of a semiconductor film formed to be in contact with a gate insulating film; and
   a second layer of the gate electrode formed to be in contact with the first layer of the gate electrode;
   a semiconductor layer of the n-channel thin film transistor includes:
      a channel formation region;
      a first impurity region of one conductivity type; and
      a second impurity region of the one conductivity type sandwiched between the channel formation region and the first impurity region of the one conductivity type and being in contact with the channel formation region; and
   a part of the second impurity region of the one conductivity type overlaps with the first layer of the gate electrode through the gate insulating film.

Yet further, in a semiconductor device comprising: a pixel portion including an n-channel thin film transistor; and a CMOS circuit formed with an n-channel thin film transistor and a p-channel thin film transistor, another structure of the present invention is characterized in that a gate electrode of the n-channel thin film transistor includes:
   a first layer of the gate electrode made of a semiconductor film formed to be in contact with a gate insulating film; and
   a second layer of the gate electrode formed to be in contact with the first layer of the gate electrode;
   a semiconductor layer of the n-channel thin film transistor includes:
      a channel formation region;
      a first impurity region of one conductivity type; and
      a second impurity region of the one conductivity type sandwiched between the channel formation region and the first impurity region of the one conductivity type and being in contact with the channel formation region; and
   a part of the second impurity region of the one conductivity type overlaps with the first layer of the gate electrode through the gate insulating film.

In the above-mentioned structures of the present invention, a length of the second layer of the gate electrode of the n-channel thin film transistor is made shorter in a channel length direction than that of the first layer of the gate electrode.

Also, in the above-mentioned structures of the present invention, it is characterized in that a semiconductor layer of the one conductivity type, an insulating film formed to be in contact with the semiconductor layer, and an electrode made of a semiconductor film formed to be in contact with the insulating film, form a capacitance; and the capacitance is connected with the n-channel or p-channel thin film transistor. And, the semiconductor layer of the one conductivity type may be continuously formed with the semiconductor layer of the n-channel or p-channel thin film transistor.

In addition, in the structure of the present invention, it is preferable that the first layer of the gate electrode is made of one kind or plural kinds of elements selected from the group consisting of silicon (Si) and germanium (Ge), or a compound containing the element as its main ingredient, and the second layer of the gate electrode is made of one kind or plural kinds of elements selected from the group consisting of titanium (Ti), tantalum (Ta), tungsten (W), and molybdenum (Mo), or a compound containing the element as its main ingredient.

Also, another structure of the present invention is characterized by comprising:
   a step of forming a semiconductor layer on a substrate; a step of forming a gate insulating film to be in contact with the semiconductor layer;
   a step of forming a first conductive film to be in contact with the gate insulating film;
   a step of forming a second conductive film to be in contact with the first conductive film;
   a step of forming a second layer of a gate electrode from the second conductive film;
   a first impurity adding step of selectively adding an impurity element of one conductivity type to the semiconductor layer;
   a step of forming a first layer of the gate electrode from the first conductive film; and
   a second impurity adding step of selectively adding an impurity element of the one conductivity type to the semiconductor layer.

Further, another structure of the present invention is characterized by comprising:
   a step of forming a semiconductor layer on a substrate;
   a step of forming a gate insulating film to be in contact with the semiconductor layer;
   a step of forming a first conductive film to be in contact with the gate insulating film;
   a step of forming a second conductive film to be in contact with the first conductive film;
   a step of forming a second layer of a gate electrode from the second conductive film;

a first impurity adding step of selectively adding an impurity element of one conductivity type to the semiconductor layer;

a step of forming a first layer of the gate electrode from the first conductive film;

a second impurity adding step of selectively adding an impurity element of the one conductivity type to the semiconductor layer; and a step of removing a part of the first layer of the gate electrode.

Still further, another structure of the present invention is characterized by comprising:

a step of forming a first semiconductor layer and a second semiconductor layer on a substrate;

a step of forming a gate insulating film to be in contact with the first semiconductor layer and the second semiconductor layer;

a step of forming a first conductive film to be in contact with the gate insulating film;

a step of forming a second conductive film to be in contact with the first conductive film;

a step of forming a second layer of a gate electrode from the second conductive film;

a first impurity adding step of selectively adding an impurity element of one conductivity type to at least the first semiconductor layer;

a third impurity adding step of selectively adding an impurity element of a conductivity type opposite to the one conductivity type to the second semiconductor layer;

a step of forming a first layer of the gate electrode from the first conductive film;

a second impurity adding step of selectively adding an impurity element of the one conductivity type to at least the first semiconductor layer.

Yet further, another structure of the present invention is characterized by comprising:

a step of forming a first semiconductor layer and a second semiconductor layer on a substrate;

a step of forming a gate insulating film to be in contact with the first semiconductor layer and the second semiconductor layer;

a step of forming a first conductive film to be in contact with the gate insulating film;

a step of forming a second conductive film to be in contact with the first conductive film;

a step of forming a second layer of a gate electrode from the second conductive film;

a first impurity adding step of selectively adding an impurity element of one conductivity type to at least the first semiconductor layer;

a third impurity adding step of selectively adding an impurity element of a conductivity type opposite to the one conductivity type to the second semiconductor layer;

a step of forming a first layer of the gate electrode from the first conductive film;

a second impurity adding step of selectively adding an impurity element of the one conductivity type to at least the first semiconductor layer; and a step of removing a part of the first layer of the gate electrode.

In the above-mentioned structure of the present invention, the first layer of the gate electrode is made of one kind or plural kinds of elements selected from the group consisting of silicon (Si) and germanium (Ge), or a compound containing the element as its main ingredient, and the second layer of the gate electrode is made of one kind or plural kinds of elements selected from the group consisting of titanium (Ti), tantalum (Ta), tungsten (W), and molybdenum (Mo), or a compound containing the element as its main ingredient.

BRIEF DESCRIPTION OF THE DRAWINGS

FIGS. 1A to 1F are sectional views showing fabricating steps of a TFT.

FIGS. 3A to 3C are views for explaining the positional relation between a gate electrode and a second impurity region.

FIGS. 5A to 5C are sectional views showing fabricating steps of a TFT.

FIGS. 16A and 16B are sectional views showing fabricating steps of a TFT.

FIGS. 20(1A) to 20(4B) are views showing structures of TFTs and their electrical characteristics.

FIGS. 24A to 24D are views showing examples of semiconductor devices.

FIGS. 25A to 27C are views showing fabricating steps of a TFT.

FIGS. 30A to 30C are views showing fabricating steps of a TFT.

DETAILED DESCRIPTION OF THE INVENTION

Embodiment Mode 1

Figure 2A:
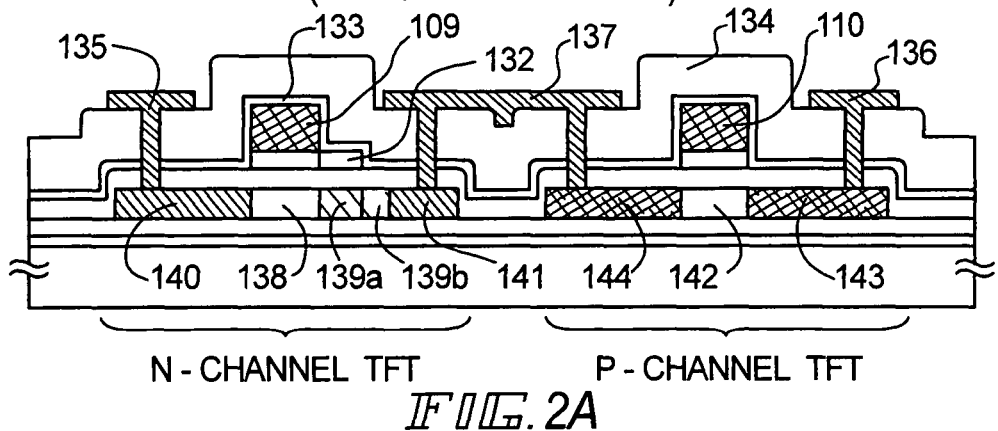
FIGS. 2A, 2B and 2C are a sectional view, a top view, and a circuit diagram of an inverter circuit.

The mode of carrying out the present invention will be described with reference to FIGS. 1A to 1F and FIGS. 2A to 2C. Here, a description will be made on an example in which an n-channel TFT and a p-channel TFT are fabricated on a substrate at the same time to form an inverter circuit as a basic structure of a CMOS circuit.

As a substrate 101 having an insulating surface, a glass substrate, a plastic substrate, a ceramic substrate, or the like may be used. Besides, a silicon substrate in which an insulating film such as a silicon oxide film is formed on its surface, or a stainless substrate may be used. A quartz substrate may also be used.

An under film 102 made of a silicon nitride film and an under film 103 made of a silicon oxide film are formed on a surface of the substrate 101 on which a TFT is to be formed. These under films may be formed by a plasma CVD method or a sputtering method, and are provided in order to prevent an impurity from diffusing from the substrate 101 to a semiconductor layer. For that purpose, it is appropriate that the under film 102 made of the silicon nitride film is formed to a thickness of 20 to 100 nm, typically 50 nm, and the under film 103 made of the silicon oxide film is formed to a thickness of 50 to 500 nm, typically 150 to 200 nm.

Of course, although the under film may be formed of only the under film 102 made of the silicon nitride film or the under film 103 made of the silicon oxide film, it is preferable to make a two-layer structure in view of reliability of a TFT.

As a semiconductor layer formed to be in contact with the under film 103, it is desirable to use a crystalline semiconductor obtained by forming an amorphous semiconductor by a film formation method such as a plasma CVD method, a low pressure CVD method, or a sputtering method and crystallizing it by a solid phase growth method such as a laser crystallizing method or a heat treatment. It is also possible to apply a microcrystalline semiconductor formed by the foregoing film formation method. As a semiconductor material which can be applied here, silicon (Si), germanium (Ge), silicon germanium alloy, and silicon carbide can be enumerated, and in addition, a compound semiconductor material such as gallium arsenide may be used.

Alternatively, an SOI (Silicon On Insulators) substrate in which, as a semiconductor layer formed on the substrate 101, a single crystal silicon layer is formed may be used. Some kinds are known for the SOI substrate according to its structure and fabricating method, and typically, SIMOX (Separation by Implanted Oxygen), ELTRAN (Epitaxial Layer Transfer: registered trademark by Canon Inc.) substrate, Smart-Cut (registered trademark by SOITEC Inc.) or the like may be used. Of course, other SOI substrates may be used.

The semiconductor layer is formed to a thickness of 10 to 100 nm, typically 50 nm. Although hydrogen at a concentration of 10 to 40 atm % is contained in an amorphous semiconductor film fabricated by a plasma CVD method, it is desirable that a heat treatment at 400 to 500° C. is preferably carried out to remove hydrogen from the film so that the hydrogen content is made 5 atom % or less. Although an amorphous silicon film may be formed by another fabricating method such as a sputtering method or an evaporation method, it is desirable that the concentration of an impurity element contained in the film, such as oxygen or nitrogen, is sufficiently reduced.

Here, both of the under film and the amorphous semiconductor film are formed by the plasma CVD method, and at this time, the under film and the amorphous semiconductor film may be continuously formed in vacuum. In this case, after the under film was formed, the surface was not exposed to the air atmosphere, so that it became possible to prevent pollution of the surface, and it was possible to reduce fluctuation in characteristics of formed TFTs.

As a step of crystallizing the amorphous semiconductor film, a well-known laser crystallizing technique or thermal crystallizing technique may be used. Especially, if a crystalline semiconductor film is formed by the thermal crystallizing technique using a catalytic element, excellent TFT characteristics can be obtained.

The thus formed crystalline semiconductor film was patterned, so that island-like semiconductor layers 104 and 105 were formed.

Next, a gate insulating film 106 containing silicon oxide or silicon nitride as its main ingredient is formed to cover the island-like semiconductor layers 104 and 105. The gate insulating film 106 is formed by a plasma CVD method or a sputtering method, and it is appropriate that the thickness is made 10 to 200 nm, preferably 50 to 150 nm.

A first conductive film 107 which became a first layer of a gate electrode and a second conductive film 108 which became a second layer of the gate electrode were formed on the surface of the gate insulating film 106. The first conductive film 107 is a semiconductor film containing Si or Ge as its main ingredient, and this semiconductor film may be added with an impurity element to give an n type or p type conductivity type. It is appropriate that the thickness of the first conductive film 107 is made 5 to 50 nm, preferably 10 to 30 nm.

Control of the thicknesses of the gate insulating film 106 and the first conductive film 107 as the first layer of the gate electrode is important. This is because in a first impurity addition step subsequently carried out, an impurity to give the n type is added to the semiconductor layers 104 and 105 through the gate insulating film 106 and the first conductive film 107 as the first layer of the gate electrode. Actually, in view of the thicknesses of the gate insulating film 106 and the first conductive film 107 as the first layer of the gate electrode, and the concentration of the impurity to be added, the condition of the first impurity addition step is determined. When the foregoing thickness range was adopted, it was possible to add the impurity element to the semiconductor layer. However, if the thicknesses of the gate insulating film 106 and the first conductive film 107 as the first layer of the gate electrode are varied by 10% or more of a predetermined original value, the concentration of an add impurity is reduced.

The second conductive film 108 which becomes the second layer of the gate electrode may be formed of an element selected from titanium (Ti), tantalum (Ta), tungsten (W), and molybdenum (Mo), or a compound mainly containing these elements. This is considered to reduce electric resistance of the gate electrode, and for example, Mo—W compound may be used. It is appropriate that the thickness of the second conductive film 108 is made 200 to 1000 nm, typically 400 nm (FIG. 1A).

Next, a resist mask was formed by using a well-known patterning technique, and a step of removing a part of the second conductive film 108 was carried out. Then, as shown in FIG. 1B, second layers 109 and 110 of the gate electrode were formed on the first conductive film 107. The length of the second layer of the gate electrode in a channel length direction is suitably determined according to required characteristics of a TFT, and it was made 3 μm here.

Then, a step of adding a first impurity element to give the n type was carried out. As an impurity element to give the n type to a crystalline semiconductor material, phosphorus (P), arsenic (As), antimony (Sb) and the like are known. Here, phosphorus was used and the step was carried out with an ion doping method using phosphine ($PH_3$). In this step, for the purpose of adding phosphorus through the gate insulating film 106 and the first conductive film 107 to the semiconductor layer thereunder, an acceleration voltage was set as high as 80 kev. It is preferable that the concentration of phosphorus added to the semiconductor layer is within the range of $1 \times 10^{16}$ to $5 \times 10^{19}$ atoms/$cm^3$ (typically $1 \times 10^{17}$ to $5 \times 10^{18}$ atoms/$cm^3$), and here, it was made $1 \times 10^{18}$ atoms/$cm^3$. Then, regions 111, 112, 113 and 114 where phosphorus was added into the semiconductor layer were formed. Part of the regions formed here where phosphorus was added are made second impurity regions functioning as LDD regions (FIG. 1B).

Next, a resist mask 118 was formed on a region where an n-channel TFT was to be formed. Then, a region where the first conductive film 107 was exposed was removed by etching. As a result, island-like first conductive films 121 and 122 remained in the region where the n-channel TFT was to be formed.

A step of adding a third impurity element to give a p type was carried out only in a region where a p-channel TFT was to be formed. As an impurity element to give the p type, boron (B), aluminum (Al), and gallium (Ga) are known. Here, boron was added as the impurity element by an ion doping method using diborane ($B_2H_6$). Also in this step, an acceleration voltage was made 80 keV, and boron was added at a concentration of $2 \times 10^{20}$ atoms/$cm^3$. Then, as shown in FIG. 1C, third impurity regions 119 and 120 where boron was added at a high concentration were formed (FIG. 1C).

After the resist mask 118 was completely removed, resist masks 123 and 124 were formed. The resist mask 123 is used as a mask for forming a first impurity region which becomes a source region and a drain region in the n-channel TFT. That is, by the shape of the resist mask 123, it is possible to freely set the area of the region where the first impurity region is formed in the region where the semiconductor layer 104 exists.

Here, as shown in FIG. 1C, the resist mask 123 was formed, and a step of adding a second impurity element to give the n type was carried out. A first impurity region 125 which became a source region and a first impurity region 126 which became a drain region were formed. Here, the step was carried out by an ion doping method using phosphine ($PH_3$). Also in this step, for the purpose of adding phosphorus through the gate insulating film 106 to the semiconductor layer thereunder, an acceleration voltage was set as high as 80 keV. The concentration of phosphorus in this region is high as compared with the step of adding the first impurity element to give the n type, and it is preferable that the concentration is made $1 \times 10^{20}$ to $1 \times 10^{21}$ atoms/$cm^3$ (typically, $1 \times 10^{20}$ to $5 \times 10^{20}$ atoms/$cm^3$), and here, it was made $1 \times 10^{20}$ atoms/$cm^3$.

Prior to this step, the regions where the first conductive films 121 and 122 were exposed were removed by etching using the resist mask 123. By doing so, it was possible to effectively carry out the step of adding the second impurity element to give the n type (FIG. 1D).

Further, the resist masks 123 and 124 were removed, and resist masks 130 and 131 were newly formed. In this step, the length of the resist mask 130 in the channel length direction formed in the n-channel TFT was important in determination of the structure of the TFT. The resist mask 130 is provided for the purpose of removing a part of the first conductive film 127, and by this length of the resist mask, it was possible to freely determine a region where the second impurity region overlaps with the gate electrode and a region where the second impurity region does not overlap with the gate electrode within a certain range (FIG. 1E).

Then a first layer 132 of the gate electrode was formed as shown in FIG. 1F.

Then a silicon nitride film 133 was formed on the surfaces of the gate insulating film 106, the first layer 132 of the gate electrode, and the second layers 109 and 110 of the gate electrode. Further, a first interlayer insulating film 134 was formed thereon. The silicon nitride film 133 was formed to a thickness of 50 nm, and the first interlayer insulating film 134 was formed of a silicon oxide film having a thickness of 950 nm.

The silicon nitride film 133 formed here was necessary to carry out a next step of heat treatment. This was effective in an object of preventing oxidation of the surfaces of the second layers 109 and 110 of the gate electrode.

It was necessary to carry out the step of heat treatment so that the impurity elements added at each concentration to give the n type or p type were activated. This step may be carried out by a thermal annealing method using an electric heating furnace, the foregoing laser annealing method using an excimer laser, or a rapid thermal annealing method (RTA method) using a halogen lamp. However, although the laser annealing method can make activation at a low substrate heating temperature, it has been difficult to make activation up to a region concealed under the gate electrode. Thus, here, the step of activation was carried out by the thermal annealing method. The heat treatment was carried out in a nitrogen atmosphere at 300 to 700° C., preferably 350 to 550° C., here 450° C. for 2 hours.

Thereafter, the first interlayer insulating film 134 and the silicon nitride film 133 were subjected to patterning so that contact holes reaching the source region and the drain region of each TFT were formed. Then, source electrodes 135 and 136 and a drain electrode 137 were formed. Although not shown, in this example, the respective electrodes were used as a three-layer electrode in which a Ti film having a thickness of 100 nm, an Al film containing Ti and having a thickness of 300 nm, and a Ti film having a thickness of 150 nm were continuously formed by a sputtering method.

Through the foregoing steps, a channel formation region 138, first impurity regions 140 and 141, and a second impurity region 139 were formed in the n-channel TFT of the CMOS circuit. Here, in the second impurity region, a region (GOLD region) 139*a* overlapping with the gate electrode and a region (LDD region) 139*b* not overlapping with the gate electrode were formed, respectively. The first impurity region 140 became the source region, and the first impurity region 141 became the drain region.

On the other hand, in the p-channel TFT, a channel formation region 142, and third impurity regions 143 and 144 were formed. The third impurity region 143 became the source region, and the third impurity region 144 became the drain region (FIG. 2A).

Figure 2B:
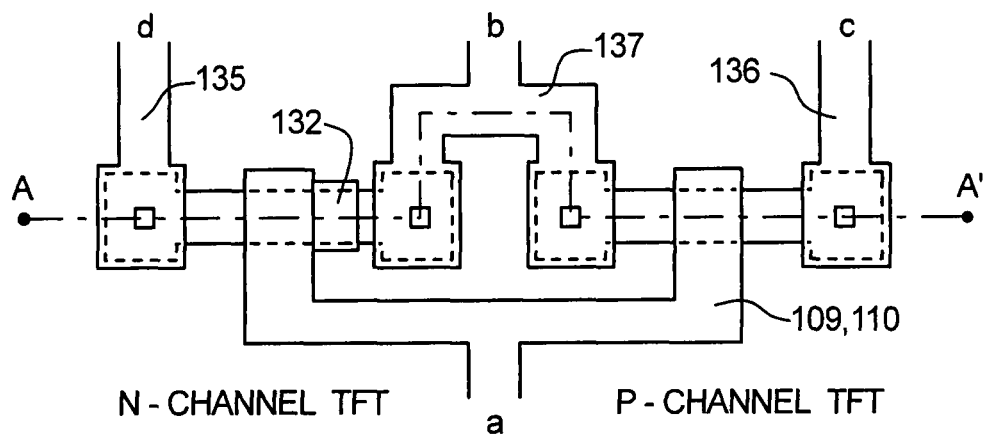
Figure 2C:
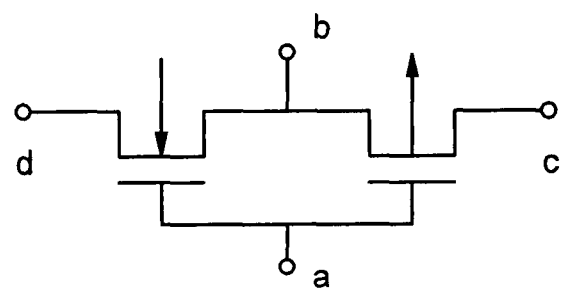

FIG. 2A is a sectional structural view of an inverter circuit, and shows an A-A' sectional structure in a top view of the inverter circuit shown in FIG. 2B. Incidentally, individual terminal portions "a", "b", and "c" in an inverter circuit diagram shown in FIG. 2C correspond to individual terminals shown in the top view of the inverter circuit.

Although FIGS. 1A to 1F and FIGS. 2A to 2C show the CMOS circuit formed by complementarily combining the n-channel TFT and the p-channel TFT as an example, the present invention can also be applied to an NMOS circuit using an n-channel TFT or a pixel portion of a liquid crystal display device.

Embodiment Mode 2

According to the present invention, as shown in FIGS. 3A and 3B, a second impurity region which becomes an LDD region can be divided into second impurity regions 305*a* and 306*a* overlapping with a first layer 302 of a gate electrode, and second impurity regions 305*b* and 306*b* not overlapping with the gate electrode. That is, LDD regions overlapping with the gate electrode and LDD, regions not overlapping with the gate electrode are formed. Distinctive formation of the regions can be easily carried out by using a mask of photoresist, and was carried out by a first impurity adding step and a second impurity adding step of forming a first impurity region.

That is, it is possible to arbitrarily set the lengths X1, X2, Y1 and Y2 of the respective LDD regions shown in FIG. 3A within a range. Here, in view of characteristics including reliability of an n-channel TFT, although the second impurity regions 306*a* and 306*b* provided at the side of a first impurity region (drain region) 308 were indispensable, the second impurity regions 305*a* and 305*b* provided at the opposite side with the intervening gate electrode were not indispensable but might be provided suitably in view of operating environment of the n-channel TFT.

This was a very useful method when circuits with different driving voltages were fabricated on the same substrate. FIG. 3C shows an example of design values of a TFT used for a logic circuit portion, a buffer circuit portion, an analog switch portion, and a pixel portion of a liquid crystal display device. At this timer in view of driving voltage of each TFT, it becomes possible to set the lengths of the second impurity regions 305*a* and 306*a* overlapping with the gate electrode and the second impurity regions 305*b* and 306*b* not overlapping with the gate electrode, not to mention a channel length.

For example, in a TFT of a logic circuit portion of a driver circuit of a liquid crystal display device or a TFT of a buffer circuit portion, since importance is basically attached to a non characteristic, the so-called GOLD structure may be adopted, and the second impurity region 306*b* not overlapping with the gate electrode is not necessarily needed to be provided. However, if the region is provided, it is appropriate that the value of X1 is set within the range of 0.1 to 4 μm, typically 0.5 to 3 μm in view of the driving voltage. In all events, in view of the withstand voltage, it is desirable that the value of the length of the second impurity region 306*b* not overlapping with the gate electrode is made large as the driving voltage becomes high. At this time, it was not necessary to dare to provide the second impurity regions 305*a* and 305*b* at the side of the first impurity region (source region) 307.

In a TFT provided in a sampling circuit or a pixel portion, since an increase of an off current might cause a trouble, in the case where the channel length was, for example, 3 μm, it was sufficient if the length of the second impurity regions 305*a* and 306*a* overlapping with the gate electrode was made 1.5 μm and that of the second impurity regions 305*b* and 306*b* not overlapping with the gate electrode was made 1.5 μm. Of course, the present invention is not limited to the design values indicated here, but the values may be suitably determined.

As described above, in the present invention, the lengths of the first layer of the gate electrode and the second layer of the gate electrode in the channel length direction had significant relation to the structure of the TFT to be fabricated. The length of the second layer of the gate electrode in the channel length was almost equal to the channel length L. At this time, it was sufficient if the length L was made a value of 0.1 to 10 μm, typically 0.2 to 5 μm.

The lengths Y1 and Y2 where the second impurity regions 305 and 306 overlap with the gate electrode have close relation to the length of the first layer 302 of the gate electrode. It is desirable that the length of Y1 and Y2 are 0.1 to 4 μm, typically 0.5 to 3 μm. Although there is also a case where it is not necessarily needed to provide the lengths X1 and X2 of the second impurity regions 305 and 306 not overlapping with the gate electrode as described above, in general, it is appropriate that the length is made 0.1 to 3 μm, typically 0.3 to 2 μm. In all events, it is appropriate to suitably determine the length in view of the operating state of the TFT.

In the n-channel TFT, the LDD regions are only the second impurity regions 306*a* and 306*b*. In the case where voltage with both polarities is applied like the n-channel TFT of the pixel portion, it is desirable to provide the regions at both of the source region side 307 and drain region side 308 with the channel formation region 304 as the center.

On the other hand, in the p-channel TFT, it is sufficient if only the channel formation region 304, the source region 307, and the drain region 308 are formed. Of course, although the same structure as the n-channel TFT of the present invention may be adopted, since the p-channel TFT has originally high reliability, it is preferable to secure an on current and to take a characteristic balance to the n-channel TFT. In the case where the present invention is applied to the CMOS circuit as shown in FIGS. 1A to 1F, it is especially important to take this characteristic balance. However, there is no problem even if the structure of the present invention is applied to the p-channel TFT.

Embodiment 1

In this embodiment, a structure of the present invention will be described with reference to FIGS. 4A to 6 and a description will be made on a method of simultaneously fabricating a pixel portion and a CMOS circuit as a basic structure of a driver circuit provided on its periphery.

Figure 4A:
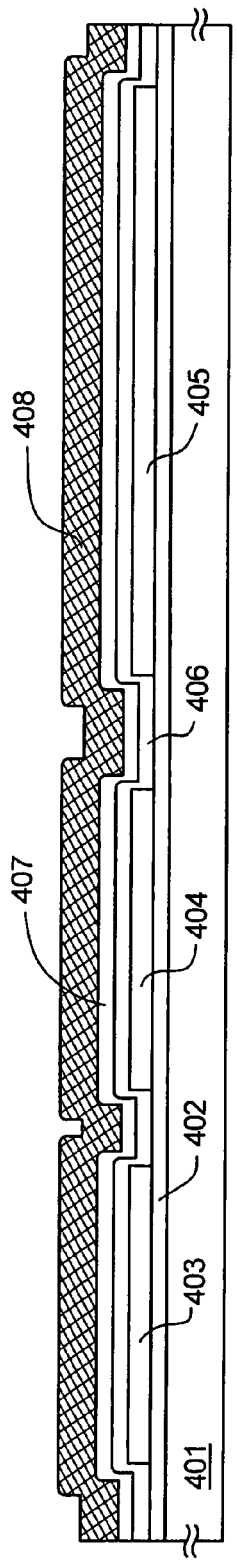
FIGS. 4A to 4C are sectional views showing fabricating steps of a TFT.
Figure 4B:
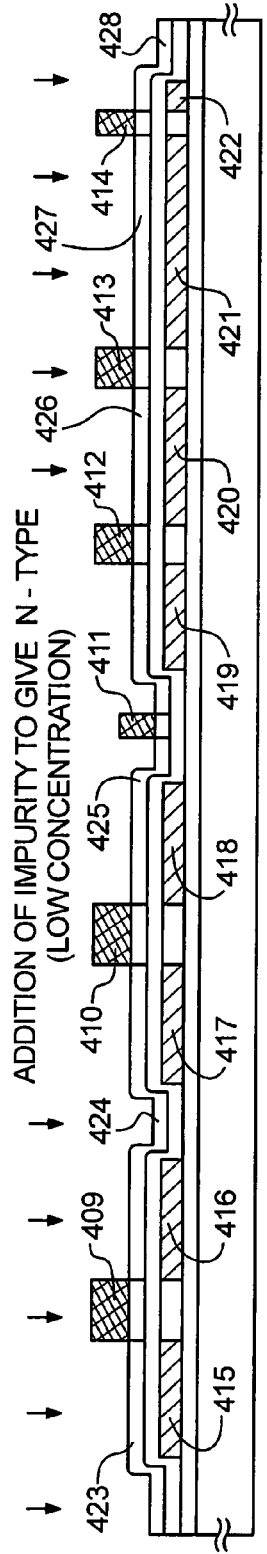
Figure 4C:
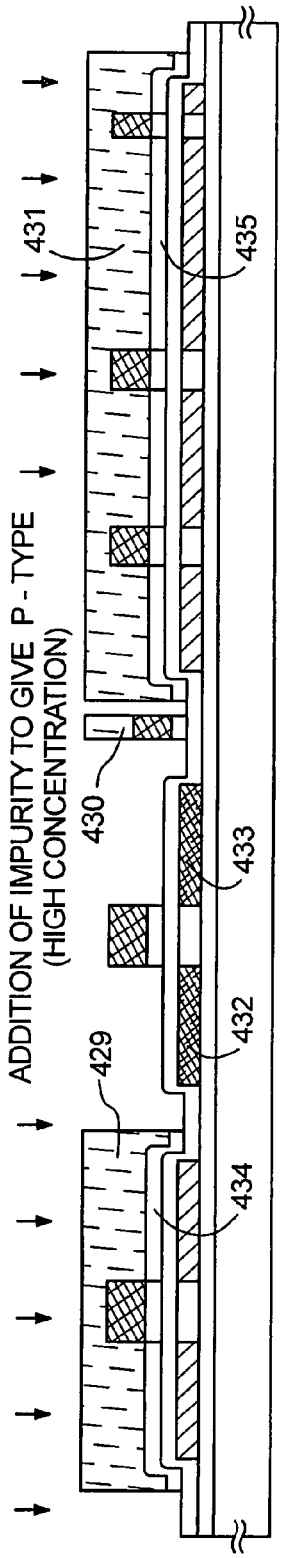

In FIGS. 4A to 4C, as a substrate 401, an alkali-free glass substrate typified by, for example, a substrate of 1737 glass made by Corning Inc. was used. An under film 402 was formed on the surface of the substrate 401 on which TFTs were to be formed. As the under film 402, although not shown, a silicon nitride film having a thickness of 25 to 100 nm, here, 50 nm, and a silicon oxide film having a thickness of 50 to 300 nm, here, 150 nm were formed. The under film 402 may be formed using only a silicon nitride film or a silicon nitride oxide film.

The under film 402 may be formed of one layer of the above material or a laminate structure of not less than, or equal to two layers. In all events, the film is formed to a thickness of about 100 to 300 nm. For example, the under film 402 may be formed of such a two-layer structure that a first silicon nitride oxide film having a thickness of 10 to 100 nm is fabricated by a plasma CVD method from $SiH_4$, $NH_3$ and $N_2O$, and a second silicon nitride oxide film fabricated from $SiH_4$ and $N_2O$ and having a thickness of 100 to 200 nm is laminated thereon.

Next, an amorphous silicon film having a thickness of 50 nm was formed on the under film 402 by a plasma CVD method. It is desirable that in accordance with the hydrogen content, the amorphous silicon film is preferably heated at 400 to 550° C. for several hours to carry out a dehydrogenating process so that the hydrogen content is made 5 atom % or less, and then, a step of crystallization is carried out. Although the amorphous silicon film may be formed by another fabricating method such as a sputtering method or an evaporation method, it is desirable that impurity elements such as oxygen and nitrogen contained in the film are sufficiently decreased in advance.

Here, both the under film and the amorphous silicon film are fabricated by the plasma CVD method, and at this time, the under film and the amorphous silicon film may be continuously formed in vacuum. By making such a step that the under film was not exposed to the air after it was formed, it became possible to prevent pollution of the surface and it was possible to reduce fluctuation in characteristics of TFTs fabricated.

As a step of crystallizing the amorphous silicon film, a well-known laser crystallizing technique or a thermal crystallizing technique may be used. In this embodiment, a pulse oscillation type KrF excimer laser beam was linearly condensed and was irradiated to the amorphous silicon film to form a crystalline silicon film.

In this embodiment, as the semiconductor layer, although the crystalline silicon film is formed from the amorphous silicon film, a microcrystal silicon film may be used, or a crystalline silicon film may be directly formed.

The thus formed crystalline silicon film was patterned to form island-like semiconductor layers 403, 404 and 405.

Next, a gate insulating film 406 containing silicon oxide or silicon nitride as its main ingredient was formed to cover the island-like semiconductor layers 403, 404 and 405. As the gate insulating film 406, a silicon nitride oxide film having a thickness of 10 to 200 nm, preferably 50 to 150 nm may be formed by a plasma CVD method using $N_2O$ and $SiH_4$ as a raw material. Here, the film was formed to a thickness of 100 nm.

Then, a first conductive film 407 which became a first layer of a gate electrode and a second conductive film 408 which became a second layer of the gate electrode were formed on the surface of the gate insulating film 406. The first conductive film 407 may be formed of a semiconductor film containing an element selected from Si and Ge, or containing the element as its main ingredient. It is necessary that the thickness of the first conductive film 407 is made 5 to 500 nm, preferably 10 to 30 nm. Here, a Si film having a thickness of 20 nm was formed.

An impurity element to give the n type or p type conductivity type may be added to these semiconductor film used as the first conductive film. A method of fabricating this semiconductor film may be carried out in accordance with a well-known method. For example, the film can be fabricated by a low pressure CVD method under the condition that the substrate temperature is made 450 to 500° C., and disilane ($Si_2H_6$) of 250 SCCM and helium (He) of 300 SCCM are introduced. At the same time, an n-type semiconductor film may be formed by mixing $PH_3$ of 0.1 to 2% to $Si_2H_6$.

The second conductive film which becomes the second layer of the gate electrode may be formed of an element selected from Ti, Ta, W and Mo, or a compound containing the foregoing element as its main ingredient. This is considered to decrease electric resistance of the gate electrode, and for example, a Mo—W compound may be used. Here, Ta was used and the film was formed to a thickness of 200 to 1000 nm, typically 400 nm by a sputtering method (FIG. 4A).

In the case where the Ta film is used, the film can be similarly formed by a sputtering method. For the Ta film, Ar is used as a sputtering gas. If a suitable amount of Xe or Kr is added to the sputtering gas, it is possible to relieve inner stress of a formed film and to prevent peeling of the film. Although the Ta film with a phase α has a resistivity of about 20 μΩcm and can be used for a gate electrode, the Ta film with a phase β has a resistivity of about 180 μΩcm and is unsuitable for a gate electrode. However, since a TaN film has a crystal structure close to the phase α, if the Ta film is formed thereon, the Ta film with the phase α can be easily obtained. Thus, the TaN film having a thickness of 10 to 50 nm may be formed prior to formation of the Ta film. It is preferable that the resistivity of the Ta film is made a value within the range of 10 to 50 μΩcm.

In addition, a W film can also be used, and in that case, the W film having a thickness of 200 nm is formed by a sputtering method in which W is used as a target, and argon (Ar) gas and nitrogen ($N_2$) gas are introduced. It is also possible to form the W film by a thermal CVD method using tungsten hexafluoride ($WF_6$). In all events, it is necessary to decrease the resistance in order to use the film as a gate electrode, and it is desirable that the resistivity of the W film is made 20 μΩcm or less. Although the resistivity of the W film can be decreased by enlarging crystal grains, in the case where a lot of impurity elements such as oxygen are contained in the W film, crystallization is obstructed and the resistance is increased. From this, in the case of the sputtering method, a W target with a purity of 99.9999% is used, and further, the W film is formed while careful attention is paid to prevent mixture of an impurity from a vapor phase at the film formation, so that a resistivity of 9 to 20 μΩcm can be realized.

Next, a resist mask was formed by using a well-known patterning technique, and a step of forming the second layer of the gate electrode was carried out by etching the second conductive film 408. Since the second conductive film was formed of the Ta film, the step was carried out by a dry etching method. As the condition of the dry etching, $Cl_2$ of 80 SCCM was introduced and high frequency electric power of 500 W was applied. Then, as shown in FIG. 4B, second layers 409, 410, 412 and 413 of the gate electrodes and a wiring line 411 were formed. The lengths of the second layers of the gate electrodes in the channel length direction were made such that the length of each of the second layers 409 and 410 of the gate electrodes forming the CMOS circuit was made 3 μm. The pixel portion has a multi gate structure and the length of each of the second layers 412 and 413 of the gate electrode was made 2 μm.

Although a slight residual was observed after etching, it was possible to remove the residual by washing with a solution such as an SPX washing solution or an EKC.

Besides, it was also possible to remove the second conductive film 408 by a wet etching method. For example, in the case of Ta, it was possible to easily remove the film by a hydrofluoric acid based etching solution.

Besides, such a structure is adopted that holding capacitance is provided at a drain side of the pixel TFT. At this time, a wiring electrode 414 of the holding capacitance is formed of the same material as the second conductive film.

Then, a step of adding a first impurity element to give the n type was carried out. This step was a step of forming the second impurity region. Here, the step was carried out by an ion doping method using phosphine ($PH_3$). In this step, for the purpose of adding phosphorus through the gate insulating film 406 and the first conductive layer 407 to the semiconductor layer under the films, an acceleration voltage was set as high as 80 KeV. It is preferable that a concentration of phosphorus added into the semiconductor layer is made a value within the range of $1\times10^{16}$ to $5\times10^{19}$ atoms/cm$^3$ (typically, $1\times10^{17}$ to $5\times10^{18}$ atoms/cm$^3$), and here, it was made $1\times10^{18}$ atoms/cm$^3$. Then, regions 415, 416, 417, 418, 419, 420, 421 and 422 where phosphorus was added in the semiconductor layer were formed.

At this time, phosphorus was added also in a region of the first conductive film 407 which did not overlap with the second layers 409, 410, 412 and 413 of the gate electrodes. Although the concentration of phosphorus in this region was not particularly regulated, an effect of decreasing the resistivity of the first conductive film was obtained.

Next, the region where the n-channel TFT was to be formed was covered with resist masks 429 and 431 and the region where the wiring line was to be formed was covered with a resist mask 430, and a step of removing a part of the first conductive film 407 was carried out. Here, the step was carried out by a dry etching method. The first conductive film 407 was made of Si, and the condition of the dry etching was such that $CF_4$ of 50 SCCM and $O_2$ of 45 SCCM were introduced and high frequency electric power of 200 W was applied at a pressure of 50 mTorr. As a result, first conductive films 434, 423 and 435 remained.

Then, a step of adding a third impurity element to give the p type was carried out for the region where the p-channel TFT was to be formed. Here, the element was added by an ion doping method using diborane ($B_2H_6$). Also in this step, the acceleration voltage was made 80 keV, and boron was added at a concentration of $2\times10^{20}$ atoms/cm$^3$. As shown in FIG. 4C, third impurity regions 432 and 433 where boron was added at a high concentration were formed (FIG. 4C).

Further, the resist masks 429, 430 and 431 were completely removed, and resist masks 436, 437, 438, 439, 440 and 441 were again formed. Then, the first conductive film was etched by using the resist masks 436, 439, 440 and 441, so that first conductive films 442, 443, 444 and 445 were newly formed.

The resist mask 436 was formed to a length of 9 μm, and the resist masks 439 and 440 were formed to a length of 7 μm. As a result, phosphorus was added in the step of adding the first impurity to give the n type and the regions covered with the resist masks 436, 439 and 440 were defined as second impurity regions in this step.

Then, a step of adding a second impurity to give the n type was carried out. Here, the step was carried out by an ion doping method using phosphine ($PH_3$). Also in this step, for the purpose of adding phosphorus through the gate insulating film 306 to the semiconductor layer under the film, the acceleration voltage was set as high as 80 keV. Then, regions 446, 447, 448, 449 and 450 where phosphorus was added were formed. The concentration of phosphorus in this region is high as compared with the step of adding the first impurity to give the n type, and it is preferable that the concentration is made $1\times10^{20}$ to $1\times10^{21}$ atoms/cm$^3$, and here, it was made $1\times10^{20}$ atoms/cm$^3$ (FIG. 5A).

Further, the resist masks 436, 437, 438, 439, 440 and 441 were removed, and resist masks 451, 452, 453, 454, 455 and 456 were newly formed. In this step, the lengths of the resist masks 451, 454 and 455 formed in the n-channel TFTs in the channel length direction were important in determination of the structure of the TETs. The resist masks 451, 454 and 455 were provided for the purpose of removing part of the first conductive films 442, 443 and 444, and by the length of the resist mask, it was possible to freely determine a region where the second impurity region overlapped with the gate electrode and a region where the second impurity region did not overlap with the gate electrode.

Then, as shown in FIG. 5C, first layers 457, 458, 459 and 460 of the gate electrode were formed. Here, the length of the first layer 457 of the gate electrode in the channel length direction was made 6 μm, and the length of the first layers 458 and 459 of the gate electrode was made 4 μm.

Besides, an electrode 460 of a holding capacitance portion was formed in the pixel portion.

After the steps up to FIG. 5C were completed, a step of forming a silicon nitride film 461 and a first interlayer insulating film 462 was carried out. First, the silicon nitride film 461 was formed to a thickness of 50 nm. The silicon nitride film 461 was formed by a plasma CVD method under the condition that $SiH_4$ of 5 SCCM, $NH_3$ of 40 SCCM, and $N_2$ of 100 SCCM were introduced, the pressure was made 0.7 Torr, and a high frequency electric power of 300 W was applied. Subsequently, as the first interlayer insulating film 462, a silicon oxide film having a thickness of 950 nm was formed under the condition that TEOS of 500 SCCM and 2 of 50 SCCM were introduced, the pressure was made 1 Torr, and a high frequency electric power of 200 W was applied.

Then, a step of heat treatment was carried out. It was necessary to carry out the step of heat treatment to activate the impurity element added at each concentration to give the n type or p type. This step may be carried out by a thermal annealing method using an electric heating furnace, the foregoing laser annealing method using an excimer laser, or a rapid thermal annealing method (RTA method) using a halogen lamp. Here, the step of activation was carried out by the thermal annealing method. The heat treatment was carried out in a nitrogen atmosphere at 300 to 700° C., preferably 350 to 550° C., here, 450° C. for 2 hours.

Then, the first interlayer insulating film 462 and the silicon nitride film 461 were patterned so that contact holes reaching a source region and a drain region of each TFT were formed. Then, source electrodes 463, 464 and 465 and drain electrodes 467 and 468 were formed. Although not shown, in this embodiment, the respective electrodes were formed as a three-layer electrode in which a Ti film having a thickness of 100 nm, an Al film containing Ti and having a thickness of 300 nm, and a Ti film having a thickness of 150 nm were continuously formed by a sputtering method.

Then, a passivation film 469 was formed to cover the source electrodes 463, 464 and 465, the drain electrodes 467 and 468, and the first interlayer insulating film 462. The passivation film 469 was formed of a silicon nitride film with a thickness of 50 nm. Further, a second interlayer insulating film 470 made of an organic resin was formed to a thickness of about 1000 nm. As the organic resin, polyimide, acryl, polyimidoamide, etc. may be used. As advantages obtained by using the organic resin film, it is possible to enumerate such points that a film formation method is simple, parasitic capacitance can be reduced since its relative dielectric constant is low, and flatness is superior. An organic resin film other than the above maybe used. Here, polyimide of such a type that thermal polymerization was made after application to the substrate was used, and was fired at 300° C. to form the film.

Through the foregoing steps, a channel formation region 471, first impurity regions 474 and 475, and second impurity regions 472 and 473 were formed in the n-channel TFT of the CMOS circuit. Here, in the second impurity regions, regions (GOLD regions) 472a and 473a overlapping with a gate electrode were formed to a thickness of 1.5 μm, and regions (LDD regions) 472b and 473b not overlapping with the gate electrode were formed to a thickness of 1.5 μm, respectively. The first impurity region 474 became a source region and the first impurity region 475 became a drain region.

In the p-channel TFT, the gate electrode of a clad structure was similarly formed, and a channel formation region 476, and third impurity regions 477 and 478 were formed. The third impurity region 477 became a source region and the third impurity region 478 became a drain region.

The n-channel TFT of the pixel portion has a multi gate structure, and channel formation regions 479 and 484, first impurity regions 482, 483 and 487, and second impurity regions 480, 481, 485 and 486 were formed. Here, in the second impurity regions, regions 480a, 481a, 485a and 486a overlapping with the gate electrode, and regions 480b, 481b, 485b and 486b not overlapping with the gate electrode were formed.

Figure 6:
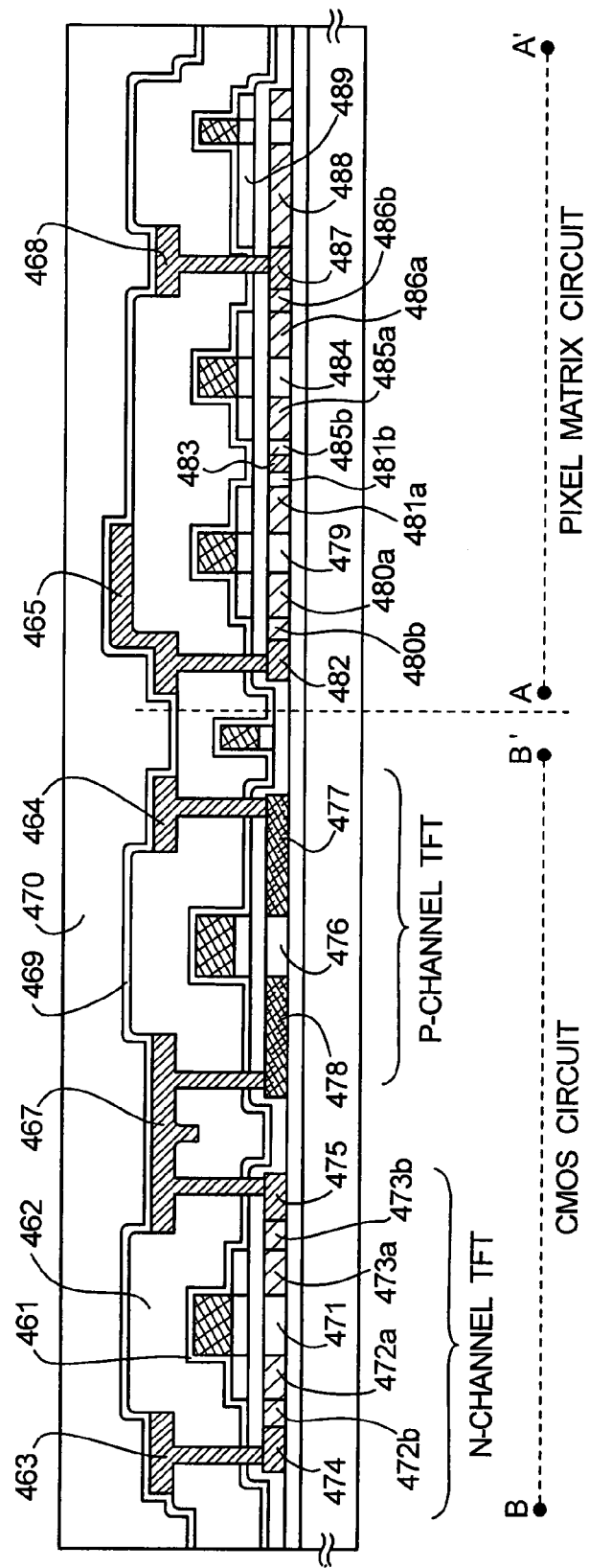
FIG. 6 is a sectional view of an active matrix substrate.

In this way, as shown in FIG. 6, an active matrix substrate in which the CMOS circuit and the pixel portion were formed on the substrate 401 was fabricated. At the same time, the holding capacitance portion was formed at the drain side of the n-channel TFT of the pixel portion.

Embodiment 2

In this embodiment, with reference to FIGS. 7A and 7B, a description will be made on an example in which after the state shown in FIG. 5A is obtained through the same steps as the embodiment 1, a part of a first layer of a gate electrode is removed by another method.

Figure 7:
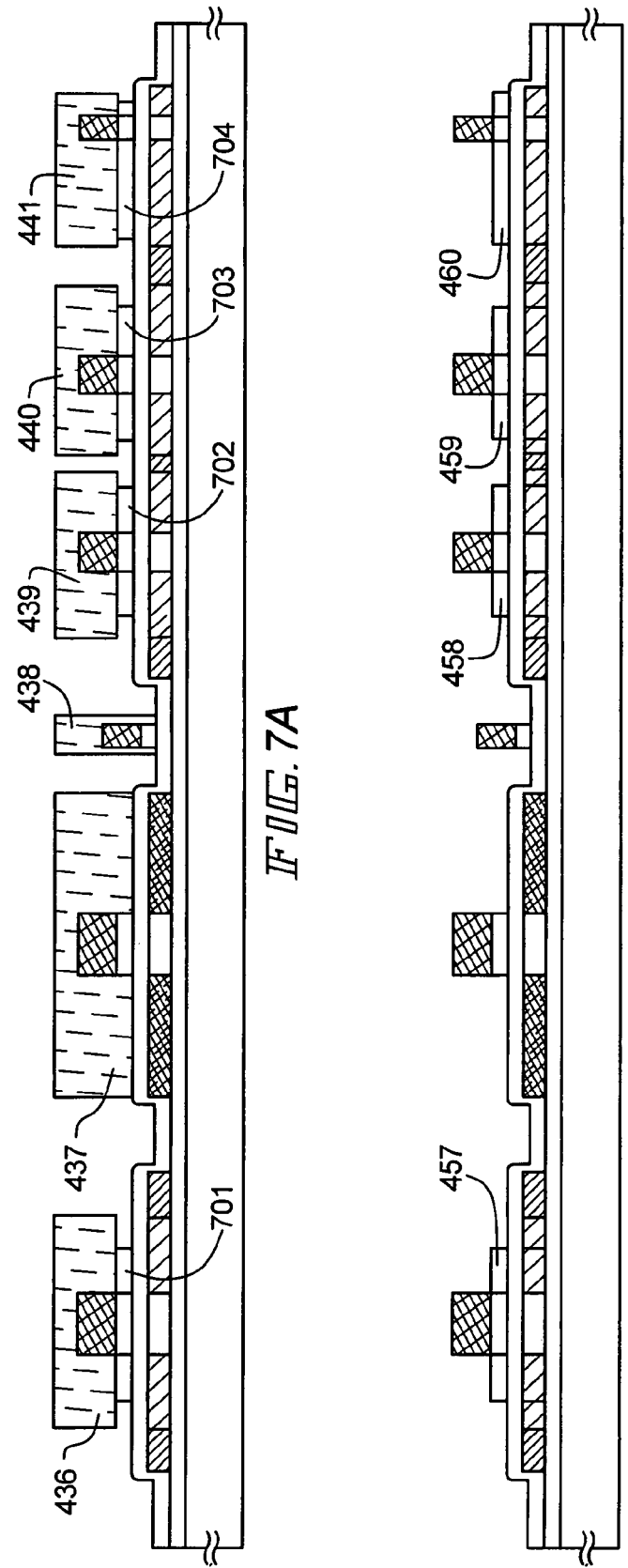
FIGS. 7A and 7B are sectional views showing fabricating steps of a TFT.

First, part of first gate conductive films 442, 443 and 444 were removed as shown in FIG. 7A by etching while resist masks 436, 437, 438, 439, 440 and 441 formed in FIG. 5A were used as they were.

In the case where the first layer of the gate electrode was a silicon film, it was possible to carry out the step of etching here by a dry etching method under the condition that $SF_6$ of 40 SCCM and $O_2$ Of 10 SCCM were introduced, the pressure was made 100 mTorr, and a high frequency electric power of 200 W was applied.

Under the condition of the dry etching, a selecting ratio to the gate insulating film as an under film was high, so that the gate insulating film 406 was hardly etched.

Here, the resist mask 436 was formed to a length of 9 μm in the channel length direction of the TFT, and the resist masks 439 and 440 were formed to a length of 7 μm. Here, the first conductive film was etched by every 1.5 μm through the dry etching, so that first layers 457, 458, 459, and 460 were formed.

Subsequent steps may comply with the embodiment 1, and as shown in FIG. 6, a silicon nitride film 461, a first interlayer insulating film 462, source electrodes 463, 464 and 465, drain electrodes 467 and 468, a passivation film 469, and a second interlayer insulating film 470 were formed, so that an active matrix substrate shown in FIG. 6 was formed.

Embodiment 3

Figure 8:
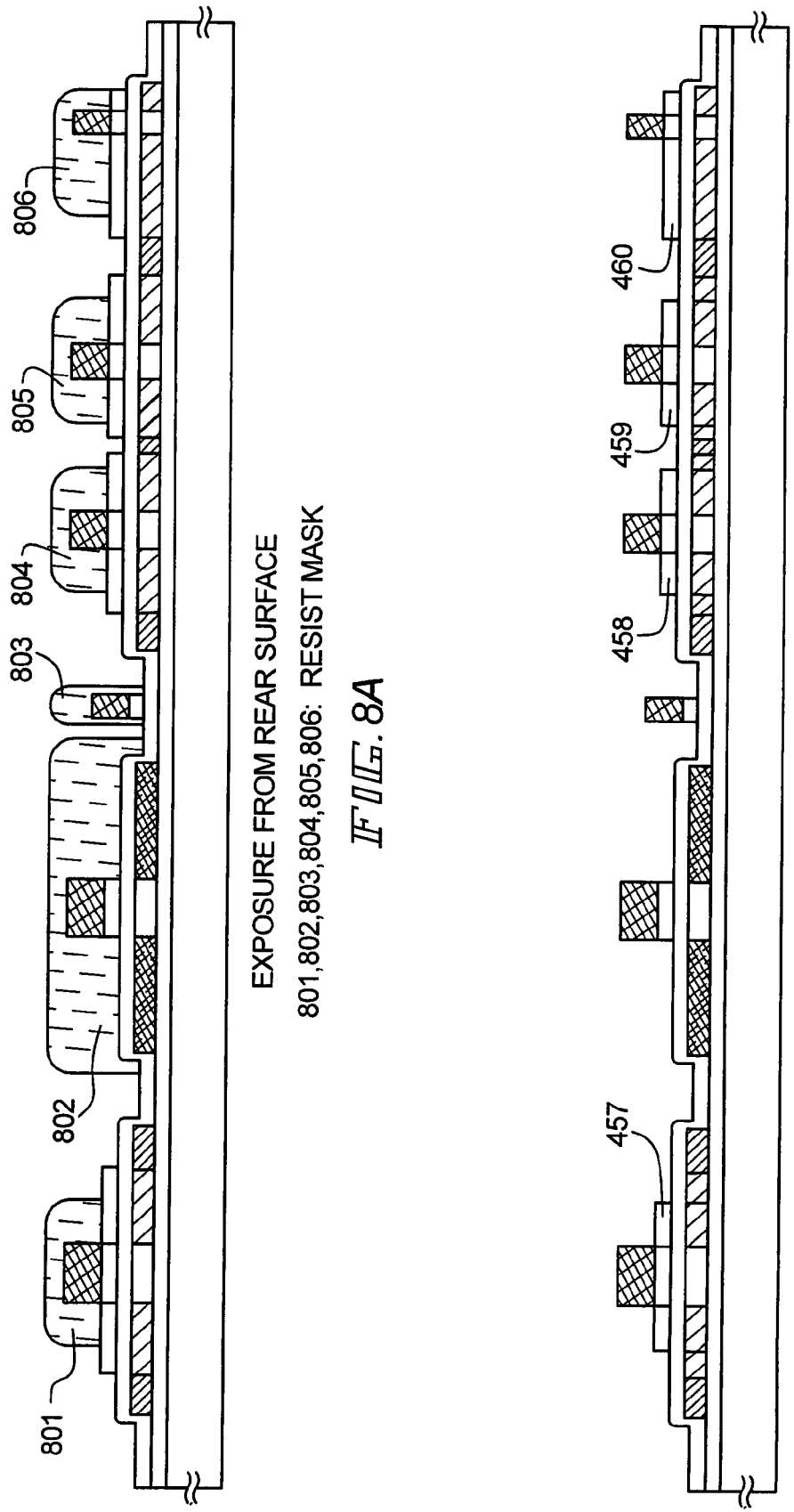
FIGS. 8A and 8B are sectional views showing fabricating steps of a TFT.

In this embodiment, with reference to FIGS. 8A and 8B, a description will be made on an example in which after the state shown in FIG. 5A is obtained through the same steps as the embodiment 1, a part of a first layer of a gate electrode is removed by another method.

First, resist masks 436, 437, 438, 439, 440 and 441 formed in FIG. 5A were completely removed, a photoresist mask was again formed, and a step of patterning by exposure from a rear surface was carried out. At this time, as shown in FIG. 8A, gate electrodes became masks, so that resist masks 801, 802, 803, 804, 805 and 806 were formed in a self-aligning manner. The exposure from the rear surface is carried out using direct light and scattered light, and by adjusting exposure conditions such as light intensity or exposure time, as shown in FIG. 5A, it was possible to form the resist masks inside and on the gate electrodes.

It is to be noted that the resist masks 802 and 803 are used to protect the gate electrode 410 and the wiring 411 and are not always necessary. A person who carries out the invention may provide the resist masks 802 and 803 on his or her own judgment.

Then, regions of first layers of the gate electrodes which were not masked were removed by a dry etching method. The condition of the dry etching was the same as the embodiment 1. After the etching was ended, the resist masks 801, 802, 803, 804 and 805 were removed.

Subsequent steps may comply with the embodiment 1, and as shown in FIG. 6, a silicon nitride film 461, a first interlayer insulating film 462, source electrodes 463, 464 and 465, drain electrodes 467 and 468, a passivation film 469, and a second interlayer insulating film 470 were formed, so that an active matrix substrate shown in FIG. 6 was formed.

Embodiment 4

In this embodiment, a description will be made on an example in which a crystalline semiconductor film used as a semiconductor layer in the embodiment 1 is formed by a thermal crystallizing method using a catalytic element. In the case where the catalytic element is used, it is desirable to use a technique disclosed in Japanese Patent Application Laid-open No. Hei. 7-130652 or No. Hei. 8-78329.

Figure 12A:
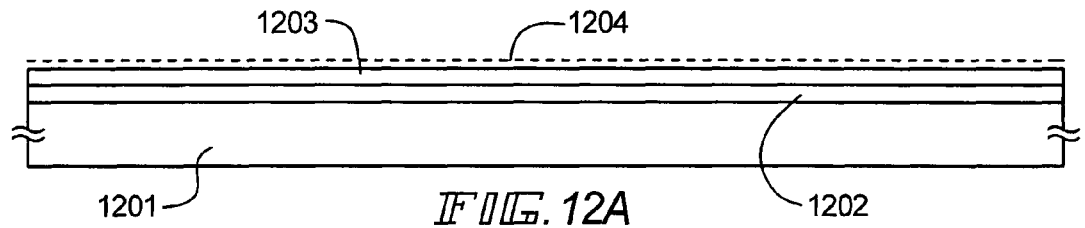
FIGS. 12A and 12B are views showing fabricating steps of a crystalline silicon film.
Figure 12B:
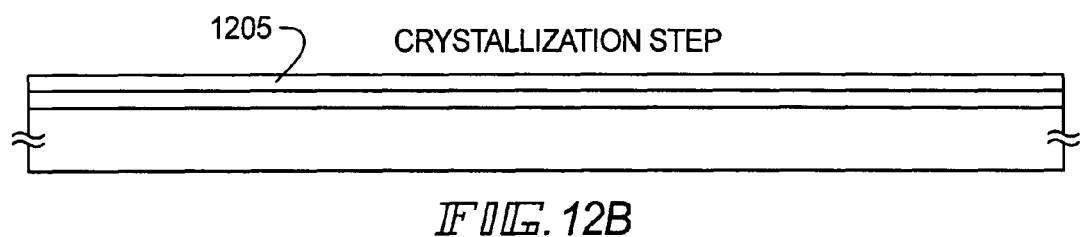

Here, an example of a case where the technique disclosed in Japanese Patent Application Laid-open No. Hei. 7-130652 is applied to the present invention will be described with reference to FIGS. 12A and 12B. First, a silicon oxide film 1202 was formed on a substrate 1201 and an amorphous silicon film 1203 was formed thereon. Further, a nickel acetate salt solution containing nickel of 10 ppm in terms of weight was applied to form a nickel containing layer 1204 (FIG. 12A).

Next, after a dehydrogenating step at 500° C. for 1 hour was carried out, a heat treatment at 500 to 650° C. for 4 to 12 hours, for example, at 550° C. for 8 hours was carried out, so that a crystalline silicon film 1205 was formed. The crystalline silicon film 1205 obtained in this way had extremely superior crystallinity (FIG. 12B).

The technique disclosed in Japanese Patent Application Laid-open No. Hei. 8-78329 is such that selective crystallization of an amorphous semiconductor film is made possible by selectively adding a catalytic element. A case where the technique is applied to the present invention will be described with reference to FIGS. 13A and 13B.

First, a silicon oxide film 1302 was formed on a glass substrate 1301, and an amorphous silicon film 1303 and a silicon oxide film 1304 were continuously formed thereon. At this time, the thickness of the silicon oxide film 1304 was made 150 nm.

Figure 13A:
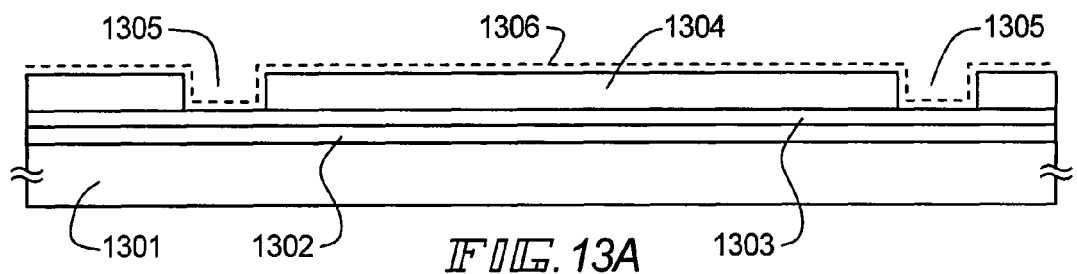
FIGS. 13A and 13B are views showing fabricating steps of a crystalline silicon film.

Next, the silicon oxide film 1304 was patterned to selectively form opening portions 1305. Thereafter, a nickel acetate salt solution containing nickel of 10 ppm in terms of weight was applied. By this, a nickel containing layer 1306 was formed, and the nickel containing layer 1306 was brought into contact with the amorphous silicon film 1302 at only the bottoms of the opening portions 1305 (FIG. 13A).

Figure 13B:
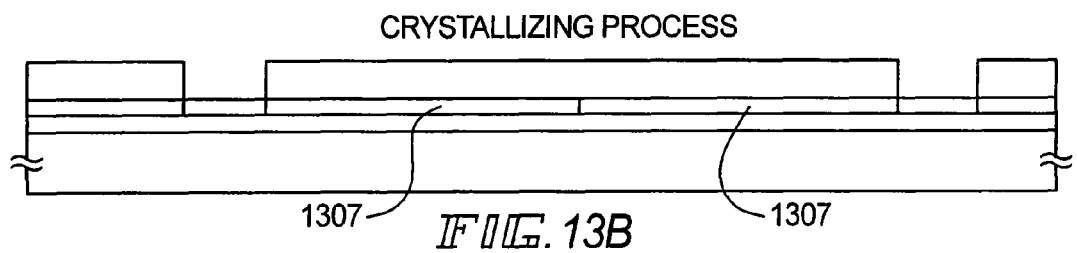

Next, a heat treatment at 500 to 650° C. for 4 to 24 hours, for example, at 570° C. for 14 hours was carried out, so that a crystalline silicon film 1307 was formed. In this crystallizing process, a portion with which nickel is in contact is first crystallized, and crystal growth progresses in the lateral direction therefrom. The thus formed crystalline silicon film 1307 is made of a collective of rod-like or needle-like crystals, and each crystal macroscopically grows with certain directionality. Thus, there is an advantage that crystallinity is uniform (FIG. 13B).

As a catalytic element usable in the foregoing two techniques, in addition to nickel (Ni), an element such as germanium (Ge), iron (Fe), palladium (Pd), tin (Sn), lead (Pb), cobalt (Co), platinum (Pt), copper (Cu) or gold (Au) may be used.

If a crystalline semiconductor film (including a crystalline silicon film, a crystalline silicon germanium film, etc.) is formed by using the technique as described above and patterning is carried out, a semiconductor layer of a crystalline TFT can be formed. Although superior characteristics can be obtained in the TFT fabricated from the crystalline semiconductor film by using the technique of this embodiment, high reliability has been required because of that. However, when the TFT structure of the present invention is adopted, it becomes possible to fabricate the TFT which utilizes the technique of this embodiment to the utmost.

Embodiment 5

In this embodiment, a description will be made on an example in which as a method of forming a semiconductor layer used in the embodiment 1, after a crystalline semiconductor film is formed using an amorphous semiconductor film as an initial film and using a catalytic element, a step of removing the catalytic element from the crystalline semiconductor film is carried out. As a method thereof, this embodiment uses a technique disclosed in Japanese Patent Application Laid-open No. Hei. 10-247735, No. Hei. 10-135468 or No. Hei. 10-135469.

The technique disclosed in the publications is such that a catalytic element used for crystallization of an amorphous semiconductor film is removed after crystallization by using a gettering function of phosphorus. By using the technique, it is possible to reduce the concentration of a catalytic element in a crystalline semiconductor film to $1\times10^{17}$ atoms/cm³ or less, preferably $1\times10^{16}$ atms/cm³.

Figure 14A:
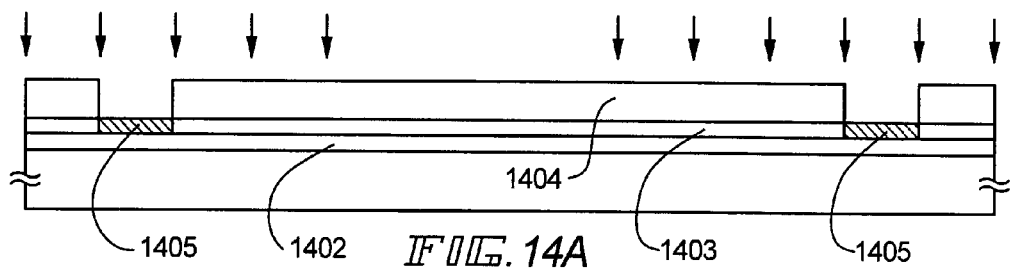
FIGS. 14A and 14B are views showing fabricating steps of a crystalline silicon film.
Figure 14B:
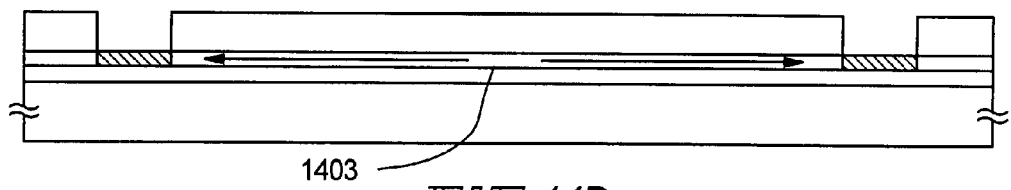

The structure of this embodiment will be described with reference to FIGS. 14A and 14B. Here, an alkali-free glass substrate typified by a substrate of 1737 glass made by Corning Inc. was used. FIG. 14A shows a state in which an under film 1402 and a crystalline silicon film 1403 were formed by using the technique disclosed in the embodiment 4. Then, a silicon oxide film 1404 for masking was formed to a thickness of 150 nm on the surface of the crystalline silicon film 1403, and opening portions were provided by patterning, so that regions where the crystalline silicon film was exposed were provided. Then, a step of adding phosphorus was carried out so that regions 1405 added with phosphorus in the crystalline silicon film were provided.

In this state, when a heat treatment at 550 to 800° C. for 5 to 24 hours, for example, at 600° C. for 12 hours was carried out in a nitrogen atmosphere, the regions 1405 where phosphorus was added in the crystalline silicon film functioned as gettering sites, so that it was possible to segregate the catalytic element remaining in the crystalline silicon film 1403 into the regions 1405 added with phosphorus.

Then, by carrying out etching to remove the silicon oxide film 1404 for masking and the regions 1405 added with phosphorus, it was possible to obtain a crystalline silicon film in which the concentration of the catalytic element used in the step of crystallization was reduced to $1\times10^{17}$ atoms/cm³ or less. It was possible to use this crystalline silicon film without any change as the semiconductor layer of the TFT of the present invention described in the embodiment 1.

Embodiment 6

In this embodiment, a description will be made on another example in which a semiconductor layer and a gate insulating film are formed in the steps of fabricating a TFT of the present invention described in the embodiment 1. The structure of this embodiment will be described with reference to FIGS. 15A and 15B.

Figure 15A:
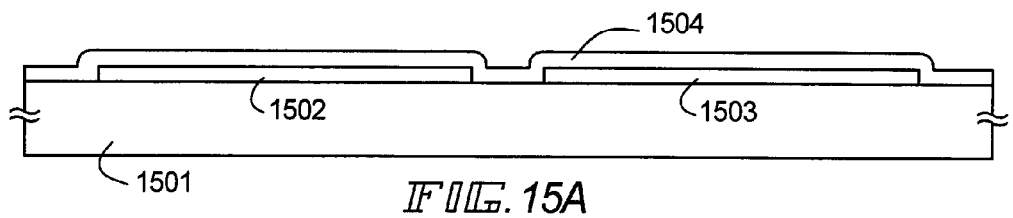
FIGS. 15A and 15B are views showing fabricating steps of a crystalline silicon film.

Here, a substrate having heat resistance of at least about 700 to 1100° C. was necessary and a quartz substrate 1501 was used. The technique disclosed in the embodiment 4 and the embodiment 5 was used to form a crystalline semiconductor. For the purpose of making this a semiconductor layer of a TFT, this was patterned into island-like regions so that semiconductor layers 1502 and 1503 were formed. A gate insulating film 1204 covering the semiconductor layers 1502 and 1503 was formed of a film containing silicon oxide as its main ingredient. In this embodiment, a silicon nitride oxide film having a thickness of 70 nm was formed by a plasma CVD method (FIG. 15A).

Figure 15B:
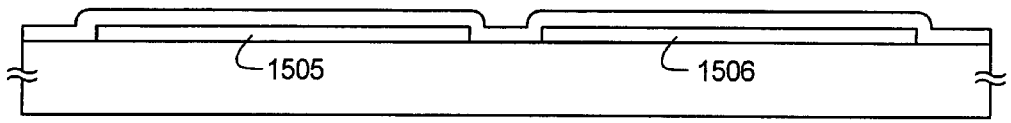

Then, a heat treatment was carried out in an atmosphere containing a halogen (typically, chlorine) and oxygen. In this embodiment, the heat treatment was carried out at 950° C. for 30 minutes. Incidentally, it was appropriate that the processing temperature was selected within the range of 700 to 1100° C. and the treatment time was selected within the range of 10 minutes to 8 hours (FIG. 15B).

As a result, under the condition of this embodiment, thermal oxidation films were formed between the semiconductor layers 1502 and 1503, and the gate insulating film 1504, so that gate insulating films 1507 were formed. Moreover, in the process of oxidation in the halogen atmosphere, an impurity contained in the gate insulating film 1504 and the semiconductor layers 1502 and 1503, especially a metal impurity element was combined with the halogen to form a compound, so that it was possible to remove the impurity element into the vapor phase.

The gate insulating films 1507 fabricated through the above steps had a high withstand voltage, and the interfaces between the semiconductor layers 1505, 1506 and the gate insulating films 1507 were very excellent. In order to obtain the structure of the TFT of the present invention, it was sufficient if the subsequent steps were carried out in accordance with the embodiment 1.

Embodiment 7

In this embodiment, a description will be made on an example in which in a method of fabricating an active matrix substrate through steps described in the embodiment 1 after forming a crystalline semiconductor film by a method described in the embodiment 4, a catalytic element used in a step of crystallization is removed by gettering. First, in the embodiment 1, the semiconductor layers 403, 404 and 405 shown in FIG. 4A were crystalline silicon films fabricated by using a catalytic element. At this time, since the catalytic element used in the step of crystallization remained in the semiconductor layers, it was desirable to carry out a step of gettering.

Here, the process up to the step shown in FIG. 4C was carried out as it was. Then, the resist masks 429, 430 and 431 were removed. As shown in FIG. 16A, new resist masks 1601, 1602, 1603, 1604, 1605 and 1606 were formed. Then, a step of adding a second impurity to give the n type was carried out. Regions 1611, 1612, 1613, 1614, 1615, 1616 and 1617 added with phosphorus in the semiconductor layer were formed.

Although boron of an impurity element to give the p type was already added into the regions 1613 and 1614 where phosphorus was added, since the concentration of phosphorus was $1\times10^{20}$ to $1\times10^{21}$ atoms/cm$^3$ and phosphorus was added at a concentration of about one half of the concentration of boron, it did not have any influence on characteristics of the p-channel TFT.

In this state, a heat treatment at 400 to 800° C. for 1 to 24 hours, for example, at 600° C. for 12 hours was carried out in a nitrogen atmosphere. By this step, it was possible to activate the added impurity elements to give the n type and p type. Further, the regions added with phosphorus became gettering sites, so that it was possible to segregate the catalytic element remaining after the crystallizing step. As a result, it was possible to remove the catalytic element from channel formation regions (FIG. 16B).

After the step of FIG. 16B was ended, by carrying out subsequent steps in accordance with the steps of the embodiment 1 to form the state of FIG. 6, it was possible to fabricate an active matrix substrate.

Embodiment 8

In this embodiment, a description will be made on steps of fabricating an active matrix type liquid crystal display device from an active matrix substrate fabricated in the embodiment 1.

A light-shielding film 1101 and a third interlayer insulating film 1102 as shown in FIG. 1A were formed to an active matrix substrate in the state of FIG. 6. It is appropriate that the light-shielding film 1101 is made of an organic resin film containing pigment or a metal film of Ti, Cr or the like. The third interlayer insulating film 1102 was formed of an organic resin film of polyimide or the like. A contact hole reaching a drain electrode 468 was formed in the third interlayer insulating film 1102, a second interlayer insulating film 440, and a passivation film 469, and a pixel electrode 1103 was formed. As the pixel electrode 1103, it is appropriate that a transparent conductive film is used in the case where a transmission type liquid crystal display device is formed, and a metal film is used in the case where a reflection type liquid crystal display device is formed. Here, for the purpose of making the transmission type liquid crystal display device, an indium-tin oxide (ITO) film having a thickness of 100 nm was formed by a sputtering method, so that the pixel electrode 1103 was formed.

An etching treatment of a material of the transparent conductive film is carried out by a hydrochloric acid based solution. However, since etching of ITO is apt to produce a residual, an indium oxide-zinc oxide alloy (In$_2$O$_3$—ZnO) may be used to improve etching workability. The indium oxide-zinc oxide alloy has features that surface flatness is superior and is also superior in thermal stability as compared with ITO. Similarly, zinc oxide (ZnO) is also a suitable material, and further, zinc oxide (ZnO: Ga) added with gallium (Ga) to increase transmissivity of visible light and conductivity can be used.

Figure 11A:
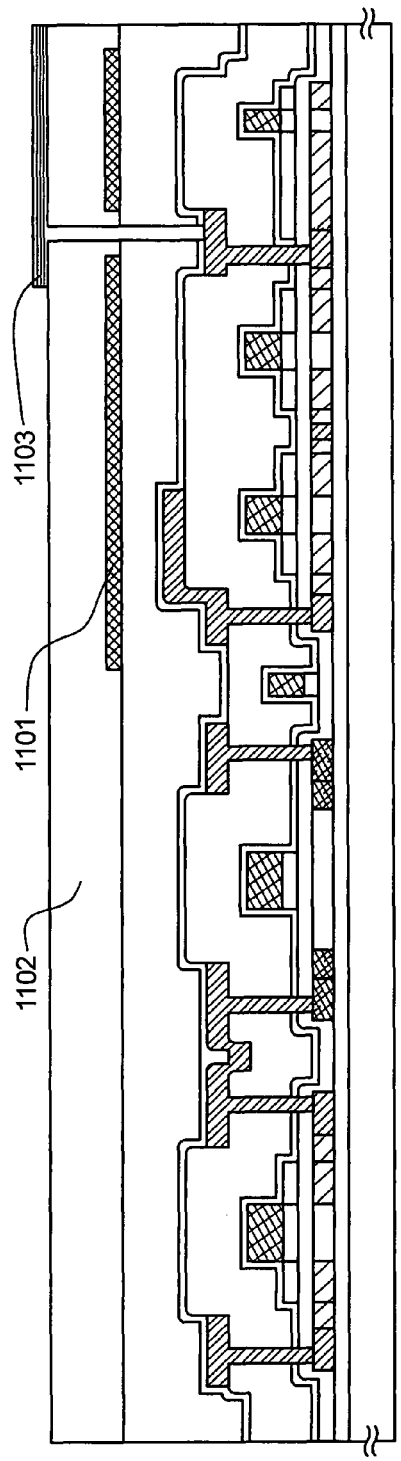
FIGS. 11A and 11B are sectional views showing fabricating steps of a liquid crystal display device.
Figure 11B:
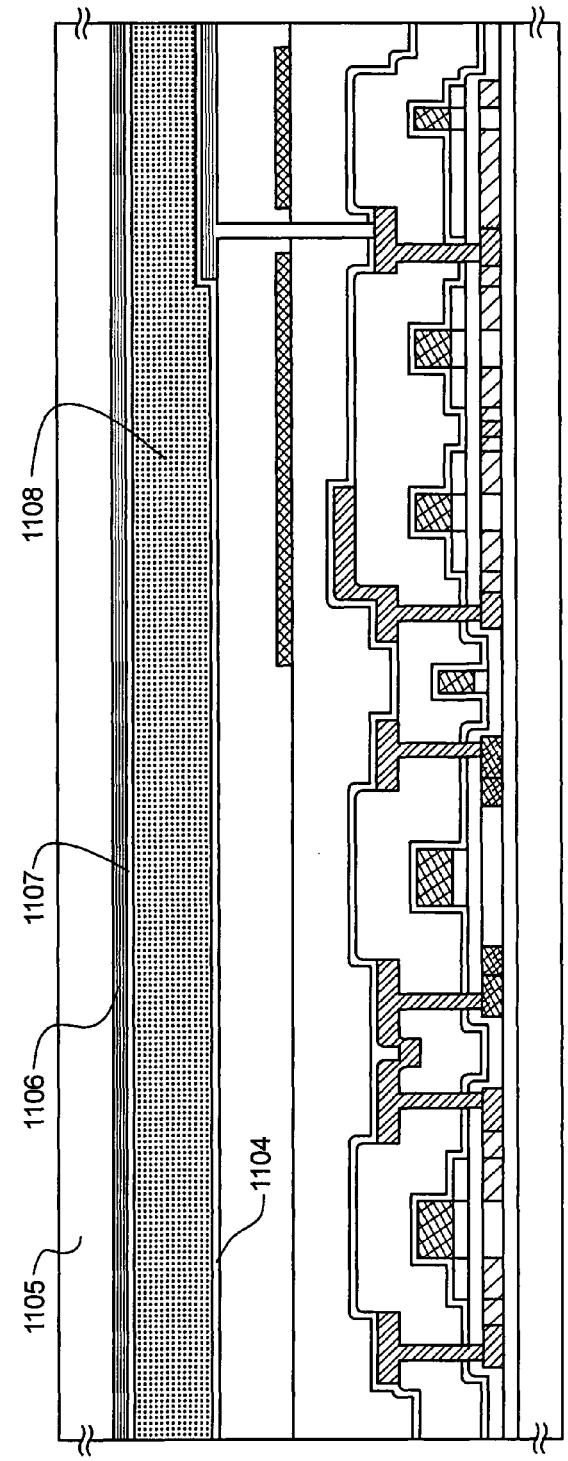

Next, as shown in FIG. 11B, an orientated film 1104 was formed on the third interlayer insulating film 1102 and the pixel electrode 1103. In general, polyimide resin is often used for an oriented film of a liquid crystal display device. A transparent electrode 1106 and an oriented film 1107 were formed on an opposite side substrate 1105. The oriented film was subjected to a rubbing process after formation so that liquid crystal molecules were made to be oriented in parallel and with a certain constant pretilt angle.

After the foregoing steps, the active matrix substrate on which the pixel portion and the CMOS circuit were formed and the opposite substrate were bonded to each other by a well-known cell assembling step through a sealing material, a spacer (both are not shown), and the like. Thereafter, a liquid crystal material 110B was injected between both the substrates, and complete sealing was made by a sealing agent (not shown). Thus, the active matrix type liquid crystal display device shown in FIG. 11B was completed.

Figure 9:
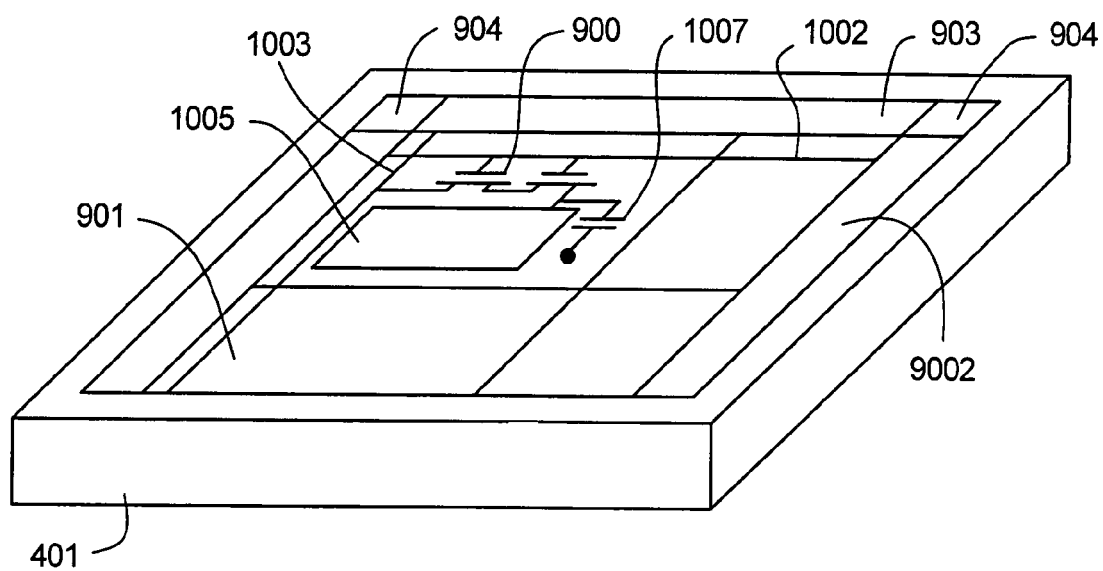
FIG. 9 is a perspective view of an active matrix substrate.

Next, a structure of an active matrix type liquid crystal display device of this embodiment will be described with reference to FIGS. 9, 10A and 10B. FIG. 9 is a perspective view of an active matrix substrate of this embodiment. The active matrix substrate is constructed by a pixel portion 901, a scanning (gate) line driver circuit 902 and a signal (source) line driver circuit 903 formed on a glass substrate 401. A pixel TFT 900 of the pixel portion is an n-channel TFT, and the driver circuits provided at the periphery are constituted by a CMOS circuit as a base. The scanning (gate) line driver circuit 902 and the signal (source) line driver circuit 903 are connected to the pixel portion 901 through a gate wiring line 1002 and a source wiring line 1003, respectively.

Figure 10A:
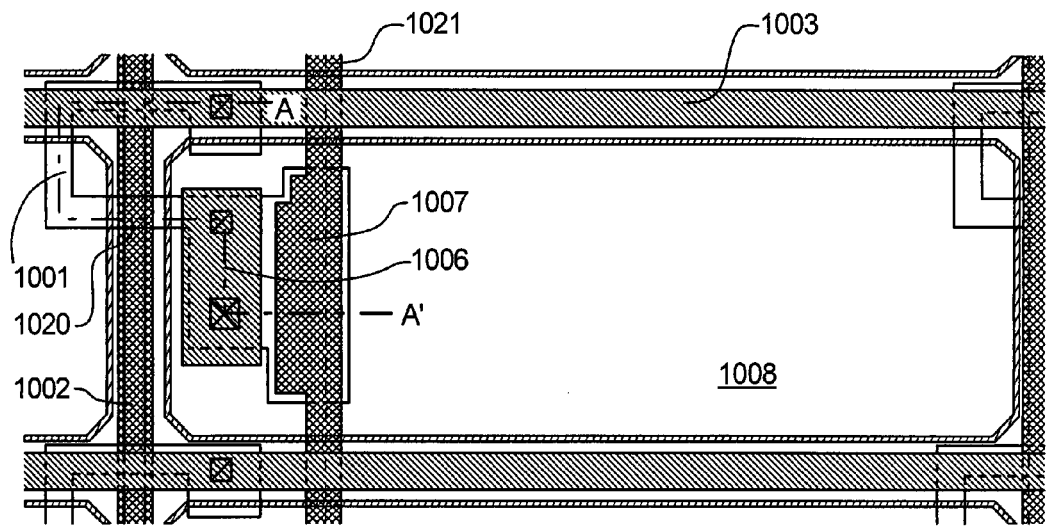
FIGS. 10A and 10B are partial top views of an active matrix circuit and a CMOS circuit.

FIG. 10A is a top view of the pixel portion 901 and is a top view of about one pixel. An n-channel TFT is provided in the pixel portion. A gate electrode 1020 formed to be connected with the gate wiring line 1002 intersects through a not-shown gate insulating film with a semiconductor layer 1001 under the film. Although not shown, a source region, a drain region, and a first impurity region are formed in the semiconductor layer. At a drain side of the pixel TFT, a holding capacitance 1007 is formed of the semiconductor layer, the gate insulating film, and an electrode made of the same material as the second layer of the gate electrode. A capacitance wiring line 1021 connected to the holding capacitance 1007 is provided in parallel to the gate wiring line 1002. A sectional structure along line A-A' shown in FIG. 10A corresponds to the sectional view of the pixel portion shown in FIG. 6.

Figure 10B:
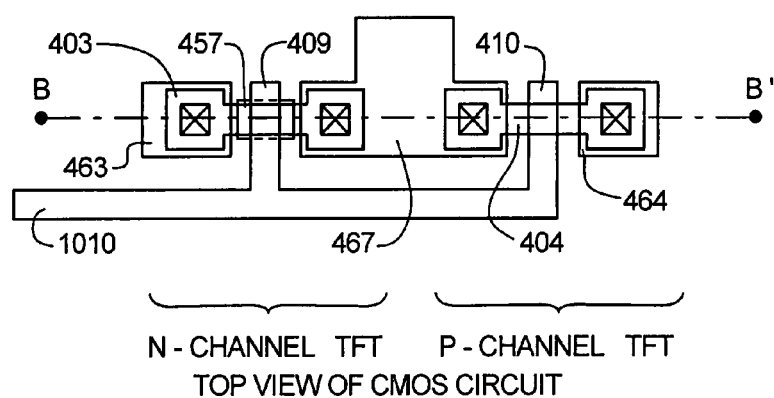

On the other hand, in the CMOS circuit shown in FIG. 10B, the gate electrodes 409 and 410 extending from the gate wiring line 1010 intersect through a not-shown gate insulating film with the semiconductor layers 403 and 404 under the film. Although not shown, similarly, a source region, a drain region, and a first impurity region are formed in the semiconductor layer of the n-channel TFT. A source region and a drain region are formed in the semiconductor layer of the p-channel TFT. Concerning the positional relation, the sectional structure along line B-B' corresponds to the sectional view of the pixel portion shown in FIG. 6.

In this embodiment, although the pixel TFT 900 has a double gate structure, a single gate structure may be adopted, or a multi gate structure of a triple gate may be adopted. The structure of the active matrix substrate of the invention is not limited to the structure of this embodiment. Since the structure of the present invention is characterized in the structure of a gate electrode and the structure of a source region, a drain region and other impurity regions of a semiconductor layer provided through a gate insulating film, other structures may be suitably determined by an operator.

Embodiment 9

Figure 17:
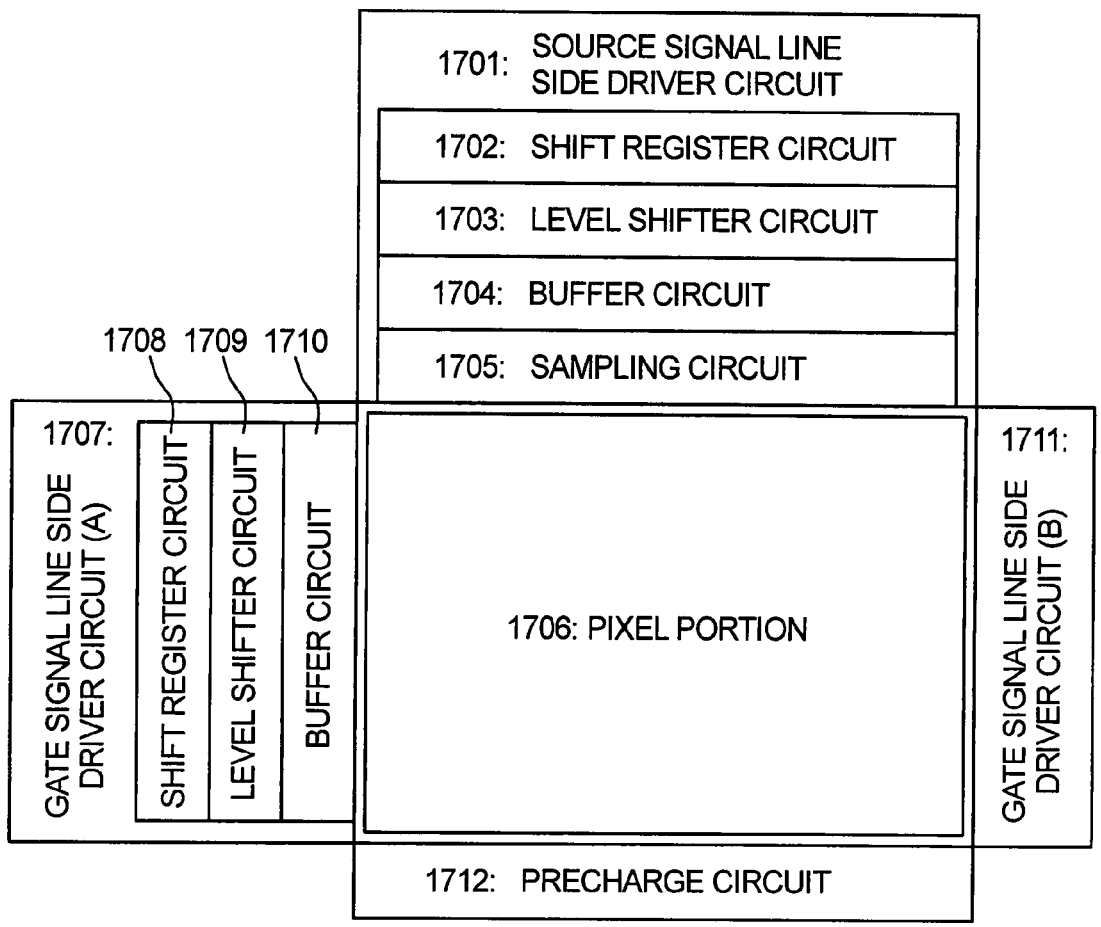
FIG. 17 is a circuit block diagram of an embodiment of an active matrix type liquid crystal display device.

FIG. 17 shows an example of a circuit structure of an active matrix type liquid crystal display device shown in the embodiment 8. The active matrix type liquid crystal display device of this embodiment includes a source signal line side driver circuit 1701, a gate signal line side driver circuit (A) 1707, a gate signal line side driver circuit (B) 1711, a precharge circuit 1712 and a pixel portion 1706.

The source signal line side driver circuit 1701 includes a shift register circuit 1702, a level shifter circuit 1703, a buffer circuit 1704, and a sampling circuit 1705.

The gate signal line side driver circuit (A) 1707 includes a shift register circuit 1708, a level shifter circuit 1709 and a buffer circuit 1710. The gate signal line side driver circuit (B) 1711 has also the same structure.

Here, an example of driving voltage of each circuit will be shown. The shift register circuit 1702 and 1708 had 10 to 16 V, and the level shifter circuits 1703 and 1709, the buffer circuits 1704 and 1710, the sampling circuit 1705, and the pixel portion 1706 had 14 to 16 V. With respect to the sampling circuit 1705 and the pixel portion 1706, the value was the amplitude of an applied voltage, and generally, voltages with reversed polarities were alternately applied.

In the present invention, it is easy to make the lengths of second impurity regions, which become LDD regions, different from each other on the same substrate in view of driving voltages of n-channel TFTs, and it was possible to form the optimum shapes for TFTs constituting the respective circuits through the same step.

Figure 18A:
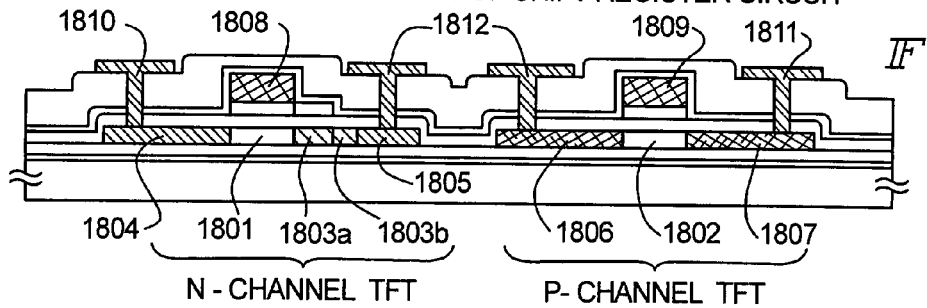
FIGS. 18A to 18D are views showing structural examples of TFTs of the present invention.

FIG. 18A shows a structural example of a TFT of a shift register circuit. An n-channel TFT of the shift register circuit has a single gate, and a second impurity region which becomes an LDD region is provided at only a drain side. Here, the lengths of an LDD region (GOLD region) 1803*a* overlapping with a gate electrode and an LDD region 1803*b* not overlapping with the gate electrode may be determined in accordance with, for example, FIG. 3C, and the regions can be formed such that the region 1803*a* has a length of 2.0 µm and the region 1803*b* has a length of 1.0 µm.

Figure 18B:
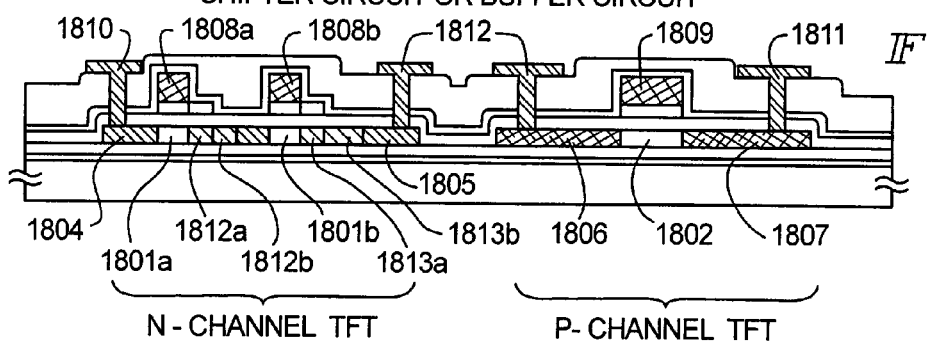

FIG. 18B shows a structural example of a TFT of a level shifter circuit or a buffer circuit. An n-channel TFT of these circuits is made to have a double gate, and a second impurity region which becomes an LDD region is provided at a drain side. For example, the length of each of LDD regions (GOLD regions) 1812*a* and 1813*a* overlapping with gate electrodes can be made 2.5 µm, and the length of each of LDD regions 1812*b* and 1813*b* not overlapping with the gate electrodes can be made 2.5 µm.

Figure 18C:
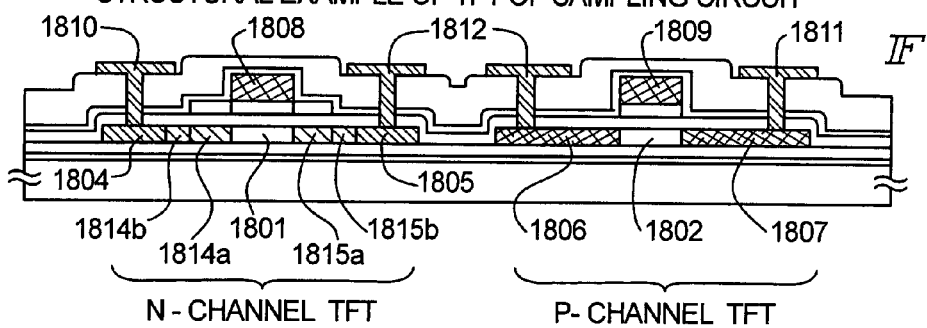

FIG. 18C shows a structural example of a TFT of a sampling circuit. Although an n-channel TFT of this circuit has a single gate, since the polarity is reversed, a second impurity region which becomes an LDD region is provided at both sides of a source side and a drain side. It is preferable that the lengths of LDD regions (GOLD regions) 1814*a* and 1815*a* overlapping with a gate electrode and the lengths of LDD regions 1814*b* and 1815*b* not overlapping with the gate electrode are respectively made equal to each other. For example, the lengths of the LDD regions (GOLD regions) 1814*a* and 1815*a* overlapping with the gate electrode can be made 1.5 µm, and the lengths of the LDD regions 1814*b* and 1815*b* not overlapping with the gate electrode can be made 1.0 µm.

Figure 18D:
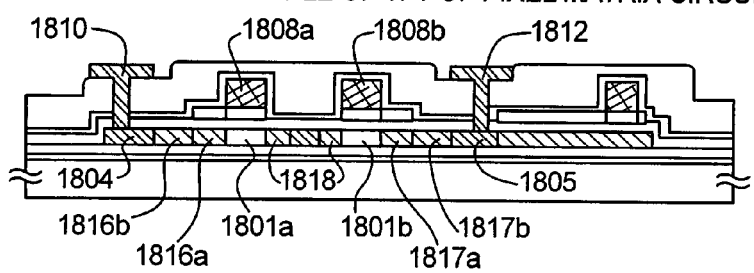

FIG. 18D shows a structural example of a pixel portion. Although an n-channel TFT of this circuit has a multi gate structure, since the polarity is reversed, a second impurity region which becomes an LDD region is provided at both sides of a source side and a drain side. For example, the lengths of LDD regions (GOLD regions) 1816*a* and 1817*a* overlapping with a gate electrode can be made 1.5 µm, and the lengths of LDD regions 1816*b* and 1817*b* not overlapping with the gate electrode can be made 1.5 µm.

Embodiment 10

This embodiment demonstrates a process for producing an EL (electroluminescence) display device according to the invention of the present application.

Figure 32A:
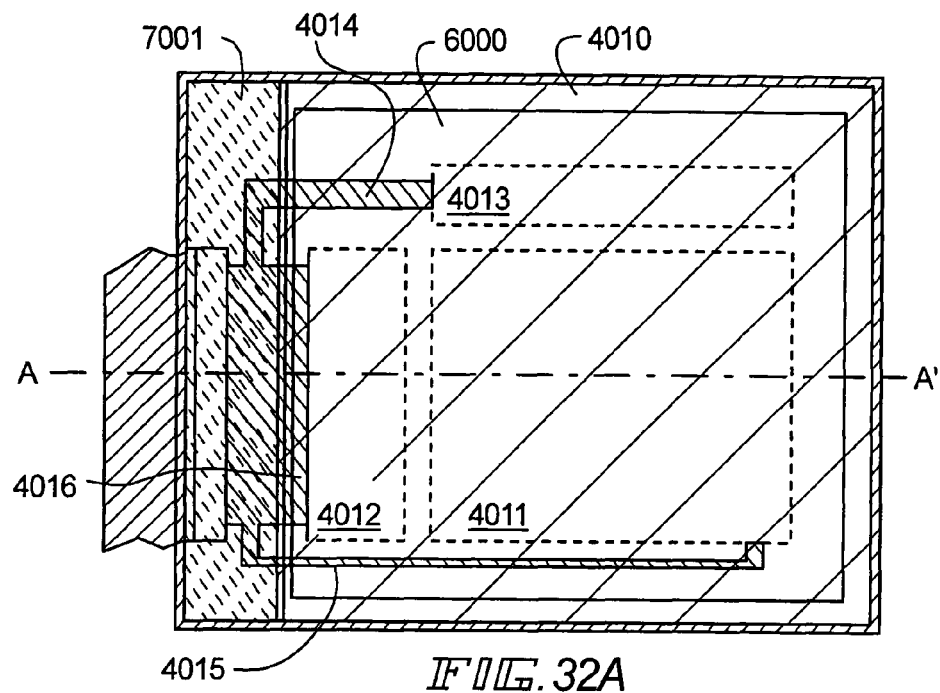
FIG. 32A is a plan view showing an EL display.

FIG. 32A is a top view showing an EL display device, which was produced according to the invention of the present application. In FIG. 32A, there are shown a substrate 4010, a pixel part 4011, a driving circuit from the source 4012, and a driving circuit from the gate 4013, each driving circuit connecting to wirings 4014, 4015 and 4016 which reach FPC 4017 leading to external equipment.

Figure 32B:
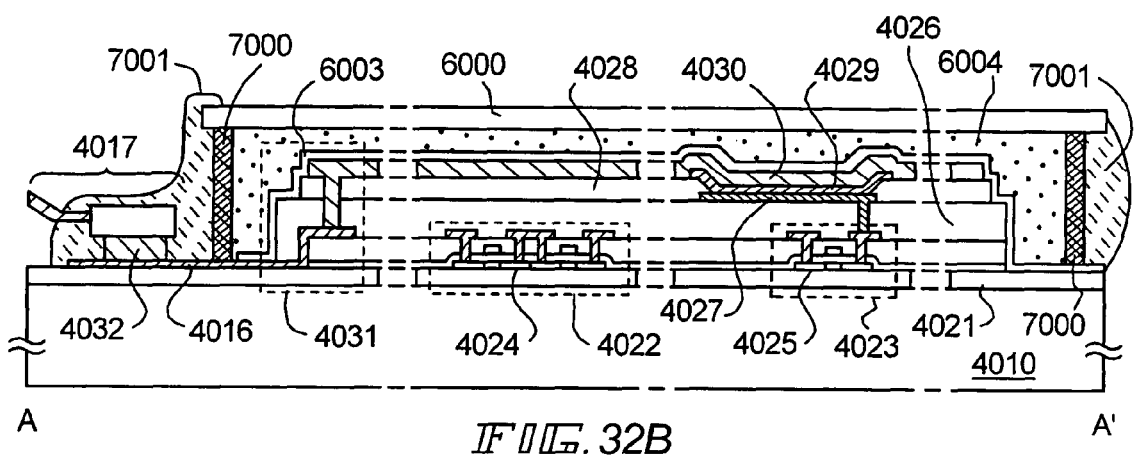
FIG. 32B is a cross-sectional view showing the EL display of FIG. 32A.

FIG. 32B is a sectional view showing the structure of the EL display device in this embodiment. The pixel part, preferably together with the driving circuit, is enclosed by a covering material 6000, a sealing material (or housing material) 7000, and an end-sealing material (or second sealing material) 7001.

Furthermore, there is shown a substrate 4010, an underlying coating 4021, a TFT 4022 for the driving circuit, and a TFT 4023 for the pixel unit. (The TFT 4022 shown is a CMOS circuit consisting of an n-channel type TFT and a p-channel TFT. The TFT 4023 shown is the one, which controls current to the EL element.) These TFTs may be of any known structure (top gate structure or bottom gate structure).

Incidentally, the present invention is used in the TFT 4022 for the driving circuit and the TFT 4023 for the pixel unit.

Upon completion of TFT 4022 (for the driving circuit) and TFT 4023 (for the pixel unit), with their active layer being the semiconductor layer formed according to the invention of the present application, a pixel electrode 4027 is formed on the interlayer insulating film (planarizing film) 4026 made of a resin. This pixel electrode is a transparent conductive film, which is electrically connected to the drain of TFT 4023 for the pixel unit. It is preferable that the TFT for the pixel portion is a p-channel type TFT in the case that the transparent conductive film is used for the pixel electrode 4027. The transparent conductive film may be formed from a compound (called ITO) of indium oxide and tin oxide or a compound of indium oxide and zinc oxide. On the pixel electrode 4027 is formed an insulating film 4028, in which is formed an opening above the pixel electrode 4027.

Subsequently, the EL layer 4029 is formed. It may be of single-layer structure or multi-layer structure by freely combining known EL materials such as injection layer, hole transport layer, light emitting layer, electron transport layer, and electron injection layer. Any known technology may be available for such structure. The EL material is either a low-molecular material or a high-molecular material (polymer). The former may be applied by vapor deposition, and the latter may be applied by a simple method such as spin coating, printing, or ink-jet method.

In this example, the EL layer is formed by vapor deposition through a shadow mask. The resulting EL layer permits each pixel to emit light differing in wavelength (red, green, and blue). This realizes the color display. Alternative systems available include the combination of color conversion layer (CCM) and color filter and the combination of white light emitting layer and color filter. Needless to say, the EL display device may be monochromatic.

On the EL layer is formed a cathode 4030. Prior to this step, it is desirable to clear moisture and oxygen as much as possible from the interface between the EL layer 4029 and the cathode 4030. This object may be achieved by forming the EL layer 4029 and the cathode 4030 consecutively in a vacuum, or by forming the EL layer 4029 in an inert atmosphere and then forming the cathode 4030 in the same atmosphere without admitting air into it. In this Example, the desired film was formed by using a film-forming apparatus of multi-chamber system (cluster tool system).

The multi-layer structure composed of lithium fluoride film and aluminum film is used in this Example as the cathode 4030. To be concrete, the EL layer 4029 is coated by vapor deposition with a lithium fluoride film (1 nm thick) and an aluminum film (300 nm thick) sequentially. Needless to say, the cathode 4030 maybe formed from Mg Ag electrode which is a known cathode material. Subsequently, the cathode 4030 is connected to a wiring 4016 in the region indicated by 4031. The wiring 4016 to supply a prescribed voltage to the cathode 4030 is connected to the FPC 4017 through an electrically conductive paste material 4032.

The electrical connection between the cathode 4030 and the wiring 4016 in the region 4031 needs contact holes in the interlayer insulating film 4026 and the insulating film 4028. These contact holes may be formed when the interlayer insulating film 4026 undergoes etching to form the contact hole for the pixel electrode or when the insulating film 4028 undergoes etching to form the opening before the EL layer is formed. When the insulating film 4028 undergoes etching, the interlayer insulating film 4026 may be etched simultaneously. Contact holes of good shape may be formed if the interlayer insulating film 4026 and the insulating film 4028 are made of the same material.

Then, a passivation film 6003, a filling material 6004 and a covering material 6000 are formed so that these layers cover the EL element.

Furthermore, the sealing material 7000 is formed inside of the covering material 6000 and the substrate 4010 such as surrounding the EL element, and the end-sealing material 7001 is formed outside of the sealing material 7000.

The filling material 6004 is formed to cover the EL element and also functions as an adhesive to adhere to the covering material 6000. As the filling material 6004, PVC (polyvinyl chloride), an epoxy resin, a silicon resin, PVB (polyvinyl butyral), or EVA (ethylenvinyl acetate) can be utilized. It is preferable to form a desiccant in the filling material 6004, since a moisture adsorption can be maintained.

Also, spacers can be contained in the filling material 6004. It is preferable to use spherical spacers comprising barium oxide to maintain the moisture absorption in the spacers.

In the case of that the spacers are contained in the filling material, the passivation film 6003 can relieve the pressure of the spacers. Of course, the other film different from the passivation film, such as an organic resin, can be used for relieving the pressure of the spacers.

As the covering material 6000, a glass plate, an aluminum plate, a stainless plate, a FRP (Fiberglass-Reinforced Plastics) plate, a PVF (Polyvinyl Fluoride) film, a Mylar film, a polyester film or an acryl film can be used. In a case that PVB or EVA is employed as the filling material 6004, it is preferable to use an aluminum foil with a thickness of some tens of μm sandwiched by a PVF film or a Mylar film.

It is noted that the covering material 6000 should have a light transparency with accordance to a light emitting direction (a light radiation direction) from the EL element.

The wiring 4016 is electrically connected to FPC 4017 through the gap between the sealing material 7000 and the end-sealing material 7001, and the substrate 4010. As in the wiring 4016 explained above, other wiring 4014 and 4015 are also electrically connected to FPC 4017 under the sealing material 4018.

Figure 33A:
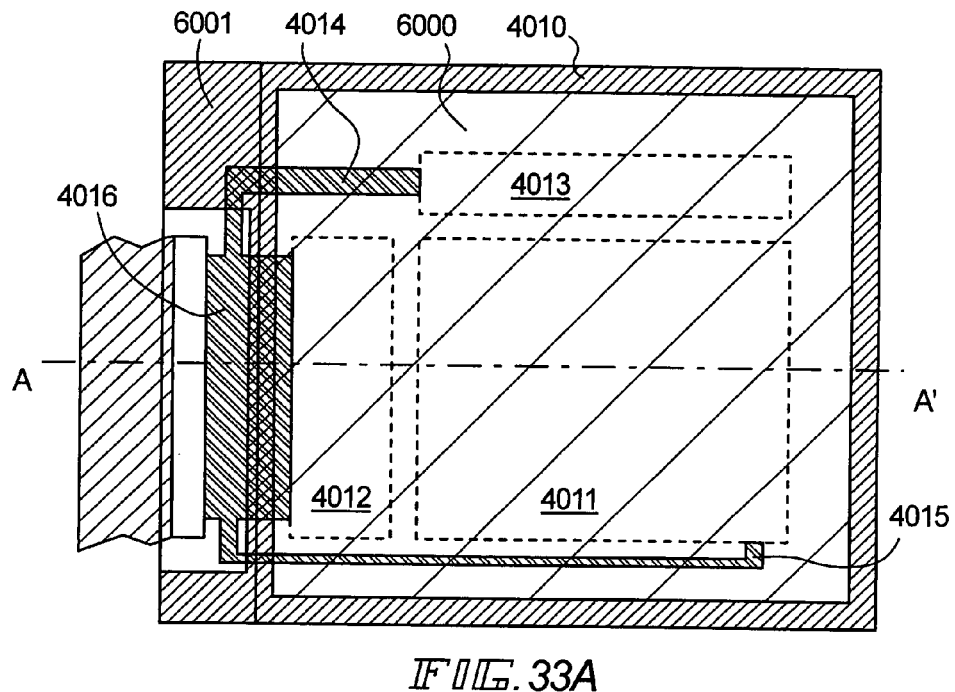
FIG. 33A is a plan view showing an EL display.
Figure 33B:
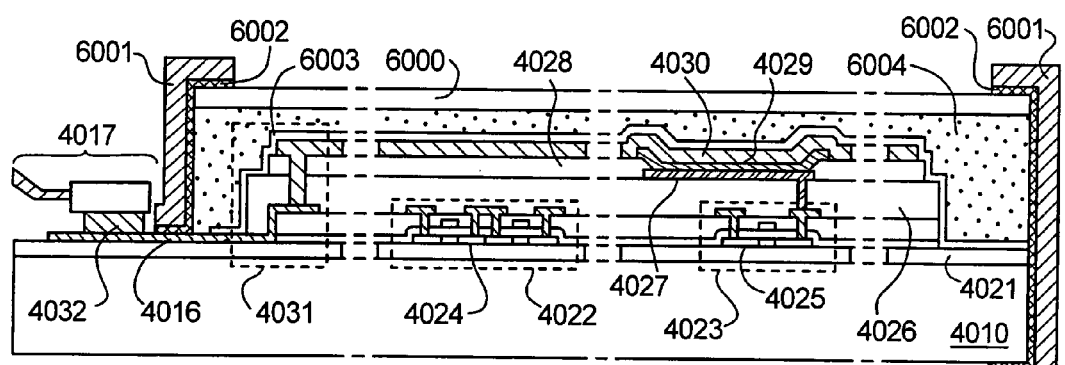
FIG. 33B is a cross-sectional view showing the EL display of FIG. 33A.

An example in which another EL display device having a further different structure is manufactured is explained, with reference to FIGS. 33A and 33B. The same reference numerals in FIGS. 33A and 33B as in FIGS. 32A and 32B indicate same constitutive elements, so an explanation is omitted.

FIG. 33A shows a top view of the EL module in this embodiment and FIG. 33B shows a sectional view of A-A' of FIG. 33A.

In the same way as in FIGS. 32A and 32B, the passivation film 6003 is formed to cover a surface of the EL element.

The filling material 6004 is formed to cover the EL element and also functions as an adhesive to adhere to the covering material 6000. As the filling material 6004, PVC (polyvinyl Chloride), an epoxy resin, a silicon resin, PVB (polyvinyl Butyral), or EVA (Ethylenvinyl Acetate) can be utilized. It is preferable to form a desiccant in the filling material 6004, since a moisture absorption can be maintained.

Also, spacers can be contained in the filling material 6004. It is preferable to use spherical spacers comprising barium oxide to maintain the moisture absorption in the spacers.

In the case of that the spaces are contained in the filling material, the passivation film 6003 can relieve the pressure of the spacers. Of course, the other film different from the passivation film, such as an organic resin, can be used for relieving the pressure of the spacers.

As the covering material 6000, a glass plate, an aluminum plate, a stainless plate, a FRP (Fiberglass-Reinforced Plastics) plate, a PVF (polyvinyl fluoride) film, a Mylar film, a polyester film or an acryl film can be used. In a case that PVB or EVA is employed as the filling material 6004, it is preferable to use an aluminum foil with a thickness of some tens of μm sandwiched by a PVF film or a Mylar film.

It is noted that the covering material 6000 should have a light transparency with accordance to a light emitting direction (a light radiation direction) from the EL element.

Next, the covering material 6000 is adhered using the filling material 6004. Then, the flame material 6001 is attached to cover side portions (exposed faces) of the filling material 6004. The flame material 6001 is adhered by the sealing material (act as an adhesive) 6002. As the sealing material 6002, a light curable resin is preferable. Also, a thermal curable resin can be employed if a heat resistance of the EL layer is admitted. It is preferable for the sealing material 6002 not to pass moisture and oxygen. In addition, it is possible to add a desiccant inside the sealing material 6002.

The wiring 4016 is electrically connected to FPC 4017 through the gap between the sealing material 6002 and the substrate 4010. As in the wiring 4016 explained above, other wiring 4014 and 4015 are also electrically connected to FPC 4017 under the sealing material 6002.

Figure 34:
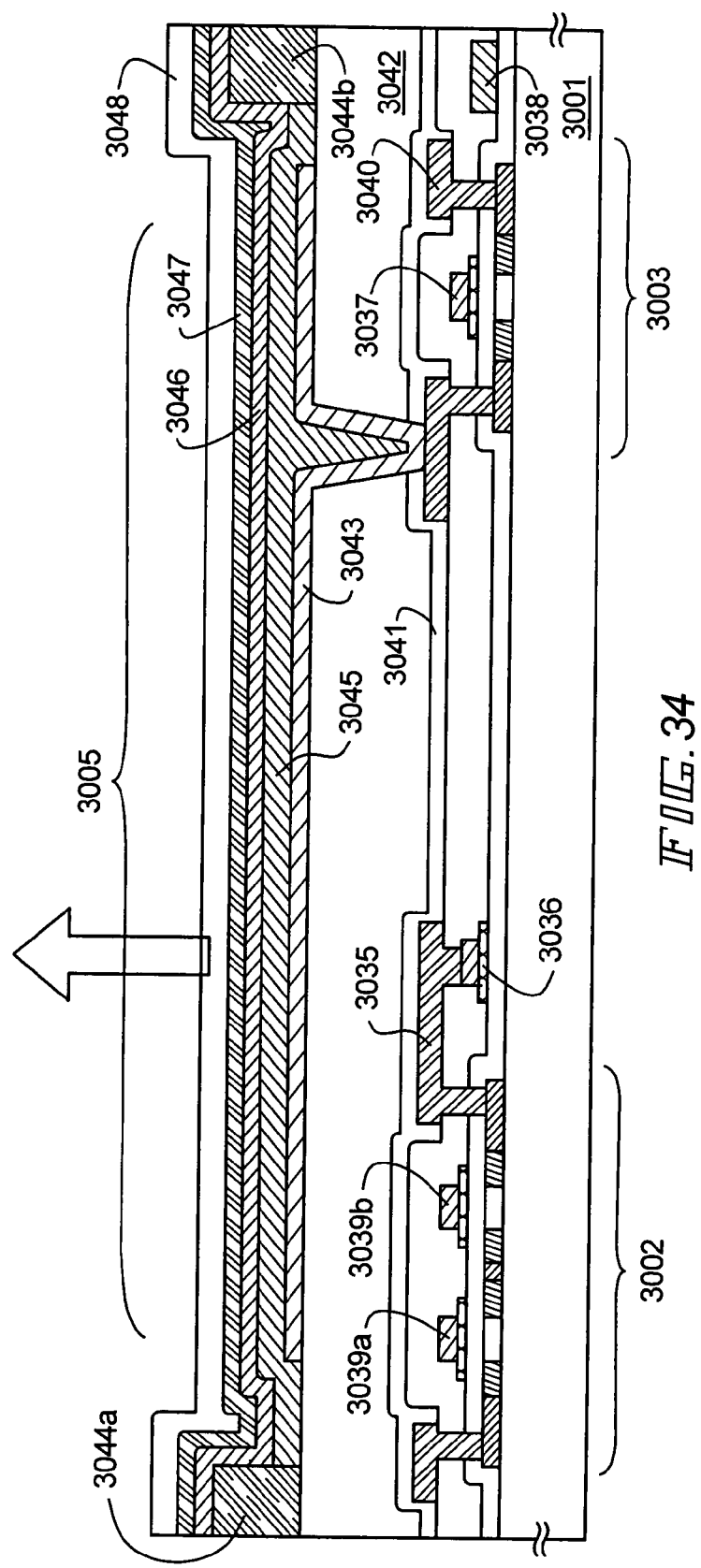
FIG. 34 is a cross-sectional view showing a pixel portion of an EL display.
Figure 35A:
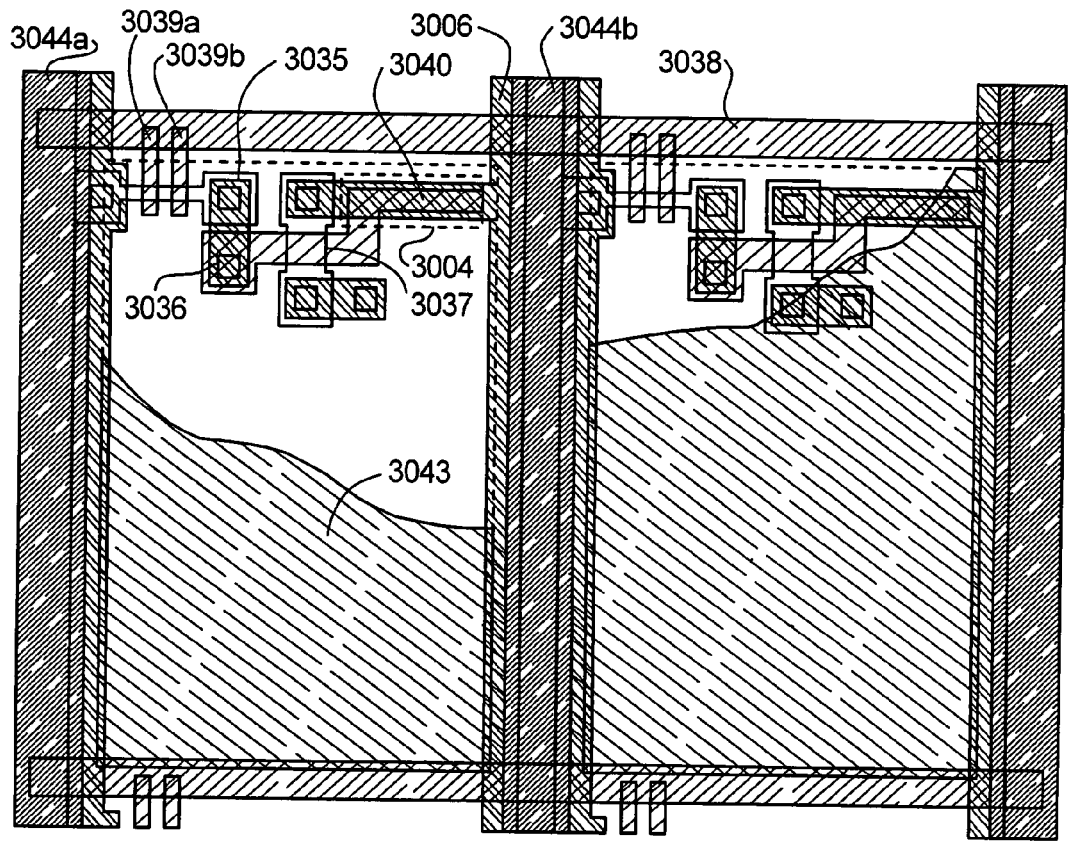
FIG. 35A is a plan view showing the pixel portion of the EL display of FIG. 34.
Figure 35B:
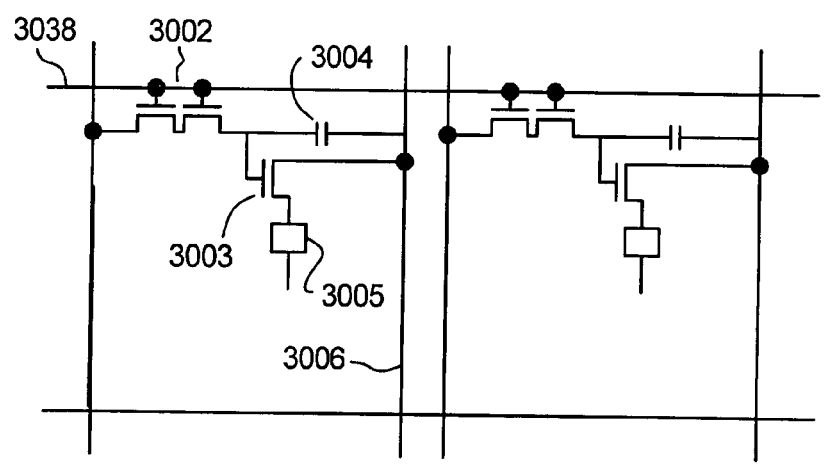
FIG. 35B is a circuit diagram of the pixel portion of FIG. 34.

In this embodiment, the cross-sectional structure of the pixel region in the EL display device is illustrated in more detail in FIG. 34. FIG. 35A shows the top view thereof and FIG. 35B shows the circuit diagram for the pixel region. In FIG. 34, FIG. 35A and FIG. 35B, the same reference numerals are referred to for the same parts, as being common thereto.

In FIG. 34, the switching TFT 3002 formed on the substrate 3001 is NTFT of the invention (cf. Embodiments 1 to 7). In this Embodiment, it has a double-gate structure, but its structure and fabrication process do not so much differ from the structures and the fabrication processes illustrated hereinabove, and their description is omitted herein. However, the double-gate structure of the switching TFT 3002 has substantially two TFTs as connected in series, and therefore has the advantage of reducing the off-current to pass therethrough.

In this Embodiment, the switching TFT 3002 has such a double-gate structure, but is not limitative. It may have a single-gate structure or a triple-gate structure, or even any other multi-gate structure having more than three gates. As the case may be, the switching TFT 3002 may be PTFT of the invention.

The current-control TFT 3003 is NTFT of the invention. The drain wire 3053 in the switching TFT 3002 is electrically connected with the gate electrode 3037 in the current-control TFT, via the wire 3036 therebetween. The wire indicated by 3038 is a gate wire for electrically connecting the gate electrodes 3039a and 3039b in the switching TFT 3002.

It is very important that the current-control TFT 3003 has the structure defined in the invention. The current-control TFT is a unit for controlling the quantity of current passes through the EL element. Therefore, a large quantity of current passes through it, and the unit, current-control TFT has a high risk of thermal degradation and degradation with hot carriers. To this unit, therefore, the structure of the invention is extremely favorable, in which an GOLD region (a second impurity region) is so constructed that the gate electrode overlaps with the drain area in the current-control TFT, via a gate-insulating film therebetween.

In this embodiment, the current-control TFT 3003 is illustrated to have a single-gate structure, but it may have a multi-gate structure with plural TFTs connected in series. In addition, plural TFTs may be connected in parallel so that the channel-forming region is substantially divided into plural sections. In the structure of that type, heat radiation can be effected efficiently. The structure is advantageous for protecting the device with it from thermal deterioration.

As in FIG. 35A, the wire to be the gate electrode 3037 in the current-control TFT 3003 overlaps with the drain wire 3040 therein in the region indicated by 3004, via an insulating film therebetween.

In this state, the region indicated by 3004 forms a capacitor. The capacitor 3004 functions to retain the voltage applied 3040 is connected with the current supply line (power line) 3006, from which a constant voltage is all the time applied to the drain wire 3040.

On the switching TFT 3002 and the current-control TFT 3003, formed is a first passivation film 3041. On the film 3041, formed is a planarizing film 3042 of an insulating resin. It is extremely important that the difference in level of the layered parts in TFT is removed through planarization with the planarising film 3042. This is because the EL layer to be formed on the previously formed layers in the later step is extremely thin, and if there exist a difference in level of the previously formed layers, the EL device will be often troubled by light emission failure. Accordingly, it is desirable to previously planarize as mush as possible the previously formed layers before the formation of the pixel electrode thereon so that the EL layer could be formed on the planarized surface.

The reference numeral 3043 indicates a pixel electrode (a cathode in the EL device) of an electro conductive film with high reflectivity. The pixel electrode 3043 is electrically connected with the drain in the current-control TFT 3003. It is preferable to use a n-channel type TFT for the current-control TFT in the case of the conductive film with high reflectivity is used for the pixel electrode 3043. Moreover, it is preferable that the pixel electrode 3043 is of a low-resistance electro conductive film of an aluminum alloy, a copper alloy or a silver alloy, or of a laminate of those films. Needless-to-say, the pixel electrode 3043 may have a laminate structure with any other electroconductive films.

In the recess (this corresponds to the pixel) formed between the banks 3044a and 3044b of an insulating film (preferably of a resin), the light-emitting layer 3045 is formed. In the illustrated structure, only one pixel is shown, but plural light-emitting layers could be separately formed in different pixels, corresponding to different colors of R (red), G (green) and B (blue). The organic EL material for the light-emitting layer maybe any n-conjugated polymer material.

Typical polymer materials usable herein include Polyparaphenylenevinylene (PPV) materials, Polyvinylcarbazole (PVK) materials, Polyfluorene materials, etc.

Various types of PPV-type organic EL materials are known, such as those disclosed in "H. Shenk, H. Becker, O. Gelsen, E. Klunge, W. Kreuder, and H. Spreitzer; Polymers for Light Emitting Diodes, Euro Display Proceedings, 1999, pp. 33-37" and in Japanese Patent Laid-Open No. 10-92576 (1998). Any of such known materials are usable herein.

Concretely, cyanopolyphenylenevinylenes may be used for red-emitting layers; polyphenylenevinylenes may be for green-emitting layers; and polyphenylenevinylenes or polyalkylphenylenes may be for blue-emitting layers. The thickness of the film for the light-emitting layers may fall between 30 and 150 nm (preferably between 40 and 100 nm).

These compounds mentioned above are referred to merely for examples of organic EL materials employable herein and are not limitative at all. The light-emitting layer may be combined with a charge transportation layer or a charge injection layer in any desired manner to form the intended EL layer (this is for light emission and for carrier transfer for light emission).

Specifically, this Embodiment is to demonstrate the embodiment of using polymer materials to form light-emitting layers, which, however, is not limitative. Apart from this, low-molecular organic EL materials may also be used for light-emitting layers. For charge transportation layers and charge injection layers, further employable are inorganic materials such as silicon carbide, etc. Various organic EL materials and inorganic materials for those layers are known, any of which are usable herein.

In this Embodiment, a hole injection layer 3046 of PEDOT (polythiophene) or PAni (polyaniline) is formed on the light-emitting layer 3045 to give a laminate structure for the EL layer. On the hole injection layer 3046, formed is an anode 3047 of a transparent electroconductive film. In this Embodiment, the light having been emitted by the light-emitting layer 3045 radiates therefrom in the direction toward the top surface (that is, in the upward direction of TFT). Therefore, in this, the anode must transmit light. For the transparent electroconductive film for the anode, usable are compounds of indium oxide and tin oxide, and compounds of indium oxide and zinc oxide. However, since the anode is formed after the light-emitting layer and the hole injection layer having poor heat resistance have been formed, it is preferable that the transparent electroconductive film for the anode is of a material capable of being formed into a film at as low as possible temperatures.

When the anode 3047 is formed, the EL device 3005 is finished. The EL device 3005 thus fabricated herein indicates a capacitor comprising the pixel electrode (cathode) 3043, the light-emitting layer 3045, the hole injection layer 3046 and the anode 3047. As in FIG. 35A, the region of the pixel electrode 3043 is nearly the same as the area of the pixel. Therefore, in this, the entire pixel functions as the EL device.

Accordingly, the light utility efficiency of the EL device fabricated herein is high, and the device can display bright images.

In this Embodiment, a second passivation film 3048 is formed on the anode 3047. For the second passivation film 3048, preferably used is a silicon nitride film or a silicon oxynitride film. The object of the film 3048 is to insulate the EL device from the outward environment. The film 3048 has the function of preventing the organic EL material from being degraded through oxidation and has the function of preventing it from degassing. With the second passivation film 3048 of that type, there liability of the EL display device is improved.

As described hereinabove, the EL display panel of the invention fabricated in this Embodiment has a pixel region for the pixel having the constitution as in FIG. 34 and has the switching TFT through which the off-current to pass is very small to a satisfactory degree, and the current-control TFT resistant to hot carrier injection. Accordingly, the EL display panel fabricated herein has high reliability and can display good images.

The constitution of the embodiment of FIG. 34 can be combined with any constitution of Embodiments 1 to 7 in any desired manner. Incorporating the EL display device of this Embodiment into the electronic appliance of Embodiment 12 as its display part is advantageous.

As another structure of the pixel portion, the structure in which the EL device 3005 has a reversed structure is described below with reference to FIG. 36. The constitution of the EL display panel of FIG. 36 differs from that illustrated in FIG. 34 only in the EL device part and the current-control TFT part. Therefore, the description of the other parts except those different parts is omitted herein.

Figure 36:
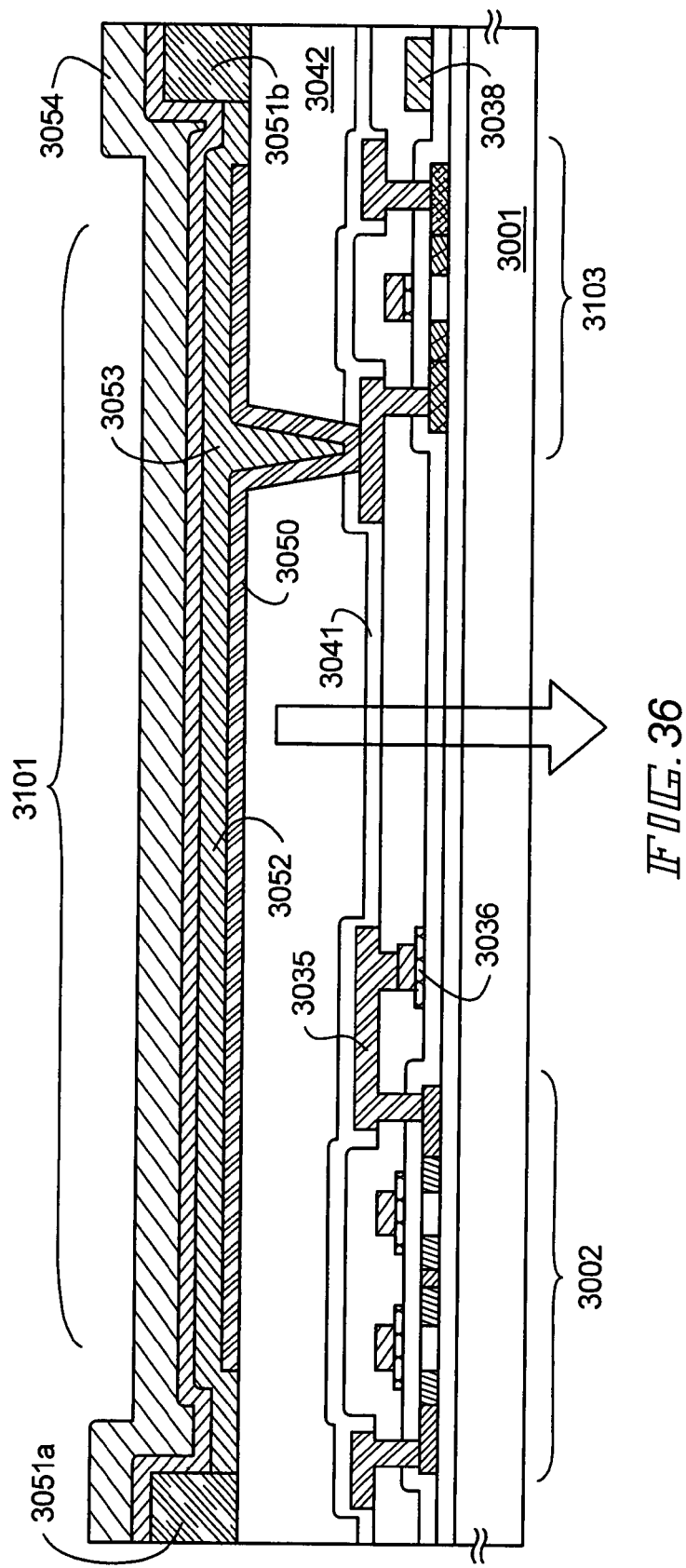
FIG. 36 is a cross-sectional view showing a pixel portion of an EL display.

In FIG. 36, the current-control TFT 3103 maybe PTFT of the invention. For the process of forming it, referred to is that of Embodiment 1 to 7.

In FIG. 36, the pixel electrode (anode) 3050 is of a transparent electrocunductive film. Concretely, used is an electroconductive film of a compound of indium oxide and zinc oxide. Needless-to-say, also usable is an electroconductive film of a compound of indium oxide and tin oxide.

After the banks 3051a and 3051b of an insulating film have been formed, a light-emitting layer 3052 of polyvinylcarbazole is formed between them in a solution coating method. On the light-emitting layer 3052, formed are an electron injection layer 3053 of acetylacetonatopotassium (hereinafter acacK), and a cathode 3054 of an aluminum alloy. In this case, the cathode 3054 serves also as a passivation film. Thus is fabricated the EL device 3101.

In FIG. 36, the light having been emitted by the light-emitting layer 3052 radiates in the direction toward the substrate with TFT formed thereon, as in the direction of the arrow illustrated.

The constitution of FIG. 36 can be combined with any constitution of Embodiments 1 to 7 in any desired manner. Incorporating the EL display panel of this Embodiment into the electronic appliance of Embodiment 12 as its display part is advantageous.

Next, a description will be made with reference to FIG. 21A to 21C on an example in which an EL (electroluminescence) display device has a pixel different from that of the circuit diagram of FIG. 35B.

3201 indicates the source wire for the switching TFT 3202; 3203 indicates the gate wire for the switching TFT 3202; 3204 indicates a current-control TFT; 3205 indicates a capacitor; 3206 and 3208 indicate current supply lines; and 3207 indicates an EL element.

Figure 21A:
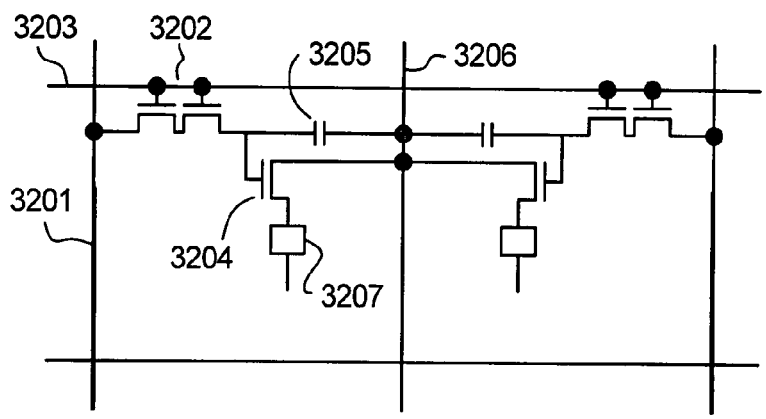
FIGS. 21A-21C are circuit diagrams of the present invention.

In the embodiment of FIG. 21A, the current supply line 3806 is common to the two pixels. Specifically, this embodiment is characterized in that two pixels are lineal-symmetrically formed with the current supply line 3206 being the center between them. Since the number of current supply lines can be reduced therein, this embodiment is advantageous in that the pixel pattern can be much finer and thinner.

Figure 21B:
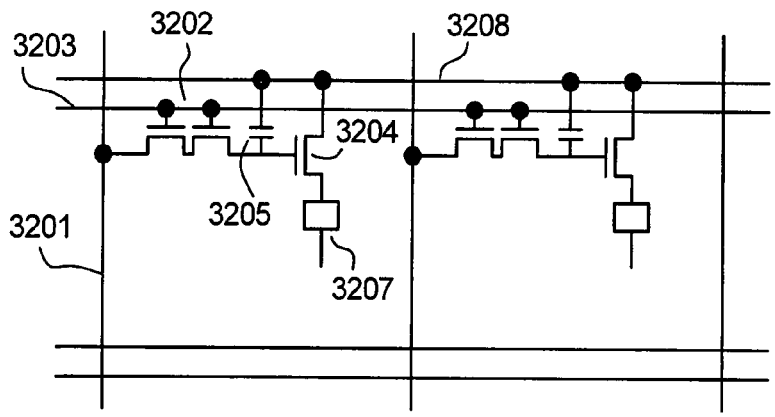

In FIG. 21B, the current supply line 3208 is formed in parallel to the gate wire 3203. Specifically, in this, the current supply line 3208 is so constructed that it does not overlap with the gate wire 3203, but is not limitative. Being different from the illustrated case, the two may overlap with each other via an insulating film therebetween so far as they are of different layers. Since the current supply line 3208 and the gate wire 3203 may enjoy the common exclusive area therein, this embodiment is advantageous in that the pixel pattern can be much finer and thinner.

Figure 21C:
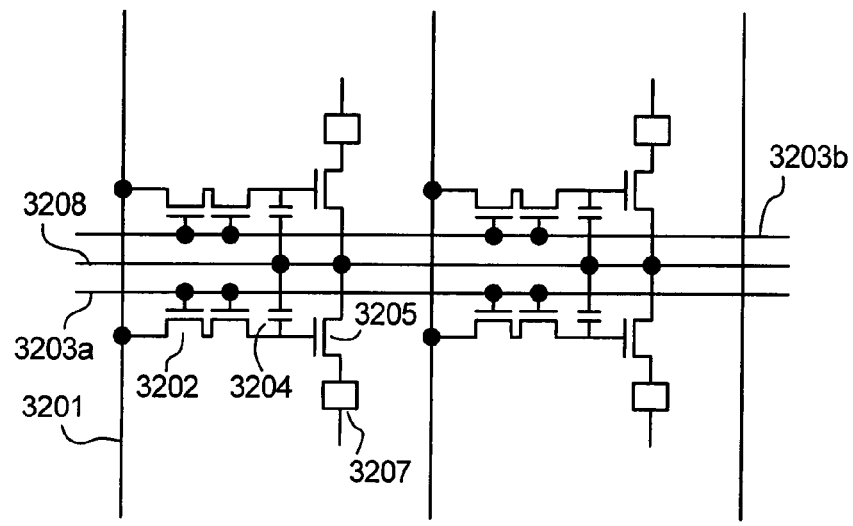

The structure of the embodiment of FIG. 21C is characterized in that the current supply line 3208 is formed in parallel to the gate wires 3203a and 3203b, like in FIG. 21B, and that two pixels are lineal-symmetrically formed with the current supply line 3208 being the center between them. In this, it is also effective to provide the current supply line 3208 in such a manner that it overlaps with any one of the gate wires 3203a and 3203b. Since the number of current supply lines can be reduced therein, this embodiment is advantageous in that the pixel pattern can be much finer and thinner.

The constitution of FIGS. 21A to 21C can be combined with any constitution of Embodiment 1 to 7 in any desired manner. Incorporating the EL display panel having the pixel structure of this Embodiment into the electronic appliance of Embodiment 12 as its display part is advantageous.

Embodiment 11

For the foregoing liquid crystal display device of the present invention, various liquid crystals other than a nematic liquid crystal can be used. For example, it is possible to use a liquid crystal disclosed in 1998, SID, "Characteristics and Driving Scheme of Polymer-Stabilized Monostable FLCD Exhibiting Fast Response Time and High Contrast Ratio with Gray-Scale Capability" by H. Furue et al.; 1997, SID DIGEST, 841, "A Full-Color Thresholdless Antiferroelectric LCD Exhibiting Wide Viewing Angle with Fast Response Time" by T. Yoshida et al.; 1996, J. Mater. Chem. 6(4), 671-673, "Thresholdless antiferroelectricity in liquid crystals and its application to displays" by S. Inui et al.; or U.S. Pat. No. 5,594,569.

Figure 22:
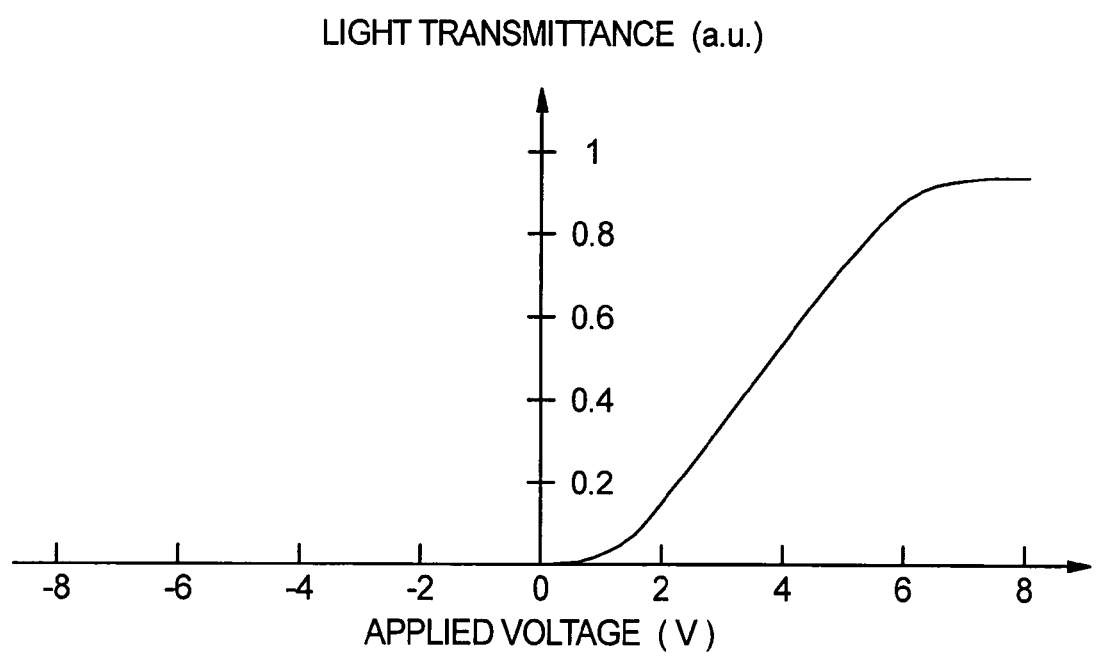
FIG. 22 is a view showing light transmittance characteristics of a thresholdless antiferroelectric liquid crystal.

FIG. 22 shows electro-optical characteristics of single stable ferroelectric liquid crystal (FLC) in which the ferroelectric liquid crystal (FLC) exhibiting a transition series of isometric phase—cholesteric phase—chiral smectic phase is used, transition of cholesteric phase—chiral smectic phase is caused while applying a DC voltage, and a cone edge is made to almost coincide with a rubbing direction. A display mode by the ferroelectric liquid crystal as shown in FIG. 22 is called a "Half—V-shaped switching mode". The vertical axis of the graph shown in FIG. 22 indicates transmissivity (in an arbitrary unit) and the horizontal axis indicates applied voltage. The details of the "Half—V-shaped switching mode" are described in "Half—V-shaped switching mode FLCD" by Terada et al., Collection of Preliminary Papers for 46th Applied Physics Concerned Joint Lecture Meeting, March 1999, p. 1316, and "Time-division full-color LCD with ferroelectric liquid crystal" by Yoshihara et al., Liquid Crystal, Vol. 3, No. 3, p. 190.

As shown in FIG. 22, it is understood that when such a ferroelectric mixed liquid crystal is used, low voltage driving and gradation display becomes possible. For the liquid crystal display device of the present invention, it is also possible to use the ferroelectric liquid crystal exhibiting such electro-optical characteristics.

A liquid crystal exhibiting antiferroelectricity in some temperature range is called an antiferroelectric liquid crystal (AFLC). In mixed liquid crystals including the antiferroelectric liquid crystal, there is one called a thresholdless antiferroelectric mixed liquid crystal exhibiting electro-optical response characteristics in which transmittance is continuously changed with respect to an electric field. Some thresholdless antiferroelectric mixed liquid crystal exhibits the so-called V-shaped electro-optical response characteristics, and a liquid crystal in which its driving voltage is about ±2.5 V (cell thickness is about 1 μm to 2 μm) has also been found.

In general, the thresholdless antiferroelectric mixed liquid crystal has large spontaneous polarization, and the dielectric constant of the liquid crystal itself is high. Thus, in the case where the thresholdless antiferroelectric mixed liquid crystal is used for a liquid crystal display device, it becomes necessary to provide relatively large holding capacitance for a pixel. Thus, it is preferable to use the thresholdless antiferroelectric mixed liquid crystal having small spontaneous polarization.

Since low voltage driving can be realized by using such a thresholdless antiferroelectric mixed liquid crystal for the liquid crystal display device of the present invention, low power consumption can be realized.

Embodiment 12

In this embodiment, a description will be given on a semiconductor device incorporating an active matrix liquid crystal display device made from a TFT circuit of the present invention, with reference to FIGS. 19A to 19E, FIGS. 23A to 23D and FIGS. 24A to 24D.

As such a semiconductor device, a portable information terminal (an electronic book, a mobile computer or a cellular phone), a video camera, a still-image camera, a personal computer, TV etc. may be enumerated. Examples of those are shown in FIGS. 19A to 19E, FIGS. 23A to 23D and FIGS. 24A to 24D.

Figure 19A:
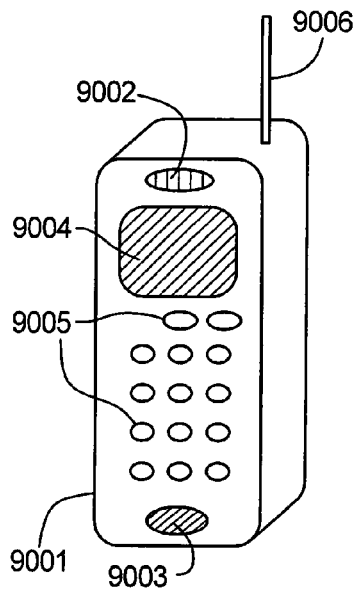
FIGS. 19A to 19E are views showing examples of semiconductor devices.

FIG. 19A is a cellular phone that is composed of a main body 9001, a sound output section 9002, a sound input section 9003, a display device 9004, operation switches 9005, and an antenna 9006. The present invention can be applied to the sound output section 9002, the sound input section 9003 and the display device 9004 having an active matrix substrate.

Figure 19B:
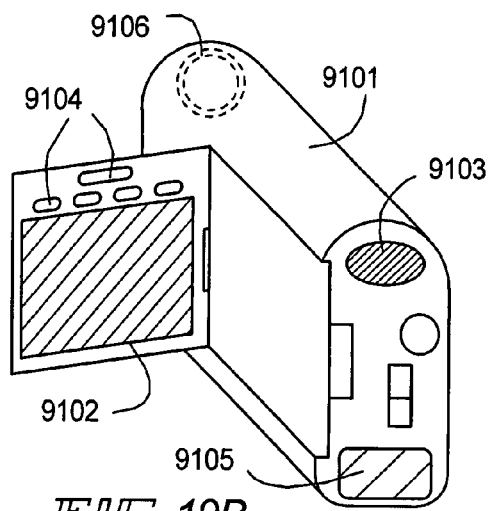

FIG. 19B shows a video camera that is comprised of a main body 9101, a display device 9102, a voice input unit 9103, operation switches 9104, a battery 9105, and an image receiving unit 9106. The present invention is applicable to the voice input unit 9103, the display device 9102 having an active matrix substrate and the image receiving unit 9106.

Figure 19C:
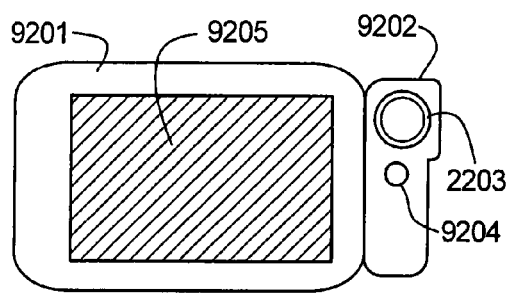

FIG. 19C shows a mobile computer that is comprised of a main body 9201, a camera unit 9202, an image receiving unit 9203, operation switches 9204, and a display device 9205. The present invention can be applied to the image receiving unit 9203 and the display device 9205 having an active matrix substrate.

Figure 19D:
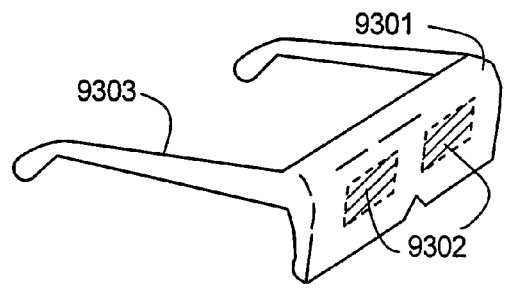

FIG. 19D shows a head mount display that is comprised of a main body 9301, a display device 9302 and arm portions 9303. The present invention can be applied to the display device 9302. Further, although not shown, the present invention can also be used for other signal control circuits.

Figure 19E:
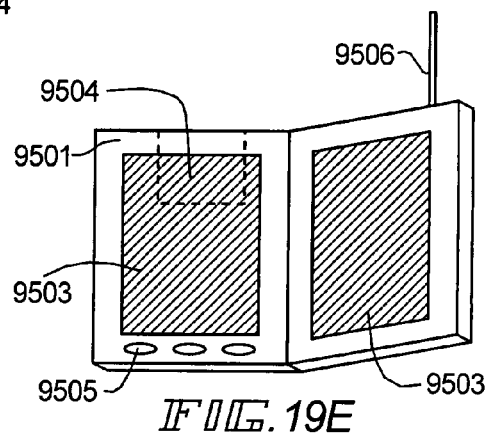

FIG. 19E shows a portable electronic book that is comprised of a main body 9501, display devices 9502, 9503, a memory medium 9504, an operation switch 9505 and an antenna 9506. The book is used to display data stored in a mini-disk or a DVD, or a data received with the antenna. The display devices 9502, 9503 are direct-vision type display devices, to which the present invention may be applied.

Figure 23A:
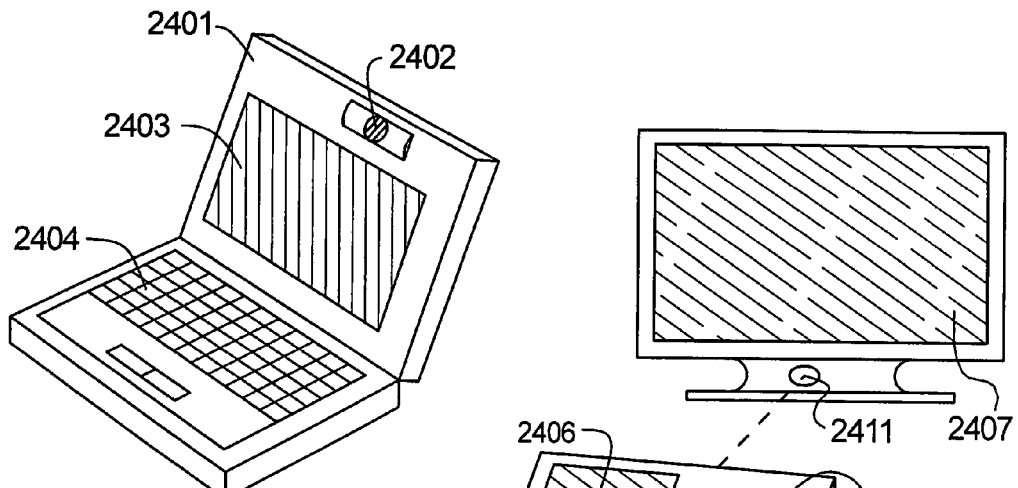
FIGS. 23A to 23D are views showing examples of semiconductor devices.

FIG. 23A shows a personal computer comprising a main body 9401, an image inputting unit 9402, a display device 9403 and a key board 9404.

Figure 23B:
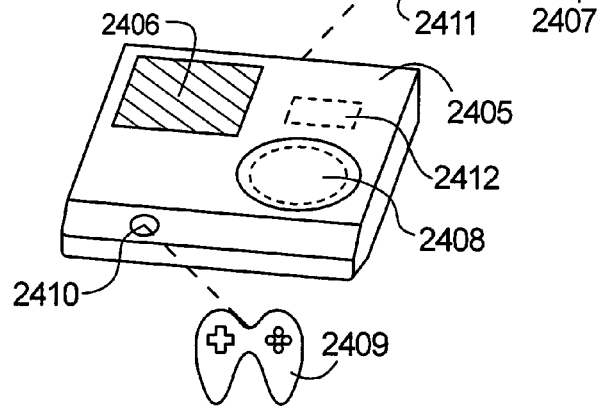

FIG. 23B is an electronic game equipment such as a television game or a video game, and is composed of: a main body 2405 loaded with a recording medium 2408 and with electric circuits 2412 containing a CPU, etc.; a controller 2409; a display device 2407; and a display device 2406 incorporated into the main body 2405. The display device 2407 and the display device 2406 incorporated into the main body 2405 may both display the same information, or the former may be taken as the main display and the latter may be taken as the sub display to display information from the recording medium 2408, the equipment operation status, or touch sensors can be added for use as a control panel. Further, in order for the main body 2405, the controller 2409, and the display device 2407 to communicate with each other, hard wired communication may be used, or sensor sections 2410 and 2411 can be provided for either wireless communication or optical communication. The present invention can be used in the manufacture of the display devices 2406 and 2407. In addition, a conventional CRT can be used for the display device 2407. The present invention can be effectively applied, if the display device 2407 is a 24 to 45 inch liquid crystal television.

Figure 23C:
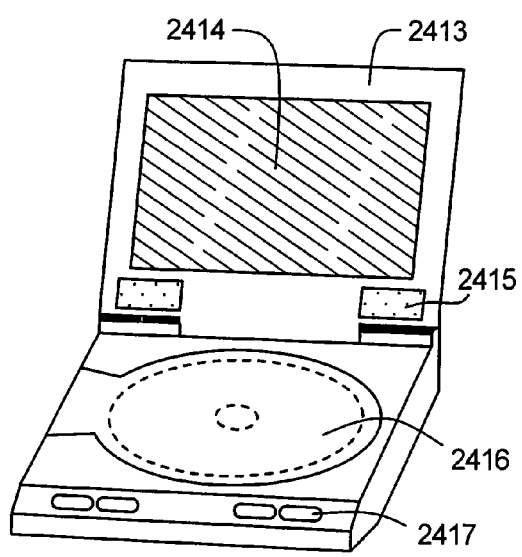

FIG. 23C shows a player that employs a recording medium in which programs are recorded (hereinafter referred to as recording medium), and comprises a main body 2413, a display device 2414, a speaker unit 2415, a recording medium 2416, and an operation switch 2417. Incidentally, this player uses as the recording medium a DVD (Digital Versatile Disc), CD and the like to appreciate music and films, play games, and connect to the Internet.

Figure 23D:
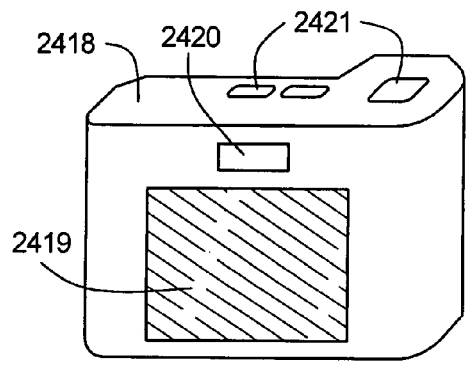

FIG. 23D shows a digital camera comprising a main body 2418, a display device 2419, an eye piece section 2420, operation switches 2421, and an image receiving unit (not shown). The present invention is applicable to the display device 2419 and other signal control circuits.

FIG. 24A shows a front-type projector comprising a display device 2601 and a screen 2602. The present invention is applicable to the display device and other signal control circuits.

FIG. 24B shows a rear-type projector comprising a main body 2701, a display device 2702, a mirror 2703, and a screen 2704. The present invention is applicable to the display device (which is especially effective if it is a 50 to 100 inch) and other signal control circuits.

FIG. 24C is a diagram showing an example of the structure of the display devices 2601, 2702 in FIGS. 24A and 24B. The display device 2601 or 2702 comprises a light source optical system 2801, mirrors 2802, 2805 to 2807, dichroic mirrors 2803 and 2804, optical lenses 2808, 2809 and 2811, liquid crystal display devices 2810 and a projection optical system 2812. The projection optical system 2812 is composed of an optical system including a projection lens.

This embodiment shows an example of "Three plate type" using three liquid crystal display devices 2810 but not particularly limited thereto. For instance, the invention may be applied also to a "Single plate type" optical system. Further, in the light path indicated by an arrow in FIG. 24C, an optical system such as an optical lens, a film having a polarization function, a film for adjusting a phase difference, and an IR film may be suitably provided by a person who carries out the invention.

FIG. 24D is a diagram showing an example of the structure of the light source optical system 2801 in FIG. 24C. In this embodiment, the light source optical system 2801 comprises a light sources 2813 and 2814, a compound prism 2815, collimator lenses 2816 and 2820, lens arrays 2817 and 2818, a polarization conversion element 2819. The light source optical system shown in FIG. 24D is uses tow light sources, but three, four, or more light sources, may be used. Of course a single light source is acceptable. For example, a person who carries out the invention is allowed to suitably add to the light source optical system an optical lens, a film having a polarization function, a film for adjusting a phase difference, and an IR film.

Other than those, though not shown here, the present invention may be applied to an image sensor and an EL display element. The present invention thus has so wide application range that it is applicable to electronic equipment in any field. The present invention has the following effects.

By carrying out the present invention, it was possible to obtain a crystalline TFT with stable operation. As a result, it was possible to raise reliability of a semiconductor device including a CMOS circuit fabricated with the crystalline TFT, specifically a pixel portion of a liquid crystal display device and a driver circuit provided at the periphery, so that it was possible to obtain a liquid crystal display device capable of withstanding a long use.

Moreover, according to the present invention, in a second impurity region formed between a channel formation region of an n-channel TFT and a drain region, it is possible to easily control the individual lengths of a region (GOLD region) where the second impurity region overlaps with a gate electrode and a region (LDD region) not overlapping with the gate electrode. Specifically, in accordance with a driving voltage of a TFT, it is also possible to determine the respective lengths of the region (GOLD region) where the second impurity region overlaps with the gate electrode and the region (LDD region) where the second impurity region does not overlap with the gate electrode, which enables fabrication of TFTs corresponding to the respective driving voltages through the same step in the case where the TFTs are made to operate with different driving voltages in the same substrate.

Such features of the present invention were extremely suitable for an active matrix type liquid crystal display device in which driving voltages and required TFT characteristics are different between a pixel portion and a driver circuit.

Embodiment 13

Another embodiment of the present invention will be described with reference to FIGS. 25A to 29B. In this Embodiment 13, a method of fabricating, at the same time, a pixel TFT provided in a pixel portion, a retaining capacitor and a driver circuit TFT provided in a periphery of the pixel portion.

A gate electrode of the TFT described in this Embodiment 13 has a two-layer structure, as shown in Embodiment Mode 1 and Embodiment 1. However, this Embodiment 1 is different from them in that both of the first and second layers are formed from an element, or an alloy having the element as a main component, or a compound of the element which element is selected from the group consisting of Ta, W, Ti and Mo. Among them, the best combination is that the first layer is formed of Ta, tantalum nitride (TaN) or a multi-layer of Ta and tantalum nitride (TaN), and the second layer is formed of W. Because these materials are thermally stable and are hard to be eroded as compared with Al and Cu, these materials are suitable for the process of the TFT of the present invention.

However, as in a case of using a semiconductor film as the first layer of the gate electrode, an element, or an alloy having the element as a main component, or a compound of the element which element is selected from the group consisting of Ta, W, Ti and Mo has an a real resistance of about $10\Omega$ or more. Therefore, these materials are not always suitable for a case of manufacturing a display device having a display size of 4 inches or more. Because length of wiring provided over a substrate is necessarily increased as the display size in increased, it becomes impossible to ignore the problem associated with the signal delay time caused by influence of the wiring resistance. Also, when the width (thickness) of the wiring is increased in order to reduce the wiring resistance, the area of the peripheral region other than the pixel portion is increased to extremely damage the appearance of the display device.

Considering the pixel density for example, the VGA has 480 gate lines and 640 source lines, and XGA has 768 gate lines and 1024 source lines. Considering the display size of the display area, the 13 inch class has a diagonal of 340 mm, and the 18 inch class has a diagonal of 460 mm. This Embodiment 13 describes a method for solving the delay time problem of these display devices and minimizing the area required for the wirings.

First, as shown in FIG. 25A, a base film 2502 comprising an insulating film such as silicon oxide film, silicon nitride film or silicon oxinitride film is formed on a substrate 2501. For example, a silicon oxinitride film 2502a is formed to a thickness of 1 to 200 nm (preferably 50 to 100 nm) by plasma CVD using $SiH_4$, $NH_3$ and $NO_2$, and a hydrogenated silicon oxinitride film 2502b is formed to a thickness of 50 to 200 nm (preferably 100 to 150 nm) by using $Si_4$ and $NO_2$. Thus, the base film 2502 has a two-layer structure in this Embodiment 13. However, the base film 2502 may be a single layer structure and a multi-layer structure having more than two layers. The substrate 2501 comprises a glass such as barium borosilicate glass or alumino-borosilicate glass.

Island semiconductor layers 2503 to 2506 are formed of a crystalline semiconductor film which have been formed from a semiconductor film having an amorphous structure by a laser crystallization method or a thermal crystallization method. The island semiconductor layers 2503 to 2506 has a thickness of 25 to 80 nm (preferably 30 to 60 nm). The crystalline semiconductor film preferably comprises silicon or silicon germanium (SiGe) alloy. However, the material of the crystalline semiconductor film is not limited thereto.

The formation of the crystalline semiconductor film by the laser crystallization method is conducted using excimer laser or YAG laser in pulse oscillation type or continuous light emitting type. In case of using these lasers, a laser light is emitted from the laser oscillator, and then condensed into a linear shape through an optical system, and then irradiated to the semiconductor film. The crystallization condition may be determined by a person who carries out the present invention. In case of using the excimer laser, the pulse oscillation frequency is 30 Hz, and the laser energy density is 100 to 400 $mJ/cm^2$ (typically 200 to 300 $mJ/cm^2$). In case of using the YAG laser, the second harmonic thereof is used at a pulse oscillation frequency of 1 to 10 kHz at a laser energy density of 300 to 600 $mJ/cm^2$ (typically 350 to 500 $mJ/cm^2$). In this way, a laser light condensed to a width of 100 to 1000 μm for example 400 μm in a linear shape is irradiated throughout the entire surface of the substrate. At this time, the overlapping percentage (overlap percentage) of the linear laser light is 80 to 98%.

A gate insulating film 2507 is formed of an insulating film containing silicon by plasma CVD or sputtering to a thickness of 40 to 150 nm. In this Embodiment 13, the gate insulating film comprises a silicon oxinitride and has a thickness of 40 to 150 nm. Of course, the gate insulating film is not limited to the film comprising silicon oxinitride above. The gate insulating film may be a single-layer structure or a multi-layer structure of an insulating film containing silicon. For example, in case of using a silicon oxide film, this is formed by plasma CVD using TEOS (tetraethyl orthosilicate) and $O_2$ mixed with each other, which are discharged at a reaction pressure of 40 Pa, a substrate temperature of 300 to 400° C., at an electric power density of 0.5 to 0.8 W/cm2 of a high frequency (13.56 Mhz). The silicon oxide film formed in this way can exhibit an excellent characteristic by subsequent thermal annealing at 400 to 500° C.

A first conductive film 2508 and a second conductive film 2509 which become a gate electrode are formed on the gate insulating film 2507. In this Embodiment 13, the first conductive film 2508 comprises Ta and has a thickness of 50 to 100 nm, and the second conductive film comprises W and has a thickness of 100 to 300 nm.

The Ta film is formed by sputtering a target of Ta with Ar. In this case, by adding Xe or Kr to the Ar, the inner stress of the Ta film can be alleviated to prevent the film from peeling off. Because α phase Ta film has resistivity of about 20 µΩcm, this film can be used for the gate electrode. However, because β phase Ta film has a resistivity of about 180 µΩcm, this film is not suitable for the gate electrode. In case of forming α phase Ta film, by forming, as a base film of this Ta film, a tantalum nitride having a thickness of about 10 to 50 nm and having a close crystalline structure to the α phase Ta film, the α phase Ta film can easily be obtained.

The W film is formed by sputtering using W as a target. The W film can be formed by thermal CVD using tungsten hexafluoride ($WF_6$). Anyhow, it is necessary that the resistance is lowered in order to use the film for the gate electrode, and it is preferable that the resistivity of the W film is 20 µΩcm or less. The resistivity of the W film can be lowered by enlarging the crystal grains of the W film. It is to be noted that in case that a lot of impurity elements such as oxygen are present in the W film, the crystallization is impaired to increase the resistivity. Therefore, in case of sputtering, by using a W target having purity of 99.9999% with sufficient care to prevent impurity from entering from the gas phase during the formation of the W film, resistivity of 9 to 20 µΩcm can be realized.

Next, as shown in FIG. 25B, masks 2510 to 2514 are formed from resist, and the first etching treatment of the formation of the gate electrode is conducted. In this Embodiment 13, the first etching treatment is conducted by ICP (inductively coupled plasma) method discharging etching gases of $CF_4$ and $Cl_2$ mixed with each other at a pressure of 1 Pa at RF (13.56 MHz) power of 500 W supplied to the coil type electrode. The substrate side (the sample stage) is supplied with RF (13.56 MHz) power of 100 W to substantially apply negative self bias voltage. In case of mixing $CF_4$ and $Cl_2$ with each other, both of the W film and the Ta film are etched to the same degree.

Under the above etching condition, by forming the resist mask in the suitable shape, the side edges of the first and second conductive films are tapered by virtue of the effect of the bias voltage applied to the substrate side. The tapered part has an angle of 15 to 45°. In order to conduct the etching without leaving over any residue on the gate insulating film, the etching period of time is increased at a ratio of about 10 to 20%. Because the selection ratio of the silicon oxinitride film with respect to the W film is 2 to 4 (typically 3), the exposed surface of the silicon oxinitride film is etched at about 20 to 50 nm by the over etching treatment. Thus, the conductive layers 2515 to 2519 (the first conductive layers 2515a to 2519a and the second conductive layers 2515b to 2519b) having the first tapered shape are formed by the first etching treatment.

Impurity element for imparting n-type is added by the first doping treatment. This is conducted by ion doping method or ion implantation method. In the ion doping method, the dose is $1 \times 10^{13}$ to $5 \times 10^{14}$ atoms/cm$^2$, and the acceleration voltage is 60 to 100 KeV. A the impurity element for imparting n-type, an element belonging to 15 group of the periodic table, typically phosphorous (P) or arsenic (As) is used. In this Embodiment 13, phosphorous (P) was used. In this case, the conductive layers 2515 to 2519 acts as masks against the impurity element for imparting n-type to form the first impurity regions 2520 to 2523 in self-aligned manner. The first impurity regions 2520 to 2523 is added with the impurity element for imparting n-type at a concentration range of $1 \times 10^{20}$ to $1 \times 10^{21}$ atoms/cm$^3$.

Next, as shown in FIG. 25C, the second etching treatment is conducted. By using ICP etching method similarly to the above, plasma is generated at a pressure of 1 Pa at RF (13.56 MHz) power of 500 W supplied to a coil-type electrode with etching gases of $CF_4$, $Cl_2$ and $O_2$ mixed with each other. The substrate side (the sample stage) is supplied with a self-bias voltage which is low as compared with the case of the first etching treatment. Under these conditions, the W film is selectively anisotropically etched to make the first conductive layers 2524 to 2528 of rectangular shapes from the second conductive layer. At this time, the first tapered conductive layers 2515a to 2519a remain as they are.

The etching reaction of the W film and the Ta film by the mixed gases of $CF_4$ and $Cl_2$ can be inferred from vapor pressures of the reaction product and the radical or ion produced. The vapor pressures of fluoride and chloride of W and Ta are compared as follows. The vapor pressure of $WF_6$ which is a fluoride of W is extremely high. The vapor pressures of $WCl_5$, $TaF_5$ and $TaCl_5$ are same degrees to each other. Accordingly, both of the W film and the Ta film are etched with mixed gases $CF_4$ and $Cl_2$. However, by adding $O_2$ to the mixed gases, $CF_4$ and $O_2$ are reacted with each other to produce CO and F, with the result that a lot of F radicals and F ions are produced.

As a result, the etching speed (rate) of the W film whose fluoride has a high vapor pressure is increased. On the other hand, even if F in the Ta film is increased in amount, increase of the etching speed (rate) is relatively little. Further, because Ta is readily oxidized as compared with W, the surface of Ta is oxidized by adding $O_2$. Because the oxide of Ta is not reacted with fluorine or chlorine, the etching speed (rate) of the Ta film is further lowered. Accordingly, the etching speeds (rates) of the W film and the Ta film differ from each other largely to enable selective etching of the W film.

Subsequently, as shown in FIG. 26A, the third etching treatment is conducted. The condition of the third etching treatment is same as that of the first etching treatment. The third shape conductive layers 2534 to 2537 having tapered parts at an angle of 15 to 45° at their side edges are formed. The resist masks on the conductive layers are eroded at the same time with this etching. The second conductive layers 2534 to 2538 (the first conductive layers 2534a to 2538a and the second conductive layers 2534b to 2538b) having tapered shape are formed by the third etching treatment.

Next, as shown in FIG. 26B, the fourth etching treatment is conducted. The condition of the fourth etching treatment is same as that of the second etching treatment. The W film is selectively anisotropically etched to make the second conductive layers 2539 to 2543 of rectangular shape from the second conductive layers. At this time, the second tapered conductive layers 2534a to 2538a remain as they are.

Next, impurity element for imparting n-type is doped under a high acceleration voltage condition at a dose lowered as compared with the first doping treatment. For example, the acceleration voltage is 70 to 120 KeV, and the dose is $1 \times 10^{13}/\text{cm}^2$. In this way, new impurity regions are formed inside the first impurity regions formed in the island semiconductor layer in FIG. 25B. In the doping, the second conductive layers 2539 to 2543 having rectangular shape are used as masks against the impurity element. The doping condition is such that regions under the second tapered conductive layers 2534a to 2538a are added with the impurity element. Accordingly, the third impurity regions 23548 to 2551 overlapping with the second tapered conductive layers 2534a to 2538a are formed, and the second impurity regions between the first impurity regions and the third impurity regions are formed. The concentration of the impurity element for imparting n-type is $1 \times 10^{17}$ to $1 \times 10^{19}$ atoms/cm$^3$ in the second impurity regions and is $1 \times 10^{16}$ to $1 \times 10^{18}$ atoms/cm$^3$ in the third impurity regions.

Next, sa shown in FIG. 26C, the fourth impurity region 2555 of the opposite conductivity type is formed in the island semiconductor layer 2504 for forming a p-channel type TFT. Using the second conductive layer 2540 of rectangular shape as a mask against the impurity element, the impurity region is formed in a self-aligned manner. At this time, the entire surfaces of the island semiconductor layers 2503, 2505 and 2506 for forming n-channel type TFT are covered with the resist masks 2552 to 2554. The impurity region 2555 is formed by ion doping method using diborane (B$_2$H$_6$). The impurity concentration in the region is $2 \times 10^{20}$ to $2 \times 10^{21}$ atoms/cm$^3$.

By the steps above, the impurity region is formed in each island semiconductor layer. Also, the second conductive layers 2539 to 2543 of rectangular shape are formed. Each of these second conductive layers and the corresponding one of the second tapered conductive layers 2534a to 2538a are formed in one body to function as a gate electrode.

The impurity element added to the respective island semiconductor layers for controlling conductivity type is subsequently activated. The activation step is conducted by thermal annealing using annealing furnace. Laser annealing or rapid thermal annealing (RTA) can also be used for the activation step. The thermal annealing is conducted in nitrogen atmosphere containing oxygen at a concentration of 1 ppm or less, preferably 0.1 ppm or less, at 400 to 700° C., typically 500 to 600° C. In this Embodiment 13, the thermal treatment is conducted at 500° C. for four hours.

In this thermal treatment, the surfaces of the second conductive layers 2539 to 2543 having rectangular shape are changed into conductive layers 2534c to 2538c made of tungsten nitride and having a thickness 5 to 80 nm. Further thermal treatment is conducted at 300 to 450° C. for one to twelve hours in an atmosphere containing hydrogen at 3 to 100% to hydrogenate the island semiconductor layers. This step terminates dangling bonds in the semiconductor layers with hydrogen thermally excited. As another hydrogenation method, plasma hydrogenation (using hydrogen excited by plasma) may be conducted. (FIG. 27A)

After the activation and the hydrogenation, the gate wiring is formed from a low resistant conductive material such as a material containing Al or Cu as a main component. In this Embodiment 13, Al is used. That is, a Ti film is formed to a thickness of 50 to 100 nm, and an Al film (not shown) containing Ti at 0.1 to 2 weight % is formed as the low resistant conductive layer on the entire surface of the Ti film. The thickness is 200 to 400 nm (preferably 250 to 350 nm). Then, a prescribed resist pattern is formed, and by the etching treatment the gate wiring 2556 and 2557 are formed. At this time, a capacitance line 2558 connected with the retaining capacitor provided in the pixel portion is formed from the same material. By conducting the etching treatment of the capacitor line and the gate wiring by wet etching using an etching solution of phosphoric acid, they can be formed while maintaining selective process ability with respect to the base.

In FIG. 27C, a silicon oxinitride film is formed as a first interlayer insulating film 2559 to a thickness of 100 to 200 nm. A second interlayer insulating film 2560 made of organic insulating material is formed thereon. Then, source wirings 2561 to 2564 forming contacts with source regions of the island semiconductor layer are formed, and drain wirings 2565 to 2567 forming contacts with drain regions are formed, and pixel electrode 2568 is formed. Thus, an active matrix substrate can be completed.

A driving circuit 2706 and a pixel portion 1707 are formed over this active matrix substrate. N-channel type TFTs 2701 and 2703 and p-channel type TFT 2702 are formed in the driving circuit 2706. The pixel portion 2707 has a pixel TFT 2704 comprising an n-channel type TFT. And the pixel portion 2707 has a retaining capacitor 2705 connected with the pixel TFT.

The n-channel type TFT 2701 has a channel formation region 2569, and a third impurity region 2570 (GOLD region) overlapping with the second tapered conductive layer 2534a forming the gate electrode, and a second impurity region 2571 (LDD region) formed outside the gate electrode, and a first impurity region 2572 functioning as a source region, and a first impurity region 2573 functioning as a drain region.

The p-channel type TFT 2702 has a channel formation region 2574, and a fourth impurity region 2575 overlapping with the second tapered conductive layer 2535a forming a gate electrode, and a fourth impurity region 2576 formed outside the gate electrode, and a fourth impurity region 2577 functioning as a source region, and a fourth impurity region 2578 functioning as a drain region.

The n-channel type TFT 2702 has a channel formation region 2579, and a third impurity region (GOLD region) 2580 overlapping with the second tapered conductive layer 2536 forming a gate electrode, and a second impurity region (LDD region) 2581 formed outside the gate electrode, and a first impurity region 2582 functioning as a source region, and a first impurity region 2583 functioning as a drain region.

The pixel TFT 2704 has channel formation regions 2584 and 2585, and third impurity regions (GOLD regions) 2585 and 2587 overlapping with the second tapered conductive layer 2537a, and second impurity regions (LDD regions) 2586 and 2589 formed outside the gate electrode, and first impurity regions 2590, 2591 and 2592 functioning as source or drain regions. The semiconductor layer 2593 functioning as one electrode of the retaining capacitor 2705 is not added with impurity element. The regions 2594 and 2595 are added with impurity element for imparting n-type.

Figure 28A:
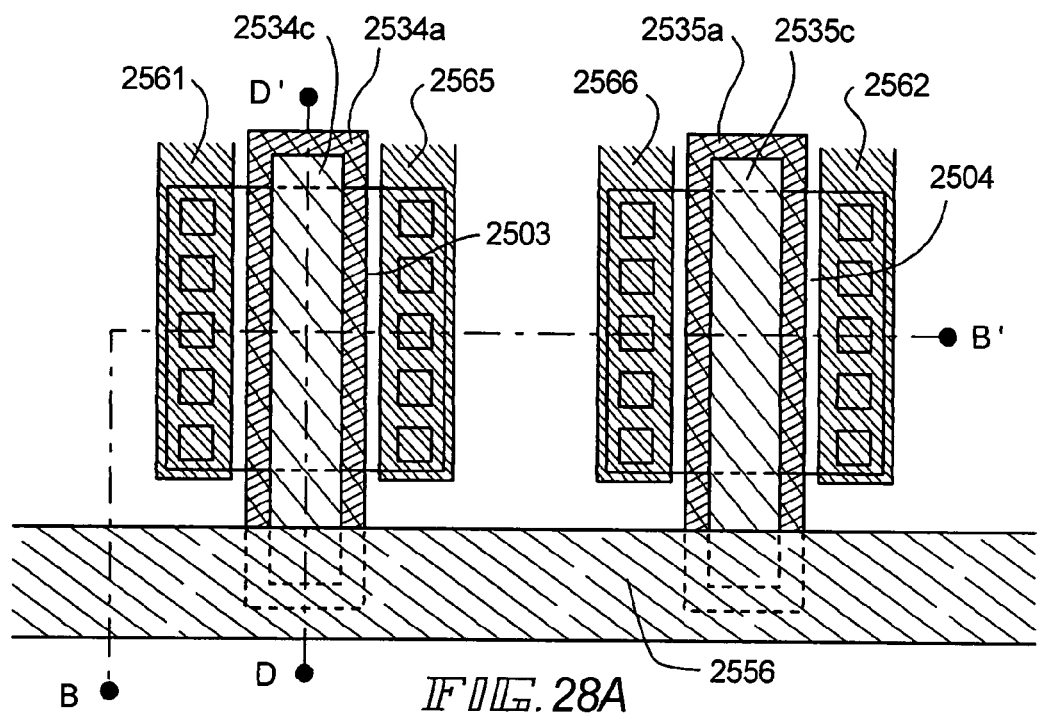
FIGS. 28A and 28B are plan views showing a part of an active matrix substrate.
Figure 28B:
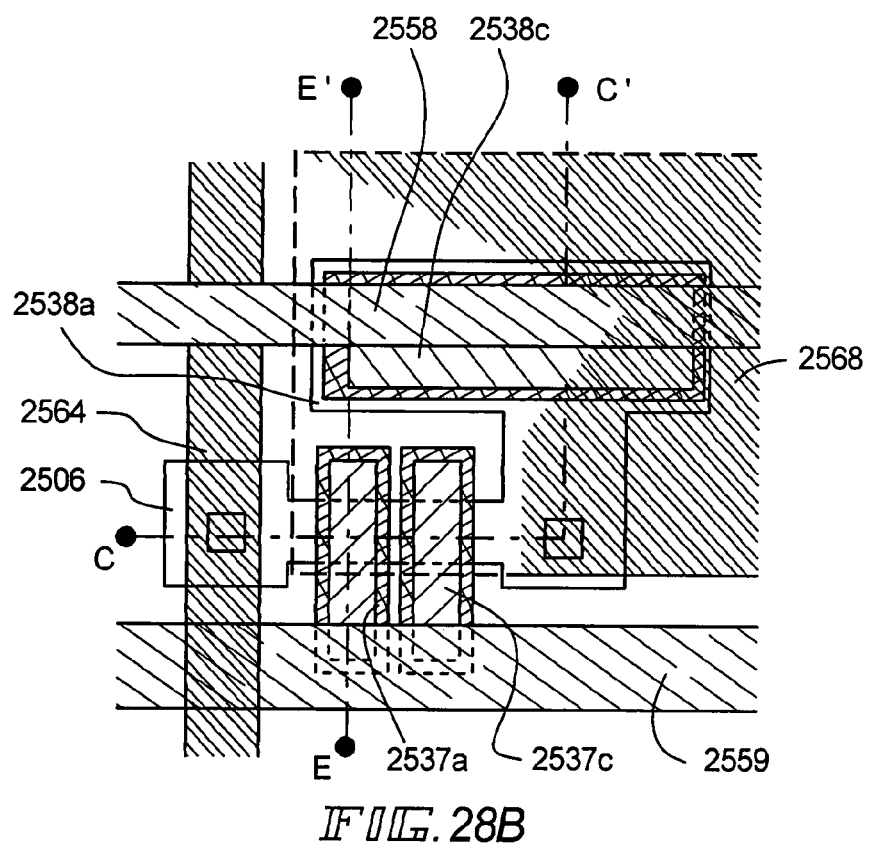
Figure 29A:
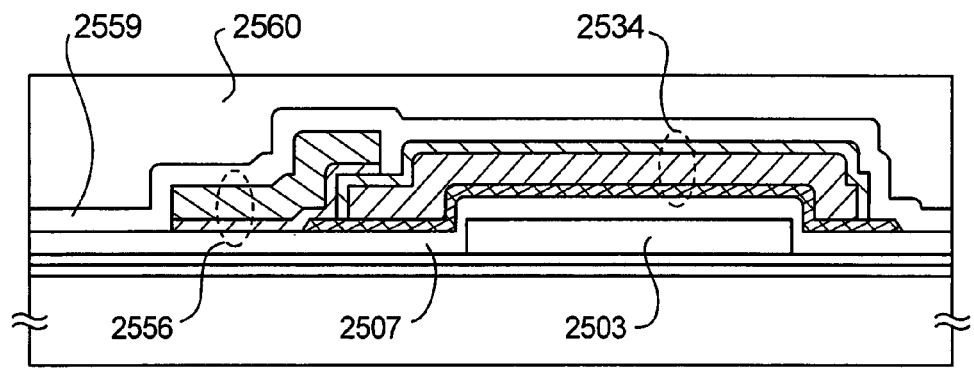
FIGS. 29A and 29B are cross-sectional views of FIGS. 28A and 28B.
Figure 29B:
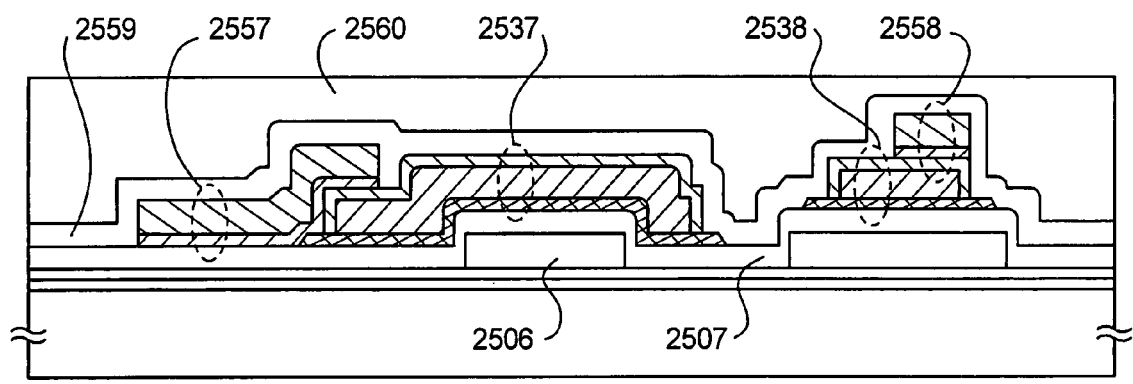

FIGS. 28A and 28B show a part of a plan view of the active matrix substrate. The cross-section taken along a line B-B' of FIG. 28A and the cross-section taken along a line C-C' of FIG. 28B correspond to B-B' and C-C' of FIG. 27C. In FIGS. 28A and 28B, the gate insulating film, the first interlayer insulating film and the second interlayer insulating film are omitted. However, the source wirings 2561 and 2562, 2564 and the drain wirings 2565 and 2566, and the pixel electrode 2568 are connected through contact holes with the source and drain regions (not shown) of the island semiconductor layers 2503, 2504 and 2506. Further, the cross-section D-D' of FIG. 28A and the cross-section E-E' of FIG. 28B are shown in FIGS. 29A and 29B, respectively. In FIG. 29A, the gate wiring 2556 overlaps with the gate electrode 2534 outside the island semiconductor layer 2503. Also, in FIG. 19B the gate wiring 2557 overlaps with the gate electrode 2537 outside the island semiconductor layer 2506. The gate electrode and the low resistant conductive layer are in contact with and electrically conducting with each other through no contact hole. By forming the gate wiring from a low resistant conductive material in this way, the wiring resistance can be sufficiently lowered. Accordingly, it can be applied to a display device having a pixel portion (display size) of 4 inches class or more.

Embodiment 14

In this Embodiment 14, an example in which a gate wiring is formed from Cu is described. First, in the same way as in Embodiment, steps up to FIG. 27a are conducted. Thereafter, as shown in FIG. 30, a first passivation layer 3001 is formed to a thickness of 20 to 100 nm. This layer comprises silicon nitride or silicon oxinitride.

Next, an interlayer insulating film 3002 such as silicon oxide film or silicon oxinitride film is formed to a thickness of 1 to 5 μm. An interlayer insulating film comprising silicon oxide formed by plasma CVD using TEOS has an excellent surface flatness. Openings 3030 to 3032 for forming wirings in the interlayer insulating film 3002 are formed. Thereafter, a barrier layer 3003 comprising a tantalum nitride film is formed on the entire surface by sputtering to a thickness of 100 to 200 nm. The tantalum nitride film prevents Cu from diffusing. Further, a Cu film is formed by sputtering to form a seed layer 3004. Thickness of the seed layer is 200 to 800 nm. Then, a Cu layer 3005 is formed to a thickness of 1 to 10 μm by a plating method using copper sulfate. In other than the plating method, a Cu layer is formed by sputtering and then subject to reflow by thermal treatment at 450° C. to realize the flattening.

Figure 31A:
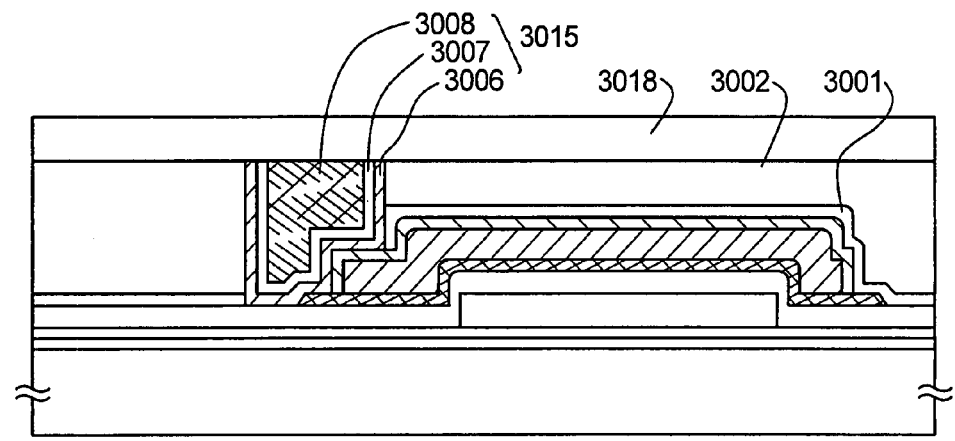
FIGS. 31A and 31B are views showing fabricating steps of the present invention.

Next, the surface is flattened through CMP (Chemical-Mechanical Polishing) method by initiating the polishing from the surface of the Cu plating layer in a state shown in FIG. 31A and continuing the polishing until the interlayer insulating film 3002 is exposed. Thus, the Cu wiring is formed. The slurry for the CMP comprises a grinding particle and an oxidizing agent and an additive. Alumina or silica is used as the grinding particle. Iron nitrate, hydrogen peroxide or potassium periodate or the like is used as the oxidizing agent. In this way, the wiring 3015 comprising the barrier layer 3006 and the seed layer 3007 and the Cu layer 3008 is formed. Similarly, the wiring 3016 comprises the barrier layer 3009 and the seed layer 3010 and the Cu layer 3011. Similarly, the wiring 3017 comprises the barrier layer 3012 and the seed layer 3013 and the Cu layer 3014. (FIG. 30B)

Then, a second passivation film 3018 covering these wirings 3015 to 3017 is formed from a silicon nitride film or a silicon oxinitride film to a thickness of 100 to 1000 nm. Then, source wirings 3019 to 3022 and the drain wirings 3023 to 3025 and the pixel electrode 3026 are formed. The n-channel type TFT 2701, the p-channel type TFT 2702 and the n-channel type TFT 2703 of the driving circuit 2706 have the same structure as in the Embodiment 13. Also, the retaining capacitor 2705 and the pixel TFT 2704 of the pixel portion 2707 have the same structure as in the Embodiment 13. (FIG. 30C)

Figure 31B:
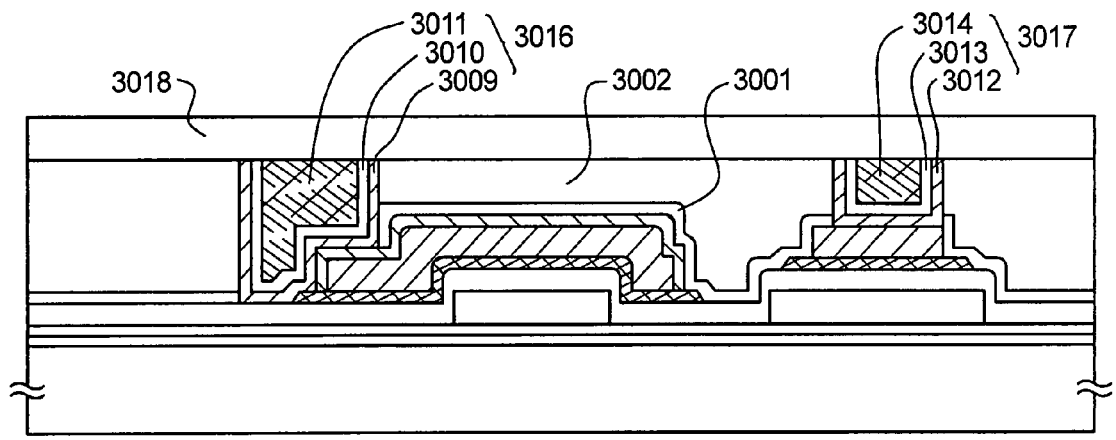

The plan views for explaining the B-B' cross-section and the C-C' cross-section of FIG. 30C are same as the plan views of FIGS. 28A and 28B of the Embodiment 13 except that the wiring structures are different from each other. The D-D' cross-section of FIG. 28A and the E-E' cross-section of FIG. 28B are shown in FIGS. 31A and 31S, respectively. In FIG. 31A, the gate wiring 3015 overlaps with the gate electrode 2534 outside the island semiconductor layer 2503. In FIG. 31B, the gate wiring 3016 overlaps with the gate electrode 2537 outside the island semiconductor layer 2506. The gate electrode and the low resistant conductive layer are in contact with the electrically conducting with each other through no contact hole. By forming the gate wiring from the low resistant conductive material in this way, the wiring resistance can be sufficiently lowered. Accordingly, it can be applied to a display device having a pixel portion (display size) of 4 inches class or more. Further, because the Cu wiring has a higher resistance against electro migration than the gate wiring formed using Al, the Cu wiring is suitable for a display device such as an EL display device in which a pixel is driven by an electric current.

What is claimed is:

1. A method of forming a semiconductor device comprising:
    forming a semiconductor layer over a substrate;
    forming a gate insulating film over the semiconductor layer;
    forming a first conductive film over the gate insulating film;
    forming a second conductive film over the first conductive film;
    forming a second layer of a gate electrode from the second conductive film;
    adding an impurity element having one conductivity type to the semiconductor layer through the gate insulating film and the first conductive film after forming the second layer of the gate electrode;
    forming a first layer of the gate electrode from the first conductive film so that a part of the first layer of the gate electrode extends beyond at least one of the side edges of the second layer of the gate electrode after adding the impurity element having one conductivity type to the semiconductor layer through the gate insulating film and the first conductive film; and
    adding an impurity element having the one conductivity type to the semiconductor layer through the gate insulating film after forming the first layer of the gate electrode.

2. A method of forming a semiconductor device according to claim 1, wherein the second layer of the gate electrode is made of one kind or plural kinds of elements selected from the group consisting of titanium (Ti), tantalum (Ta), tungsten (W), and molybdenum (Mo), or a compound containing the element as its main ingredient.

3. A method of forming a semiconductor device according to claim 1, wherein the semiconductor device is one selected from the group consisting of a liquid crystal display device, an EL display device, and an image sensor.

4. A method of forming a semiconductor device according to claim 1, wherein the semiconductor device is one selected from the group consisting of a video camera, a digital camera, a projector, a projection TV, a goggle display, a car navigation system, a personal computer, and a portable information terminal.

5. A method of forming a semiconductor device according to claim 1, wherein the semiconductor layer is a crystalline semiconductor, a microcrystalline semiconductor, or a single crystal silicon layer.

6. A method of forming a semiconductor device according to claim 1, wherein the first layer of the gate electrode is made of one kind or plural kinds of elements selected from the group consisting of silicon (Si) and germanium (Ge), or a compound containing the element as its main ingredient.

7. A method of forming a semiconductor device comprising:
  forming a semiconductor layer over a substrate;
  forming a gate insulating film over the semiconductor layer;
  forming a first conductive film over the gate insulating film;
  forming a second conductive film over the first conductive film;
  forming a second layer of a gate electrode from the second conductive film;
  adding an impurity element having one conductivity type to the semiconductor layer through the gate insulating film and the first conductive film after forming the second layer of the gate electrode;
  forming a first layer of the gate electrode from the first conductive film so that a part of the first layer of the gate electrode extends beyond at least one of the side edges of the second layer of the gate electrode after adding the impurity element having one conductivity type to the semiconductor layer through the gate insulating film and the first conductive film; and
  adding an impurity element having the one conductivity type to the semiconductor layer through the gate insulating film after forming the first layer of the gate electrode; and
  removing a part of the first layer of the gate electrode.

8. A method of forming a semiconductor device according to claim 7, wherein the first layer of the gate electrode is made of one kind or plural kinds of elements selected from the group consisting of silicon (Si) and germanium (Ge), or a compound containing the element as its main ingredient.

9. A method of forming a semiconductor device according to claim 7, wherein the second layer of the gate electrode is made of one kind or plural kinds of elements selected from the group consisting of titanium (Ti), tantalum (Ta), tungsten (W), and molybdenum (Mo), or a compound containing the element as its main ingredient.

10. A method of forming a semiconductor device according to claim 7, wherein the semiconductor device is one selected from the group consisting of a liquid crystal display device, an EL display device, and an image sensor.

11. A method of forming a semiconductor device according to claim 7, wherein the semiconductor device is one selected from the group consisting of a video camera, a digital camera, a projector, a projection TV, a goggle display, a car navigation system, a personal computer, and a portable information terminal.

12. A method of forming a semiconductor device according to claim 7, wherein the semiconductor layer is a crystalline semiconductor, a microcrystalline semiconductor, or a single crystal silicon layer.

13. A method of forming a semiconductor device comprising:
  forming a first semiconductor layer and a second semiconductor layer over a substrate;
  forming a gate insulating film over the first semiconductor layer and the second semiconductor layer;
  forming a first conductive film over the gate insulating film;
  forming a second conductive film over the first conductive film;
  forming a second layer of a gate electrode from the second conductive film;
  adding an impurity element having first conductivity type to at least the first semiconductor layer through the gate insulating film and the first conductive film after forming the second layer of the gate electrode;
  adding an impurity element having second conductivity type opposite to the first conductivity type to the second semiconductor layer;
  forming a first layer of the gate electrode from the first conductive film so that a part of the first layer of the gate electrode extends beyond at least one of the side edges of the second layer of the gate electrode after adding the impurity element having one conductivity type to the semiconductor layer through the gate insulating film and the first conductive film;
  adding an impurity element having the first conductivity type to at least the first semiconductor layer through the gate insulating film after forming the first layer of the gate electrode.

14. A method of forming a semiconductor device according to claim 13, wherein the first layer of the gate electrode is made of one kind or plural kinds of elements selected from the group consisting of silicon (Si) and germanium (Ge), or a compound containing the element as its main ingredient.

15. A method of forming a semiconductor device according to claim 13, wherein the second layer of the gate electrode is made of one kind or plural kinds of elements selected from the group consisting of titanium (Ti), tantalum (Ta), tungsten (W), and molybdenum (Mo), or a compound containing the element as its main ingredient.

16. A method of forming a semiconductor device according to claim 13, wherein the semiconductor device is one selected from the group consisting of a liquid crystal display device, an EL display device, and an image sensor.

17. A method of forming a semiconductor device according to claim 13, wherein the semiconductor device is one selected from the group consisting of a video camera, a digital camera, a projector, a projection TV, a goggle display, a car navigation system, a personal computer, and a portable information terminal.

18. A method of forming a semiconductor device according to claim 13, wherein each of the first and second the semiconductor layers is a crystalline semiconductor, a microcrystalline semiconductor, or a single crystal silicon layer.

19. A method of forming a semiconductor device comprising:
  forming a first semiconductor layer and a second semiconductor layer over a substrate;
  forming a gate insulating film over the first semiconductor layer and the second semiconductor layer;
  forming a first conductive film over the gate insulating film;
  forming a second conductive film over the first conductive film;
  forming a second layer of a gate electrode from the second conductive film;
  adding an impurity element having first conductivity type to at least the first semiconductor layer through the gate insulating film and the first conductive film after forming the second layer of the gate electrode;
  adding an impurity element having second conductivity type opposite to the first conductivity type to the second semiconductor layer;
  forming a first layer of the gate electrode from the first conductive film so that a part of the first layer of the gate electrode extends beyond at least one of the side edges of the second layer of the gate electrode;

adding an impurity element having the first conductivity type to at least the first semiconductor layer through the gate insulating film after forming the first layer of the gate electrode; and removing a part of the first layer of the gate electrode.

20. A method of forming a semiconductor device according to claim 19, wherein the first layer of the gate electrode is made of one kind or plural kinds of elements selected from the group consisting of silicon (Si) and germanium (Ge), or a compound containing the element as its main ingredient.

21. A method of forming a semiconductor device according to claim 19, wherein the second layer of the gate electrode is made of one kind or plural kinds of elements selected from the group consisting of titanium (Ti), tantalum (Ta), tungsten (W), and molybdenum (Mo), or a compound containing the element as its main ingredient.

22. A method of forming a semiconductor device according to claim 19, wherein the semiconductor device is one selected from the group consisting of a liquid crystal display device, an EL display device, and an image sensor.

23. A method of forming a semiconductor device according to claim 19, wherein the semiconductor device is one selected from the group consisting of a video camera, a digital camera, a projector, a projection TV, a goggle display, a car navigation system, a personal computer, and a portable information terminal.

24. A method of forming a semiconductor device according to claim 19, wherein each of the first and second the semiconductor layers is a crystalline semiconductor, a microcrystalline semiconductor, or a single crystal silicon layer.

* * * * *